(12) United States Patent
Fujimoto

(10) Patent No.: US 8,294,205 B2
(45) Date of Patent: Oct. 23, 2012

(54) SEMICONDUCTOR DEVICE AND METHOD OF FORMING SEMICONDUCTOR DEVICE

(75) Inventor: Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 87 days.

(21) Appl. No.: 12/630,241

(22) Filed: Dec. 3, 2009

(65) Prior Publication Data
US 2010/0140688 A1    Jun. 10, 2010

(30) Foreign Application Priority Data
Dec. 5, 2008   (JP) .................... 2008-310724

(51) Int. Cl.
*H01L 29/66* (2006.01)
(52) U.S. Cl. .......... 257/329; 257/E21.629; 257/E29.262
(58) Field of Classification Search .................. 257/329, 257/E21.629, E29.262
See application file for complete search history.

(56) References Cited

U.S. PATENT DOCUMENTS

| | | | |
|---|---|---|---|
| 2008/0237637 A1* | 10/2008 | Ouyang et al. | 257/190 |
| 2008/0258209 A1* | 10/2008 | Oyu | 257/329 |
| 2009/0159964 A1* | 6/2009 | Lee | 257/329 |

FOREIGN PATENT DOCUMENTS

| | | |
|---|---|---|
| JP | 2003-017585 | 1/2003 |
| JP | 2004-221242 | 8/2004 |
| JP | 2004-247656 | 9/2004 |
| JP | 2008-072051 | 3/2008 |

* cited by examiner

*Primary Examiner* — Daniel Whalen
(74) *Attorney, Agent, or Firm* — Young & Thompson

(57) ABSTRACT

A semiconductor device includes a first semiconductor pillar, a first insulating film covering a side face of the first semiconductor pillar, a first electrode covering the first insulating film, a second semiconductor pillar, a second insulating film covering a side face of the second semiconductor pillar, and a second electrode covering the second insulating film. The top level of the second electrode is higher than the top level of the first electrode.

20 Claims, 42 Drawing Sheets

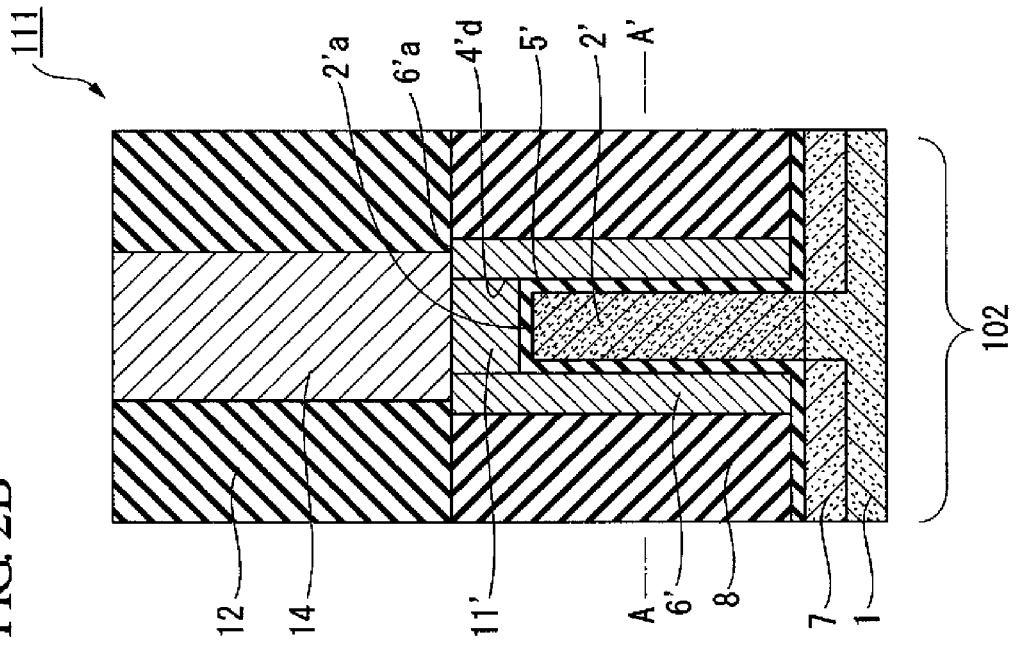
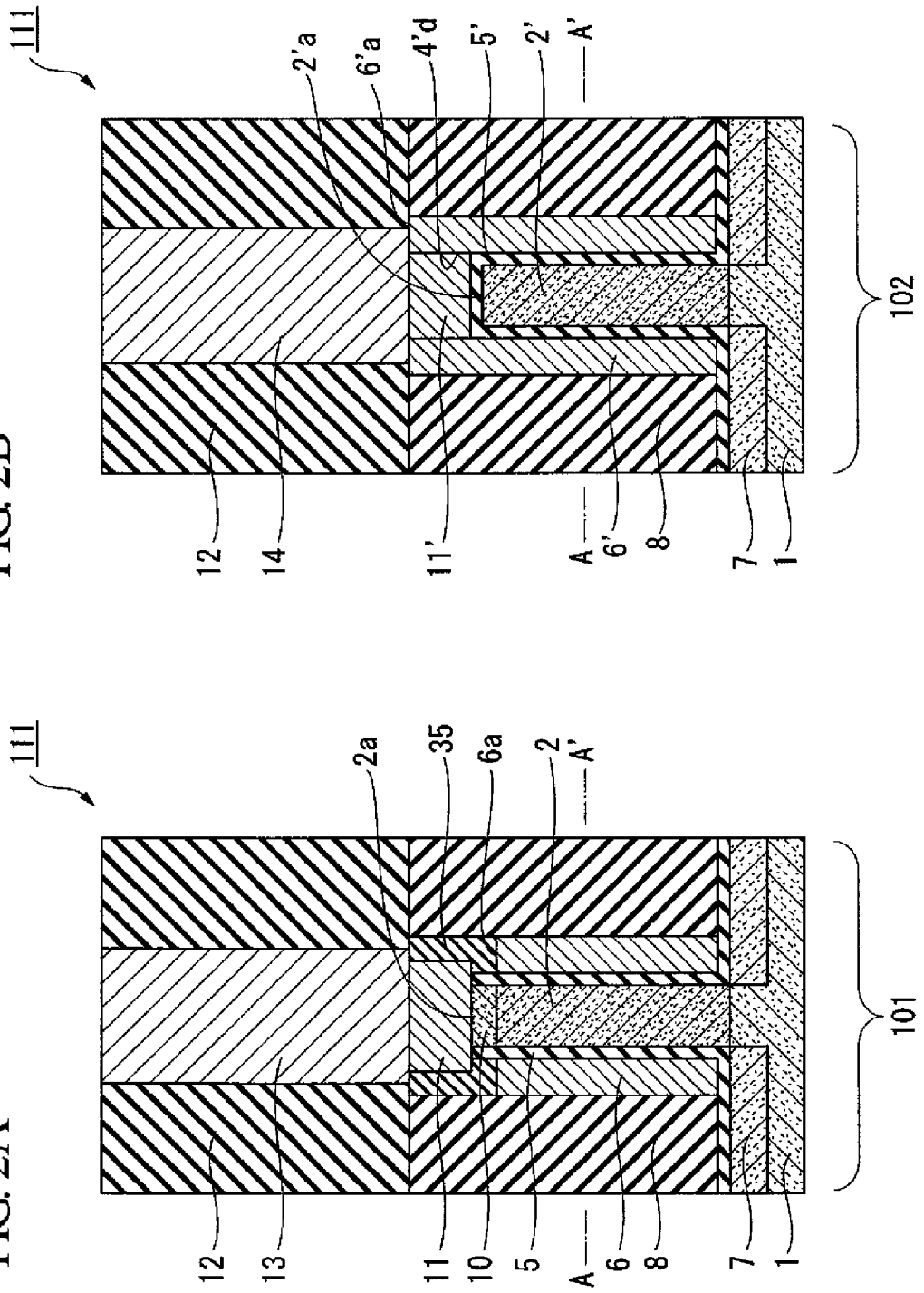

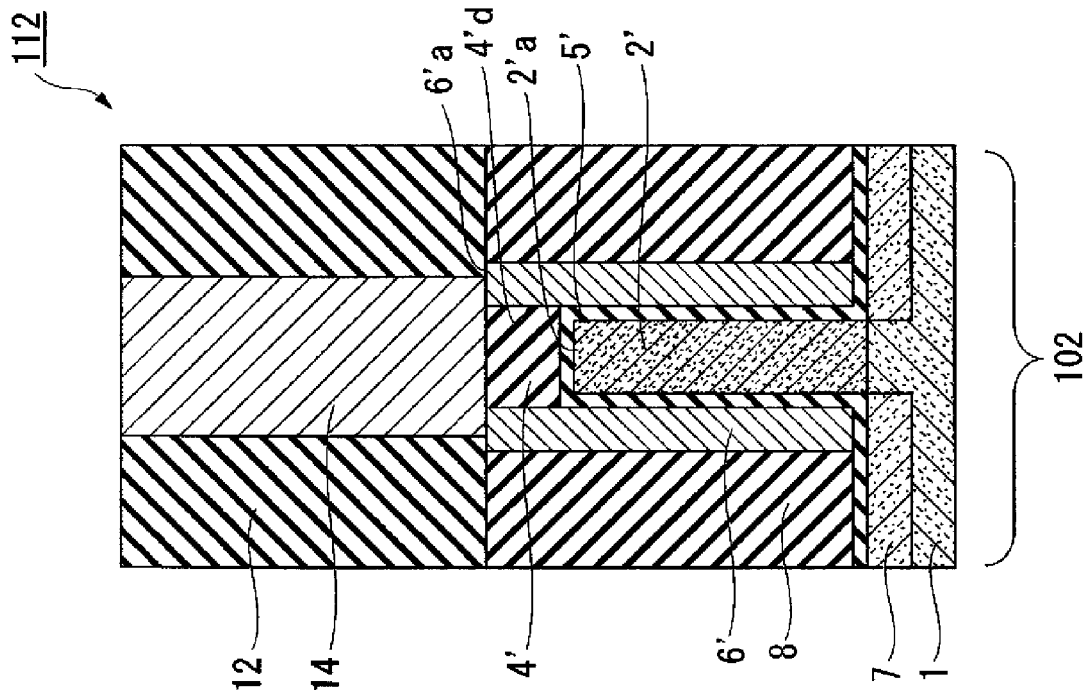
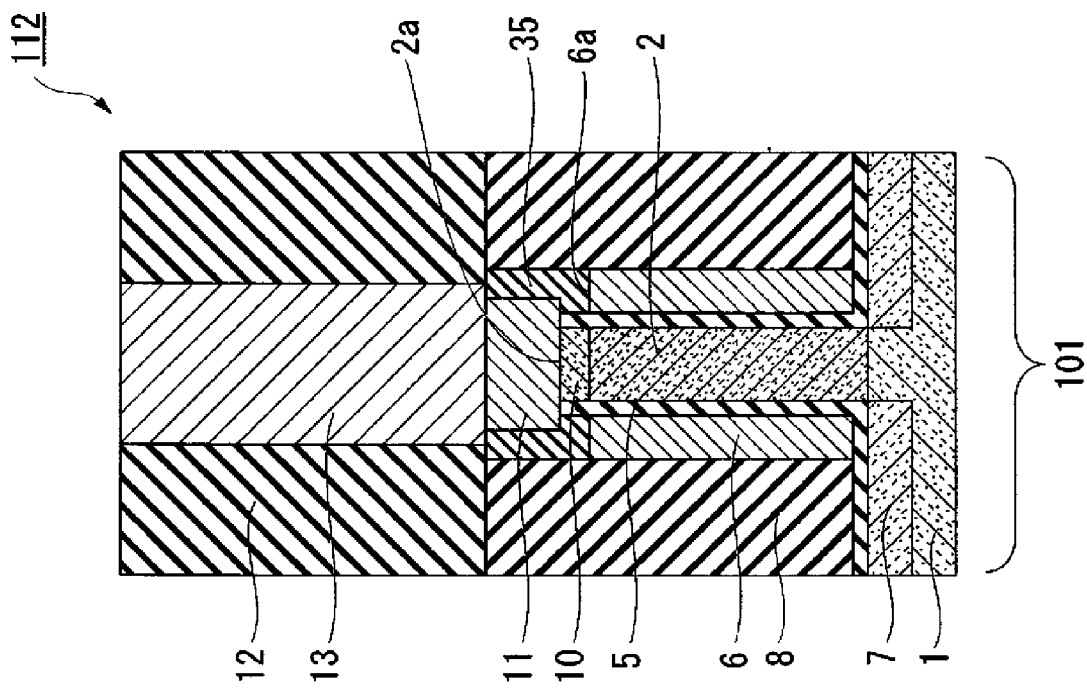

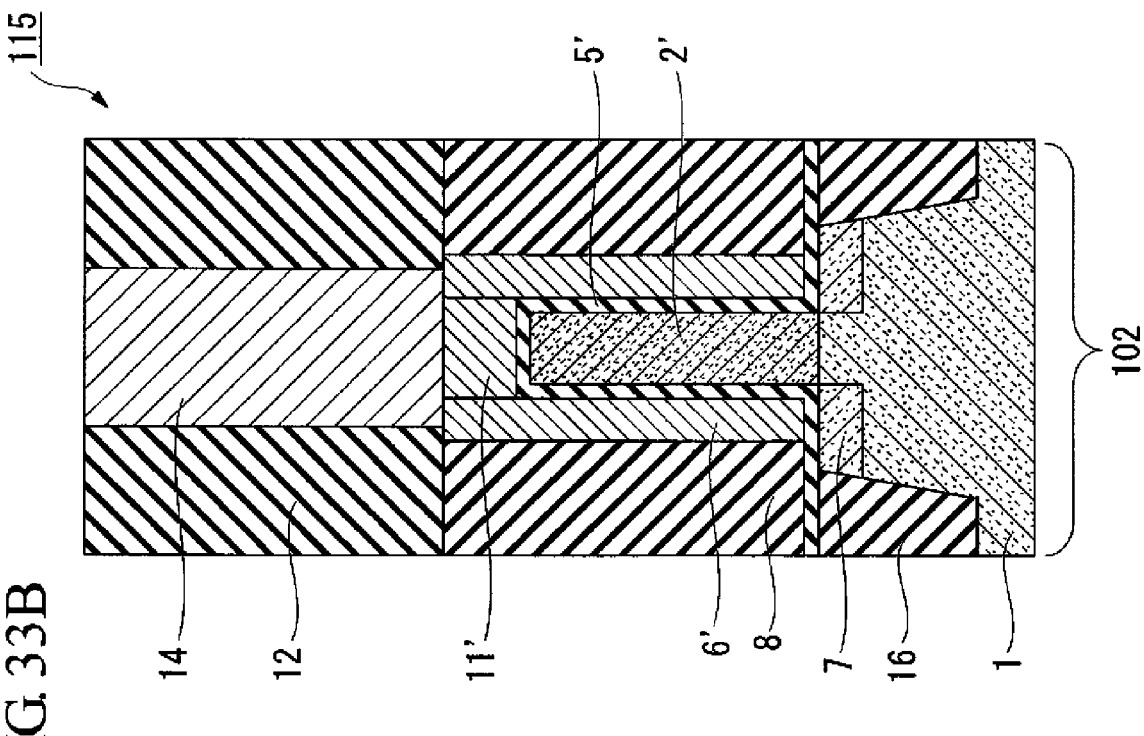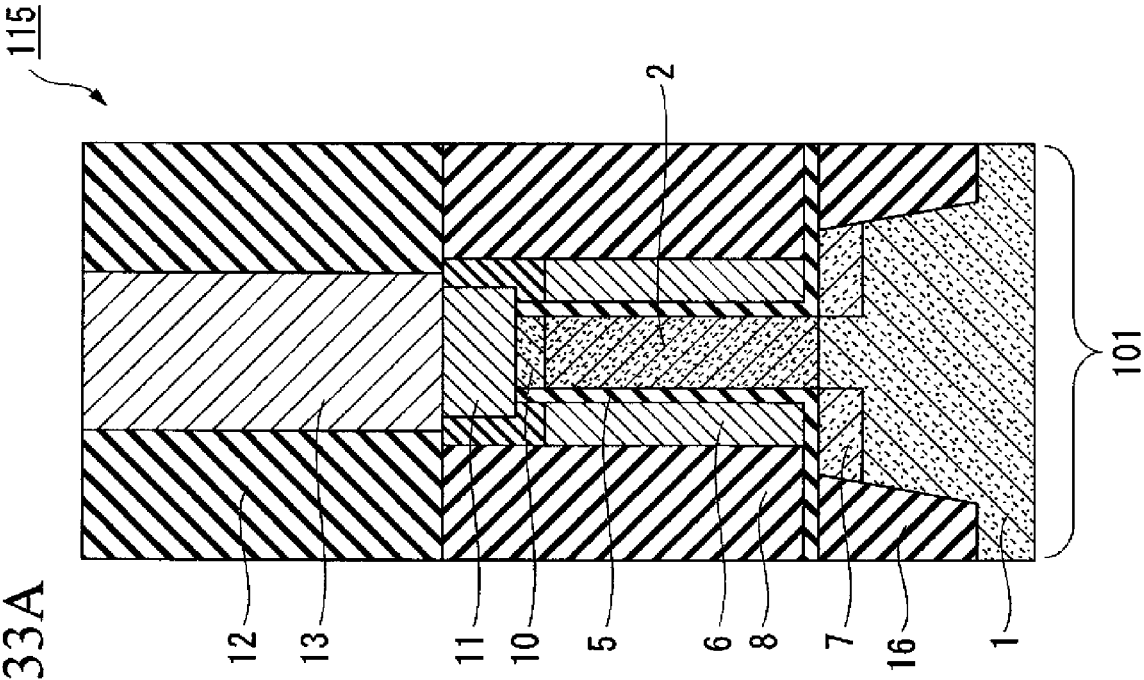

FIG. 37A
FIG. 37B
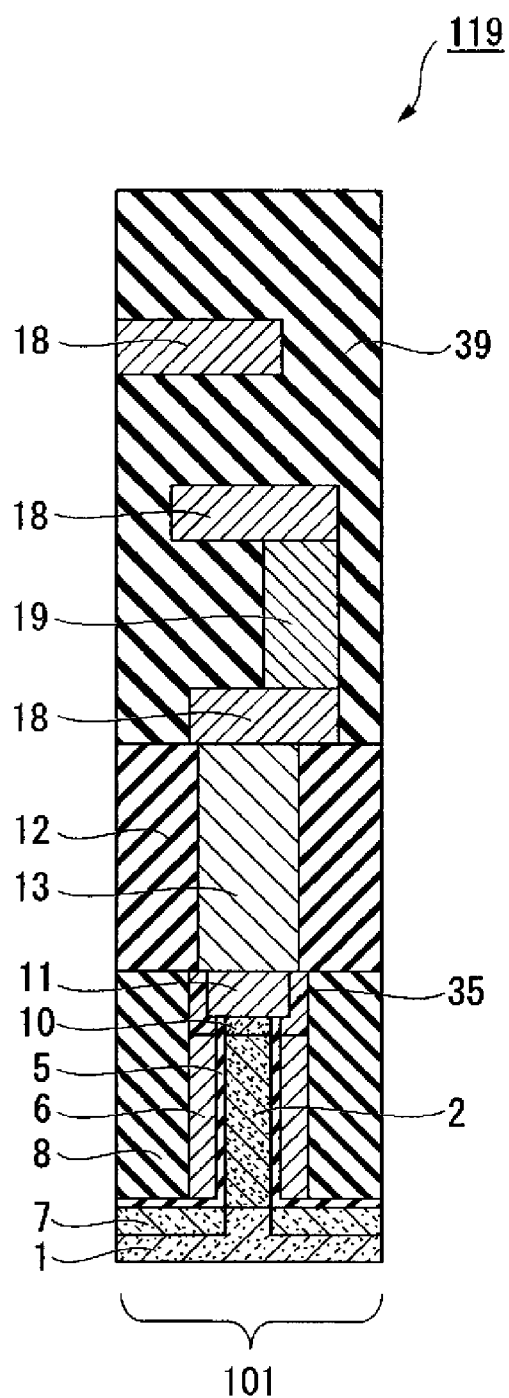
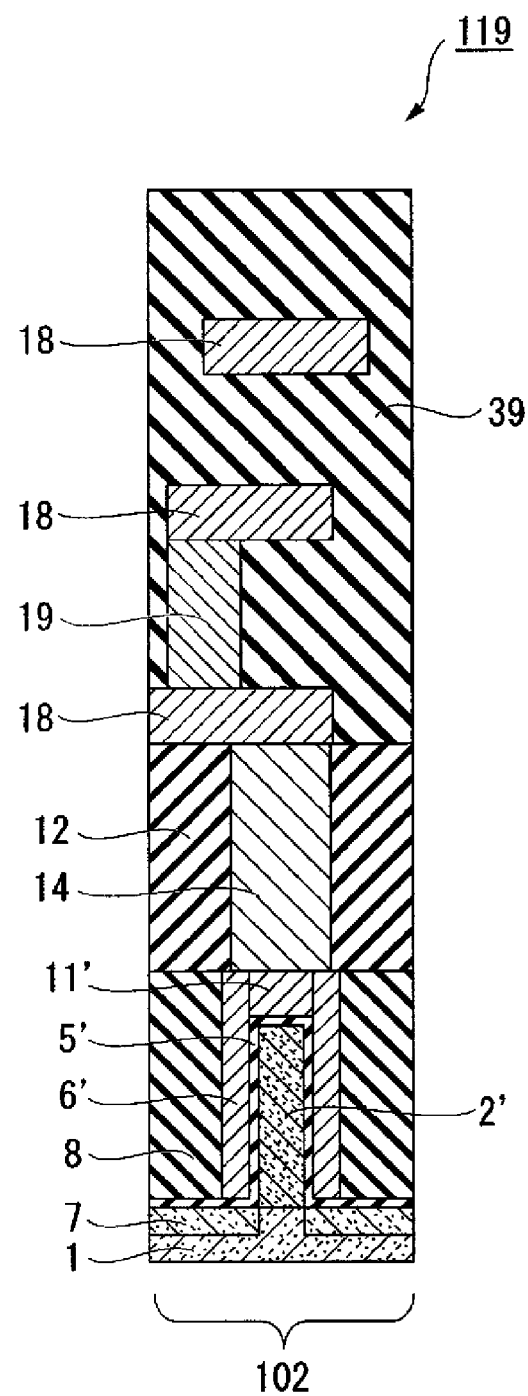

FIG. 38A
FIG. 38B
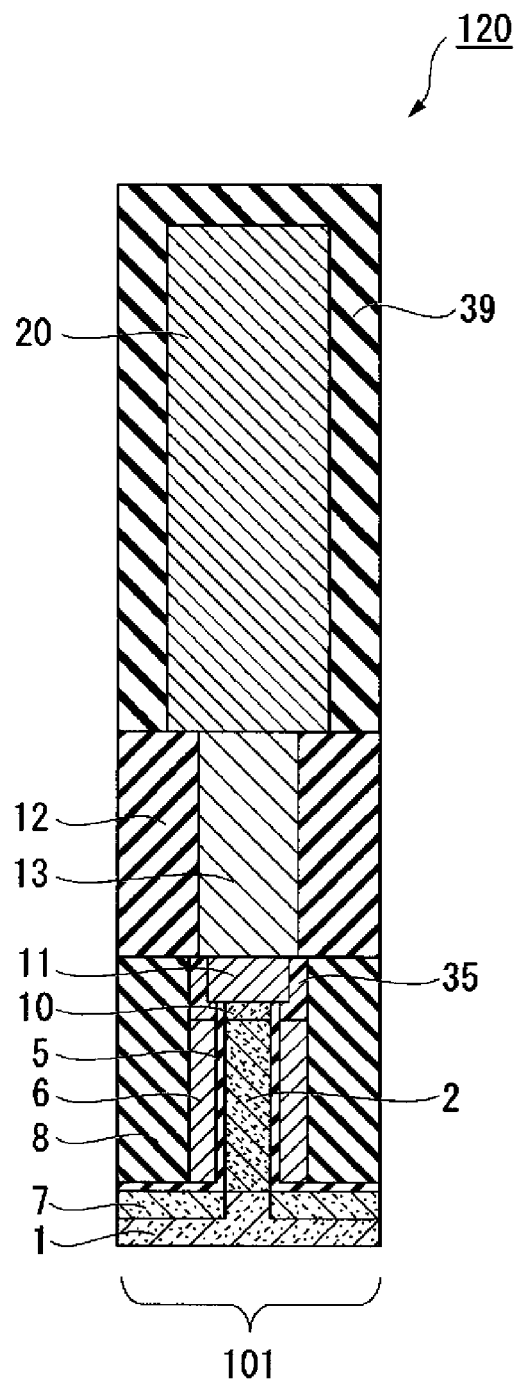
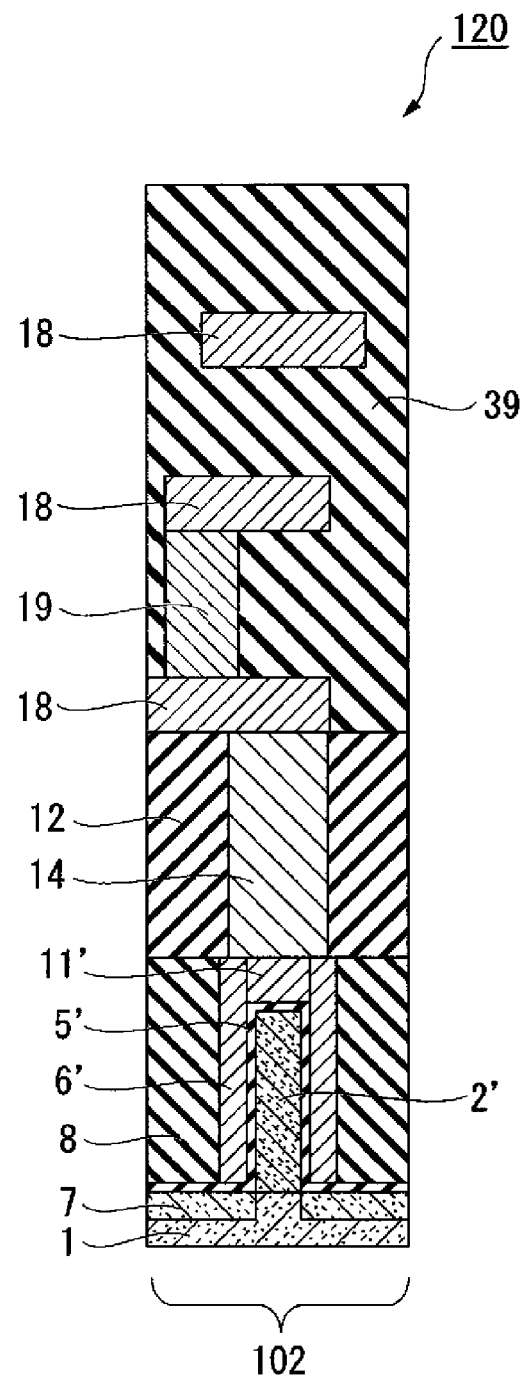

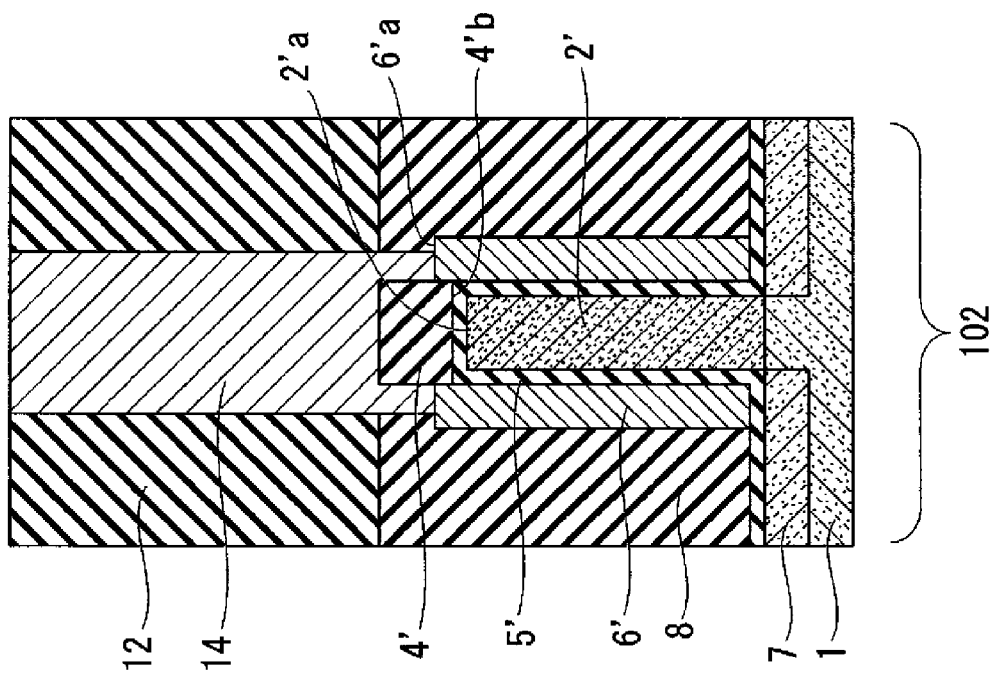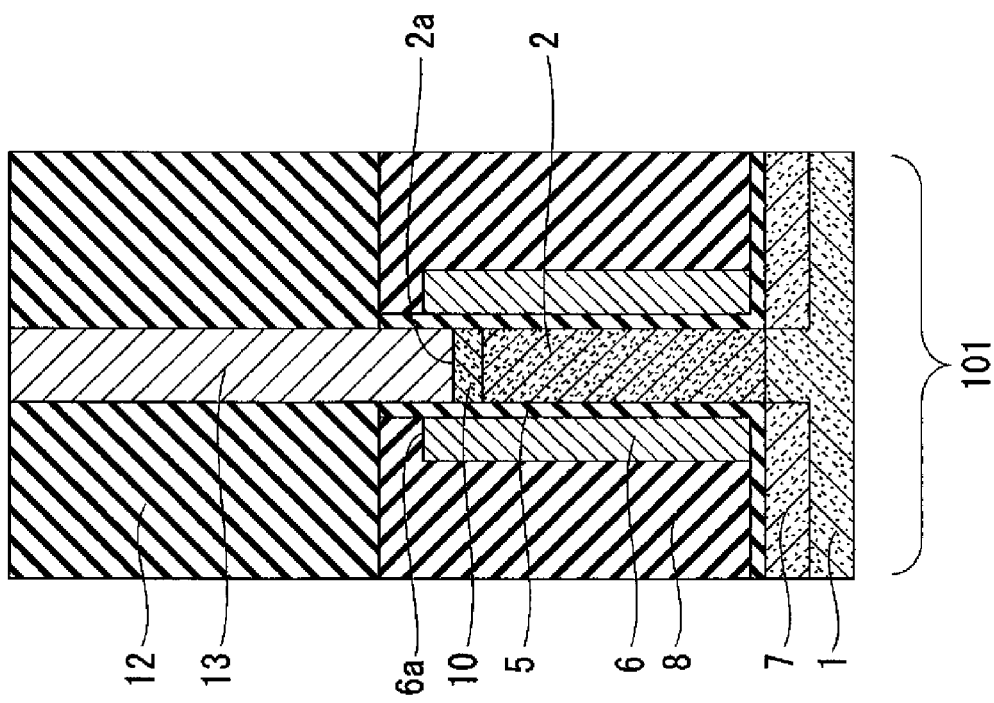

SEMICONDUCTOR DEVICE AND METHOD OF FORMING SEMICONDUCTOR DEVICE

BACKGROUND OF THE INVENTION

1. Field of the Invention

The present invention relates to a semiconductor device and a method of manufacturing a semiconductor device and, more particularly, to a semiconductor device including a vertical transistor and a method of manufacturing the same.

Priority is claimed on Japanese Patent Application No. 2008-310724, filed Dec. 5, 2008, the content of which is incorporated herein by reference.

2. Description of the Related Art

Recently, with progress in microfabrication techniques, miniaturization and increases in the capacity of semiconductor devices have rapidly progressed. As a small-sized large-capacity semiconductor device, for example, there is a vertical transistor.

The vertical transistor is obtained by forming a cylindrical semiconductor (hereinafter, referred to as a silicon pillar) on a semiconductor substrate, providing an upper diffusion region on a front end of the silicon pillar, providing a lower diffusion region on a base end side, providing a gate electrode on a sidewall thereof with a gate insulating film interposed therebetween, and placing a semiconductor element such as a transistor or a memory cell along a height direction of the silicon pillar.

In the vertical transistor, since the height direction of the silicon pillar may be a gate length direction of the semiconductor element, it is possible to ensure a gate length equal to or more than a predetermined length and prevent a short channel effect.

In the vertical transistor, since a plurality of semiconductor elements can be placed so as to be superposed in the height direction of the silicon pillar, it is possible to realize high density without increasing the area of the semiconductor substrate.

In addition, the vertical transistor has excellent characteristics in which a semiconductor element of a partial depletion-type or complete depletion type structure is relatively easily formed and a device with a high speed or a semiconductor element with low power consumption can be formed using an electric field concentration effect.

For the above reasons, the vertical transistor is expected as a semiconductor device capable of realizing, at low cost, a small size and a large capacity.

Japanese Unexamined Patent Application, First Publication, No. 2003-017585 discloses a semiconductor memory device and a method of manufacturing the same, and discloses a vertical cell transistor. In addition, it discloses that the vertical cell transistor can suppress a short channel effect and can improve a retention property.

However, since the vertical cell transistor has a configuration in which a word line is formed just on a gate electrode, a distance between the word line and a contact provided on an upper diffusion layer shortens and a short circuit is formed between the gate electrode and the upper diffusion layer.

Japanese Unexamined Patent Application, First Publication, No. 2004-221242 discloses a semiconductor integrated circuit device and a method of manufacturing the same and discloses means for improving embedding characteristics between vertical MISFETs.

Japanese Unexamined Patent Application, First Publication, No. 2004-247656 discloses a semiconductor device and a method of manufacturing the same and discloses a configuration and means for avoiding an electrical short circuit of a contact plug connected to a gate electrode and a source/drain region by controlling the sizes and the positions of a device separation region and a polysilicon film.

Japanese Unexamined Patent Application, First Publication, No. 2008-072051 discloses a non-volatile semiconductor memory device and a method of manufacturing the same and discloses a configuration and means for preventing a short circuit even when variations of processing size or misalignment at lamination are generated, by controlling the diameter of a connection portion of a contact plug. However, even when these techniques are used, it is difficult to solve the above problems.

SUMMARY

In one embodiment, a semiconductor device may include, but is not limited to, a substrate; a first semiconductor pillar extending from the substrate; a first insulating film covering a side face of the first semiconductor pillar; a first electrode covering the first insulating film; a second semiconductor pillar extending from the substrate; a second insulating film covering a surface of the second semiconductor pillar; and a second electrode covering a portion of the second insulating film. The first electrode has a top portion which is closer to the substrate than a top of the first semiconductor pillar. The portion of the second insulating film covers a side face of the second semiconductor pillar. The second electrode has a top portion which is farther to the substrate than a top of the second semiconductor pillar.

In another embodiment, a semiconductor device may include, but us not limited to, a first semiconductor pillar; a first insulation film covering a side face of the first semiconductor pillar; a first electrode covering the first insulating film; a second semiconductor pillar; a second insulating film covering a side face of the second semiconductor pillar; and a second electrode covering the second insulating film. The top level of the second electrode is higher than the top level of the first electrode.

In still another embodiment, a method of forming a semiconductor device may include, but is not limited to the following processes. First and second semiconductor pillars are formed which extend from a substrate. First and second insulating films are formed. The first insulating film covers a side face of the first semiconductor pillar. The second insulating film covers a side face of the second semiconductor pillar. First and second electrodes are formed. The first electrode covers the first insulating film. The second electrode covers the second insulating film. The first and second electrodes are electrically connected to each other. The first electrode is partially removed so that the top level of the first electrode is lower than the top level of the first semiconductor pillar, and the top level of the second electrode remains higher than the top level of the second semiconductor pillar.

BRIEF DESCRIPTION OF THE DRAWINGS

The above features and advantages of the present invention will be more apparent from the following description of certain preferred embodiments taken in conjunction with the accompanying drawings, in which:

FIG. 2A is a fragmentary cross sectional elevation view illustrating the semiconductor device, taken along a C-C' line of FIG. 1;

FIG. 2B is a fragmentary cross sectional elevation view illustrating the semiconductor device, taken along a D-D' line of FIG. 1;

FIG. 15A is a fragmentary cross sectional elevation view illustrating the semiconductor device, taken along a C-C' line of FIG. 1 in accordance with a second preferred embodiment of the present invention;

FIG. 15B is a fragmentary cross sectional elevation view illustrating the semiconductor device, taken along a D-D' line of FIG. 1 in accordance with the second preferred embodiment of the present invention;

FIG. 33A is a fragmentary cross sectional elevation view illustrating the semiconductor device, taken along a C-C' line of FIG. 1 in accordance with a fifth preferred embodiment of the present invention;

FIG. 33B is a fragmentary cross sectional elevation view illustrating the semiconductor device, taken along a D-D' line of FIG. 1 in accordance with the fifth preferred embodiment of the present invention;

FIG. 37A is a fragmentary cross sectional elevation view illustrating the semiconductor device, taken along a C-C' line of FIG. 1 in accordance with a ninth embodiment of the present invention;

FIG. 37B is a fragmentary cross sectional elevation view illustrating the semiconductor device, taken along a D-D' line of FIG. 1 in accordance with the ninth embodiment of the present invention;

FIG. 38A is a fragmentary cross sectional elevation view illustrating the semiconductor device, taken along a C-C' line of FIG. 1 in accordance with a tenth embodiment of the present invention;

FIG. 38B is a fragmentary cross sectional elevation view illustrating the semiconductor device, taken along a D-D' line of FIG. 1 in accordance with the tenth embodiment of the present invention;

FIG. 39A is a fragmentary cross sectional elevation view illustrating the semiconductor device in accordance with a comparative example 1;

FIG. 39B is a fragmentary cross sectional elevation view illustrating the semiconductor device in accordance with the comparative example 1;

DETAILED DESCRIPTION OF THE PREFERRED EMBODIMENTS

Figure 1:
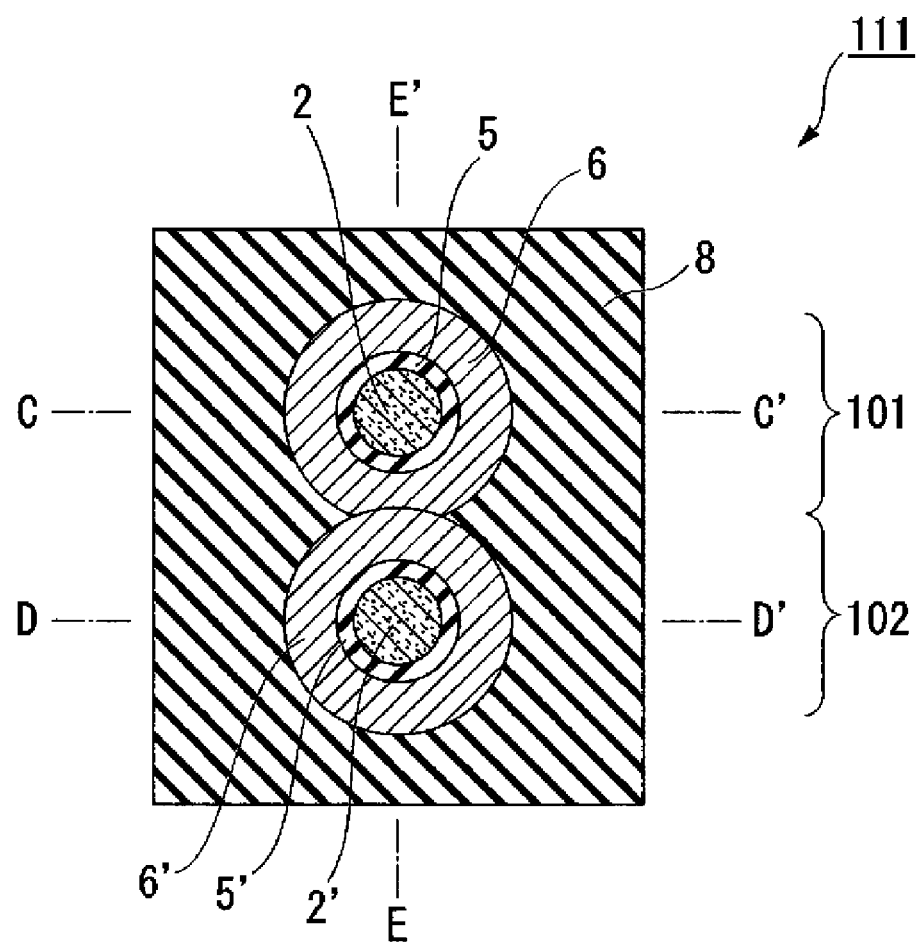
FIG. 1 is a fragmentary cross sectional plan view illustrating a semiconductor device in accordance with a first preferred embodiment of the present invention.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

A semiconductor device may include, but is not limited to, a substrate; a first semiconductor pillar extending from the substrate; a first insulating film covering a side face of the first semiconductor pillar; a first electrode covering the first insulating film; a second semiconductor pillar extending from the substrate; a second insulating film covering a surface of the second semiconductor pillar; and a second electrode covering a portion of the second insulating film. The first electrode has a top portion which is closer to the substrate than a top of the first semiconductor pillar. The portion of the second insulating film covers a side face of the second semiconductor pillar. The second electrode has a top portion which is farther to the substrate than a top of the second semiconductor pillar.

The second electrode may be electrically connected to the first electrode.

The first electrode may be, but is not limited to, a gate electrode. The second electrode may be, but is not limited to, a gate contact electrode.

The first electrode may be separated by the first insulating film from the first semiconductor pillar. The second electrode may be separated by the second insulating film from the second semiconductor pillar.

The semiconductor device may further include, but is not limited to, a third insulating film which is disposed over the first electrode; and a first contact plug disposed over the first semiconductor pillar. The first contact plug may be separated by the third insulating film from the first electrode.

The semiconductor device may further include, but is not limited to, a first inter-layer insulator which extends over the substrate; a second inter-layer insulator which extends over the first inter-layer insulator and over the first and second semiconductor pillars; a second contact plug disposed in the second inter-layer insulator, and a third contact plug disposed in the second inter-layer insulator. The second contact plug may be connected to the first contact plug. The third contact plug may be connected to the top portion of the second electrode.

The semiconductor device may further include, but is not limited to, a fourth contact plug being connected to the third contact plug. The fourth contact plug may be connected to the second electrode, the fourth contact plug being provided in a groove. The groove may have side walls defined by the top portion of the second electrode. The groove may have a bottom defined by the top portion of the second insulating film.

The semiconductor device may further include, but is not limited to, a fourth insulating being provided in a groove. The groove may have side walls defined by the top portion of the second electrode. The groove may have a bottom defined by the top portion of the second semiconductor pillar.

The semiconductor device may further include, but is not limited to, a first epitaxial layer disposed over the top portion of the first semiconductor pillar and a second epitaxial layer disposed over the second electrode. The first epitaxial layer may contact the first contact plug. The first epitaxial layer electrically connects the first semiconductor pillar and the first contact plug. The second epitaxial layer contacts the third contact plug. The second epitaxial layer electrically connects the second electrode and the second contact plug.

The semiconductor device may further include, but is not limited to, isolation regions formed on the substrate to define an active region. The active region has at least a vertical transistor portion and at least a gate contact portion. The vertical transistor portion includes the first semiconductor pillar, the first insulating film and the first electrode. The gate contact portion includes the second semiconductor pillar, the second insulating film and the second electrode.

The semiconductor device may include a plurality of sets of the vertical transistor portion and the gate contact portion.

The top portion of the first semiconductor pillar may include a top diffusion region. The substrate has a second diffusion region which is close to the bottom portion of the first semiconductor pillar.

A semiconductor device may include, but us not limited to, a first semiconductor pillar; a first insulating film covering a side face of the first semiconductor pillar; a first electrode covering the first insulating film; a second semiconductor pillar; a second insulating film covering a side face of the second semiconductor pillar; and a second electrode covering the second insulating film. The top level of the second electrode is higher than the top level of the first electrode.

The top level of the first electrode is lower than the top level of the first semiconductor pillar, and the top level of the second electrode may be higher than the top level of the second semiconductor pillar.

The first electrode may be electrically connected to the second electrode.

The first electrode may be separated by the first insulating film from the first semiconductor pillar. The second electrode may be separated by the second insulating film from the second semiconductor pillar.

A method of forming a semiconductor device may include, but is not limited to the following processes. First and second semiconductor pillars are formed which extend from a substrate. First and second insulating films are formed. The first insulating film covers a side face of the first semiconductor pillar. The second insulating film covers a side face of the second semiconductor pillar. First and second electrodes are formed. The first electrode covers the first insulating film. The second electrode covers the second insulating film. The first and second electrodes are electrically connected to each other. The first electrode is partially removed so that the top level of the first electrode is lower than the top level of the first semiconductor pillar, and the top level of the second electrode remains higher than the top level of the second semiconductor pillar.

The method may further include, but is not limited to, the following processes. A bottom diffusion region is formed in the substrate. The bottom diffusion region is close to the bottom of the first semiconductor pillar. A first inter-layer insulator is formed which covers the first and second semiconductor pillars. A top diffusion region is formed in a top portion of the first semiconductor pillar.

The method may further include, but is not limited to, the following processes. A second inter-layer insulator is formed over the first electrode after forming the top diffusion region. A first contact plug is formed over the first semiconductor pillar. The first contact plug is separated by the second inter-layer insulator from the first electrode.

The method may further include, but is not limited to, the following processes. A third inter-layer insulator is formed which covers the first inter-layer insulator, after forming the first contact plug. Second and third contact plugs are formed in the third inter-layer insulator. The second contact plug is connected to the first contact plug. The third contact plug is connected to the second electrode.

First Embodiment

Figure 3:
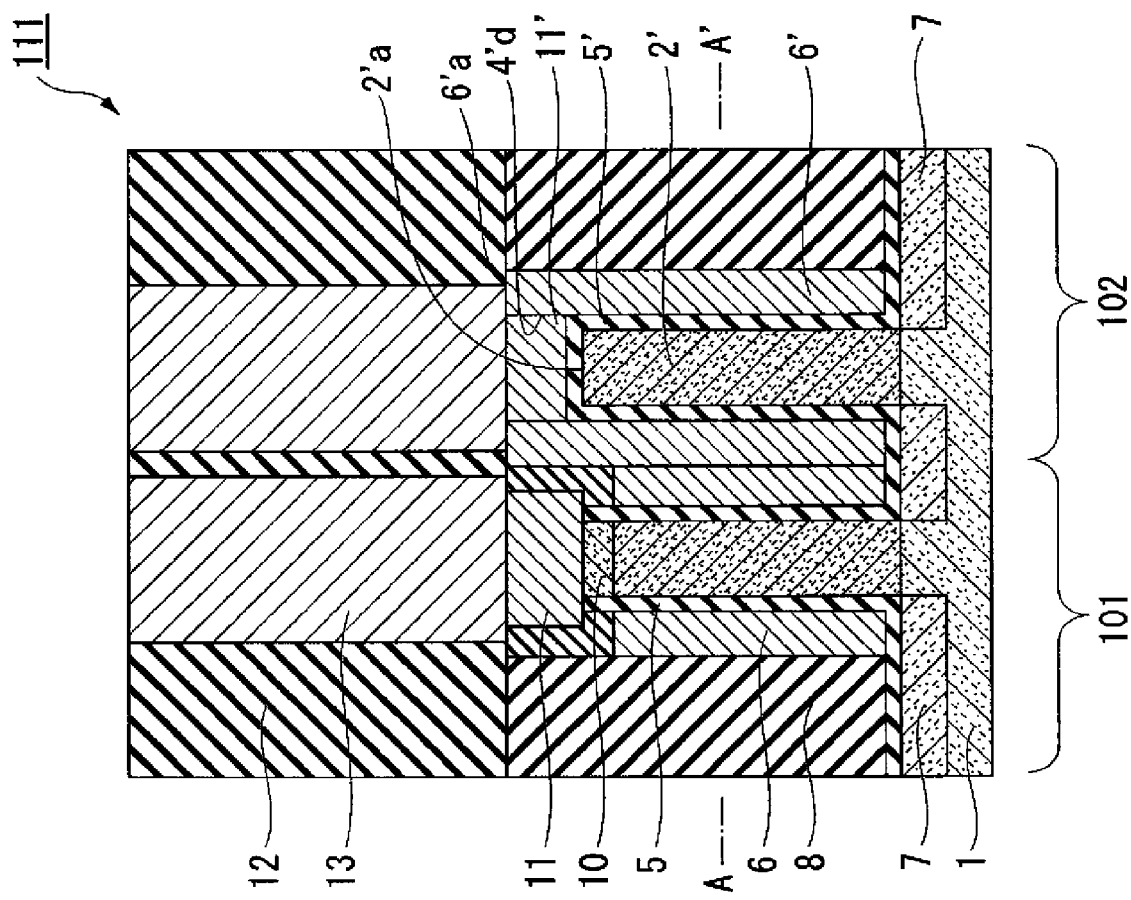
FIG. 3 is a fragmentary cross sectional elevation view illustrating the semiconductor device, taken along an E-E' line of FIG. 1.

FIG. 1 is a fragmentary cross sectional plan view illustrating a semiconductor device in accordance with a first preferred embodiment of the present invention. FIG. 2A is a fragmentary cross sectional elevation view illustrating the semiconductor device, taken along a C-C' line of FIG. 1. FIG. 2B is a fragmentary cross sectional elevation view illustrating the semiconductor device, taken along a D-D' line of FIG. 1. FIG. 3 is a fragmentary cross sectional elevation view illustrating the semiconductor device, taken along an E-E' line of FIG. 1. FIG. 1 is the fragmentary cross sectional plan view, taken along an A-A' line of FIGS. 2A, 2B, and 3.

As shown in FIG. 1, a semiconductor device 111 may include, but is not limited to, a vertical transistor portion (hereinafter, referred to as a vertical Tr portion) 101 and a gate contact portion 102. The vertical Tr portion is embedded in an interlayer insulating film 8. The vertical Tr portion has substantially a circular shape in plan view. The gate contact portion 102 has substantially a circular shape in plan view.

The vertical Tr portion 101 may include a first silicon pillar 2, a first insulating film 5 surrounding the first silicon pillar 2, and a gate electrode 6 surrounding the first insulating film 5.

The gate contact portion 102 may include a second silicon pillar 2', a second insulating film 5' surrounding the second silicon pillar 2', and a gate contact 5 electrode 6' surrounding the second insulating film 5'.
<Vertical Tr Portion>

As shown in FIG. 2A, the vertical Tr portion 101 of the semiconductor device 111 may include the first silicon pillar 2 formed on a silicon substrate 1, the first insulating film 5 surrounding the side surface of the first silicon pillar 2, the gate electrode 6 covering the first insulating film 5, a lower diffusion region 7 in the substrate 1 at a base end side of the first silicon pillar 2, and an upper diffusion region 10 in a front end 2a of the first silicon pillar 2.

The gate electrode 6 may be formed of a conductive material and, for example, may include polysilicon, a metal material, or the like.

The polysilicon film in situ-doped with phosphorus (P) at a concentration of $1 \times E^{20}(/cm^3)$ as a dopant is preferable to be used as the gate electrode 6. The type of the dopant and the concentration of the dopant are not limited thereto.

The metal material such as tungsten (W) or the like may be used as the gate electrode 6, for example.

The insulating film 5 is formed, which covers the surface of the substrate 1 and the side surface of the first silicon pillar 2. The insulating film 5 performs as a gate insulating film between the first silicon pillar 2 and the gate electrode 6.

The material of the insulating film 5 should not be limited. Any known insulating film can be available, for example, an oxide film or the like. In particular, a High-K insulating film is preferable.

The first silicon pillar 2 is covered by the first interlayer insulating film 8. A second interlayer insulating film 12 covers the first interlayer insulating film 8. A second contact plug 13 is embedded in the second interlayer insulating film 12.

In addition, the first interlayer insulating film 8 and the second interlayer insulating film 12 should not be limited. Any available insulating films such as an oxide film, a nitride film, an SiON film, an SiC film or the like may be used. The first interlayer insulating film 8 and the second interlayer insulating film 12 may be made of the same material or different materials.

A first contact plug 11 is formed on the front end 2a of the first silicon pillar 2. The second contact plug 13 is connected to the front end 2a of the silicon pillar 2 through the first contact plug 11. Therefore, a predetermined voltage may be applied from the second contact plug 13 to the upper diffusion region 10 of the first silicon pillar 2.

As shown in FIG. 2A, a front end 6a of the gate electrode 6 of the vertical Tr portion 101 is closer to the substrate 1 than the front end 2a of the first silicon pillar 2. Namely, the front end 6a of the gate electrode 6 is lower in level than the front end 2a of the first silicon pillar 2. Therefore, even when the diameter of the second contact plug 13 is larger than a design value or when the embedded position thereof is displaced, it can be possible to avoid that the second contact plug 13 contacts the gate electrode 6 and also that a short circuit is formed between the second contact plug 13 and the gate electrode 6.

A third insulating film 35 is formed on the front end 6a of the gate electrode 6. Since the third insulating film 35 insulates the first contact plug 11 from the gate electrode 6, it can be avoided that the second contact plug 13 formed on the first contact plug 11 contacts the gate electrode 6 and that a short circuit is formed between the second contact plug 13 and the gate electrode 6.
<Gate Contact Portion>

As shown in FIG. 2B, the gate contact portion 102 of the semiconductor 5 device 111 may include the second silicon pillar 2' over the silicon substrate 1, the second insulating film 5' covering the surface of the second silicon pillar 2', the gate contact electrode 6' covering the second insulating film 5', and the lower diffusion region 7 in the substrate 1 at a base end side of the second silicon pillar 2'.

The second silicon pillar 2' is covered by the first interlayer insulating film 8. A second interlayer insulating film 12 extends over the first interlayer insulating film 8. A third contact plug 14 is embedded in the second interlayer insulating film 12.

The gate contact electrode 6' of the gate contact portion 102 is defined substantially in a cylindrical shape. A front end 6'a of the gate contact electrode 6' is formed so as to protrude from the front end 2'a of the second silicon pillar 2'. A fourth contact plug 11' is formed in a concave portion 4'd positioned over the second silicon pillar 2'. Therefore, the fourth contact plug 11' is connected to the third contact plug 14 and the gate contact electrode 6'.

The second insulating film 5' covers the surface of the substrate 1 and the surface of the second silicon pillar 2'. Therefore, the second silicon pillar 2' is separated by the second insulating film 5' from the gate contact electrode 6'. The second silicon pillar 2' is separated by the second insulating film 5' from the fourth contact plug 11'.

As shown in FIG. 2B, the front end 6'a of the gate contact electrode 6' of the gate contact portion 102 is disposed so as to be spaced from the substrate 1 rather than the front end 2'a of the second silicon pillar 2'. Therefore, even when the diameter of the third contact plug 14 is larger than a design value and the embedded position thereof is deviated, a possibility that the third contact plug 14 breaks the insulating film 5 and abuts on the second silicon pillar 2' is reduced, that is, damage to the insulating film 5 which is the gate insulating film is avoided, and thus a short circuit 5 between the third contact plug 14 and the second silicon pillar 2' can be prevented.

FIG. 3 is a vertical cross-sectional view of the semiconductor device 111, taken along a line E-E' of FIG. 1.

As shown in FIG. 3, the vertical Tr portion 101 and the gate contact portion 102 are formed on the substrate 1 so as to be adjacent to each other.

The gate electrode 6 of the vertical Tr portion 101 is formed while being continued to, that is, being connected to the gate contact electrode 6' of the gate contact portion 102. Therefore, by applying a voltage from the third contact plug to the gate contact electrode 6', the voltage can be applied to the gate electrode 6 of the vertical Tr portion 101 and the gate voltage of the vertical Tr portion 101 can be adjusted.

In addition, the insulating film 5 of the vertical Tr portion 101 is formed while being continued to the insulating film 5' of the gate contact portion 102. However, the insulating film 5' may be formed of a dielectric material or may be a film formed of another material which is separately formed from the insulating film 5.

In addition, the semiconductor device 111 according to the embodiment of the present invention may be used as a general transistor, but may be used as a flash memory by forming a floating portion in the gate electrode 6 or may be used as a Floating Body Cell (FBC) in which holes are accumulated in a body portion.

An example of a method of manufacturing the semiconductor device according to the embodiment will be described.

FIGS. 4A through 14B are cross-sectional views illustrating the example of the method of manufacturing the semiconductor device 111 according to the embodiment of the present invention.

Figure 4A:
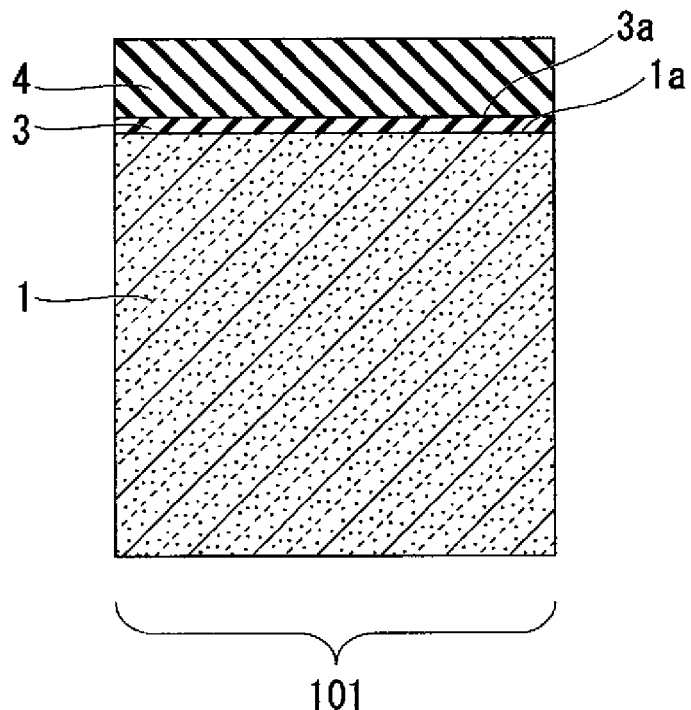
FIG. 4A is a fragmentary cross sectional elevation view illustrating a step involved in a method of forming the semiconductor device of FIGS. 1, 2A and 2B, taken along a C-C' line of FIG. 1.
Figure 4B:
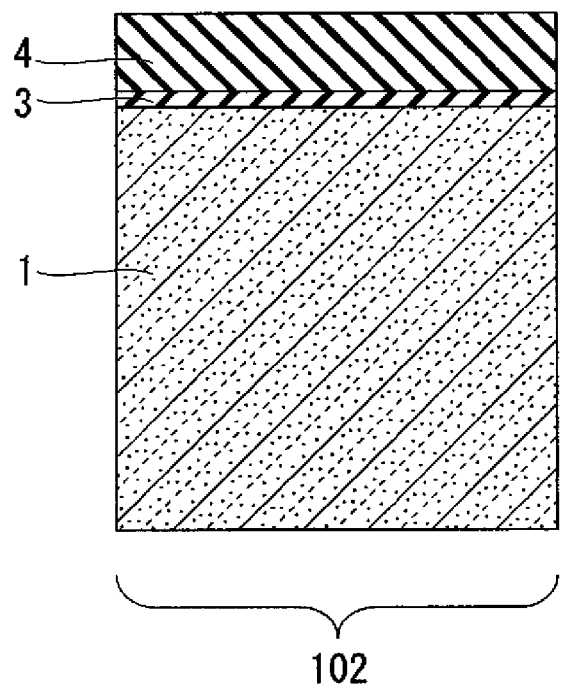
FIG. 4B is a fragmentary cross sectional elevation view illustrating a step involved in a method of forming the semiconductor device of FIGS. 1, 2A and 2B, taken along a D-5 D' line of FIG. 1.

A surface 1a of the substrate 1 made of silicon is thermally oxidized at an atmosphere of 1000° C. so as to form an oxide film 3, for example, a thermal oxide film or a silicon oxide film. The film thickness of the oxide film 3 is, for example, 10 nm. As shown in FIGS. 4A and 4B, a nitride film 4 is grown on the oxide film 3 using a CVD method. The film thickness of the nitride film 4 is, for example, 150 nm.

Figure 5A:
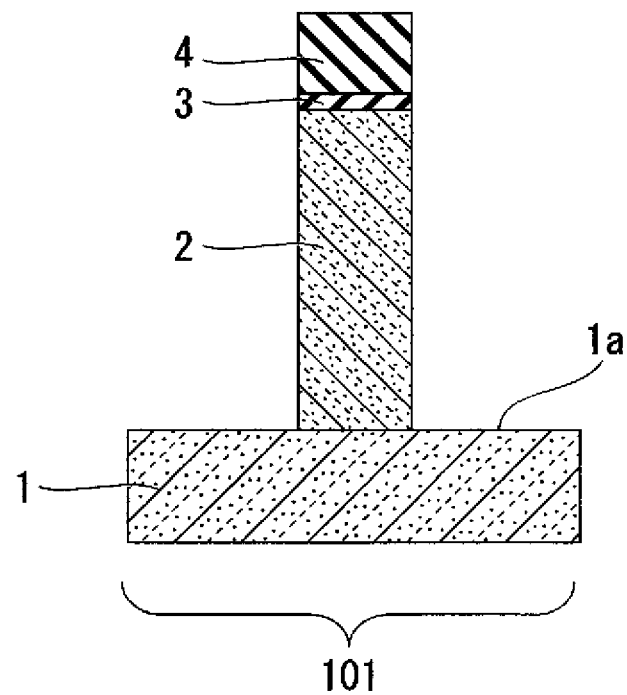
FIG. 5A is a fragmentary cross sectional elevation view illustrating a step, subsequent to the step of FIG. 4A, involved in a method of forming the semiconductor device of FIGS. 1, 2A and 2B, taken along a C-C' line of FIG. 1.
Figure 5B:
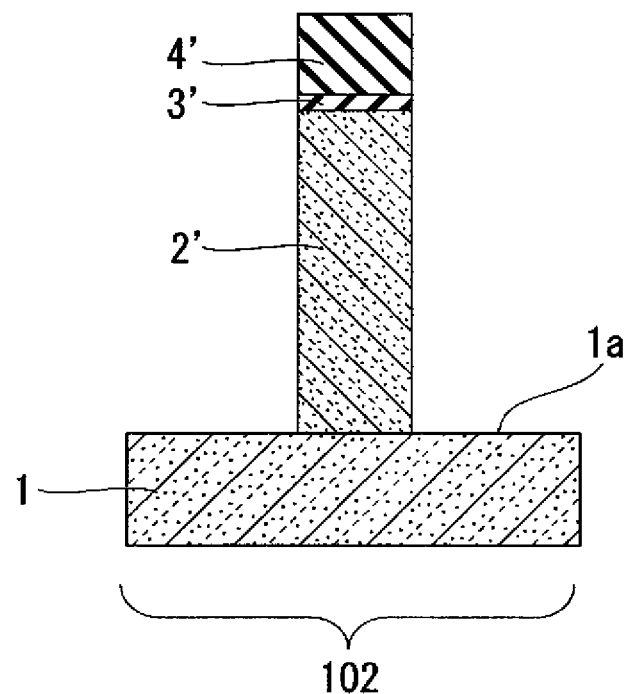
FIG. 5B is a fragmentary cross sectional elevation view illustrating a step, subsequent to the step of FIG. 4B, involved in a method of forming the semiconductor device of FIGS. 1, 2A and 2B, taken along a D-D' line of FIG. 1.

As shown in FIGS. 5A and 5B, using a lithography method, the silicon pillars 2 and 2' are formed. First, after resist is applied on the nitride film 4, exposure is performed using a predetermined mask so as to form a mask (resist mask) made of a resist. Using the resist mask, the nitride film 4 and the oxide film 3 are dry-etched. Therefore, the nitride film 4' is formed at the side of the gate contact portion 102. The substrate 1 is dry-etched by, for example, a depth of 150 nm using the nitride films 4 and 4' as a hard mask (SiN mask). Therefore, as shown in FIGS. 5A and 5B, the silicon pillars 2 and 2' may be formed. The oxide film 3 and the nitride film 4 (4') remain at the front end side of the silicon pillars 2 and 2'.

A surface 1a of the substrate 1 and the side surfaces of the silicon pillars 2 and 2' are thermally oxidized so as to form the same oxide film (thermal oxide film: silicon oxide film) 5 as the oxide film 3. In addition, the oxide film of the gate contact portion 102 side becomes the second oxide film 5'. However, the first oxide film 5 and the second oxide film 5' are the same film which is continuously formed.

Figure 6A:
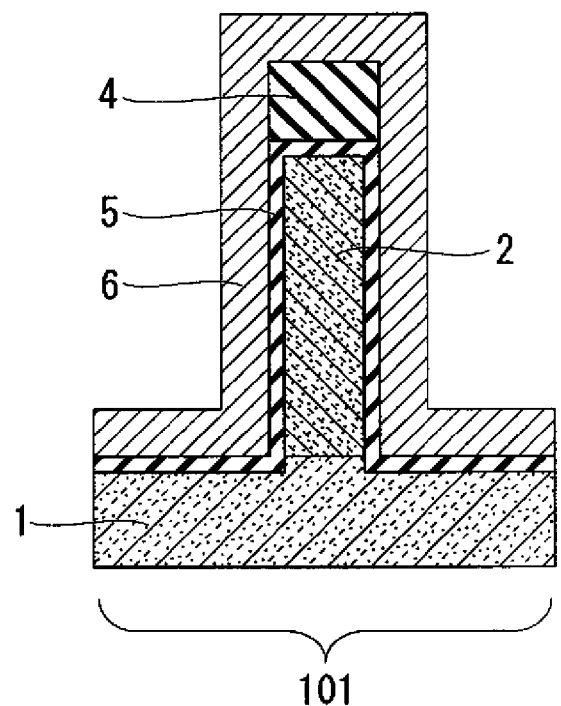
FIG. 6A is a fragmentary cross sectional elevation view illustrating a step, subsequent to the step of FIG. 5A, involved in a method of forming the semiconductor device of FIGS. 1, 2A and 2B, taken along a C-C' line of FIG. 1.
Figure 6B:
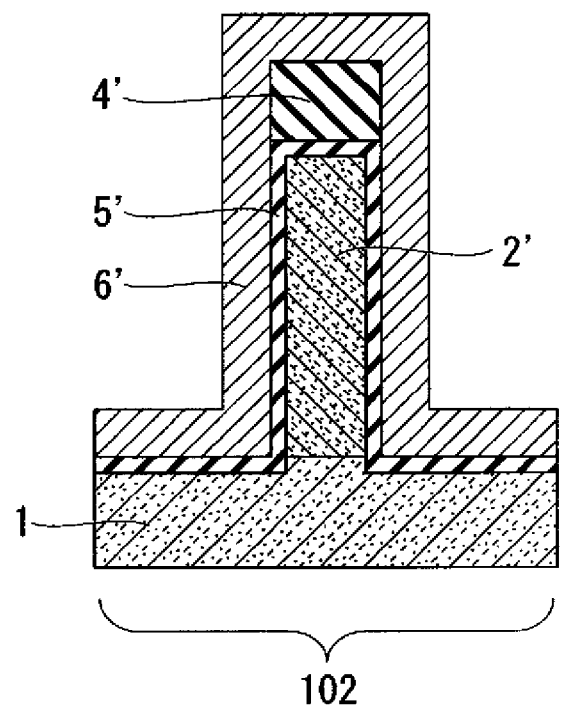
FIG. 6B is a fragmentary cross sectional elevation view illustrating a step, subsequent to the step of FIG. 5B, involved in a method of forming the semiconductor device of FIGS. 1, 2A and 2B, taken along a D-D' line of FIG. 1.

Using the CVD method, a gate electrode material is deposited so as to cover the silicon pillars 2 and 2' and one surface 1a side of the substrate 1, thereby forming the gate electrode 6 shown in FIGS. 6A and 6B. As the gate electrode material, for example, polysilicon in situ-doped with phosphorus (P) at a concentration of $1 \times E^{20}(/cm^3)$ or the like is used.

Figure 7A:
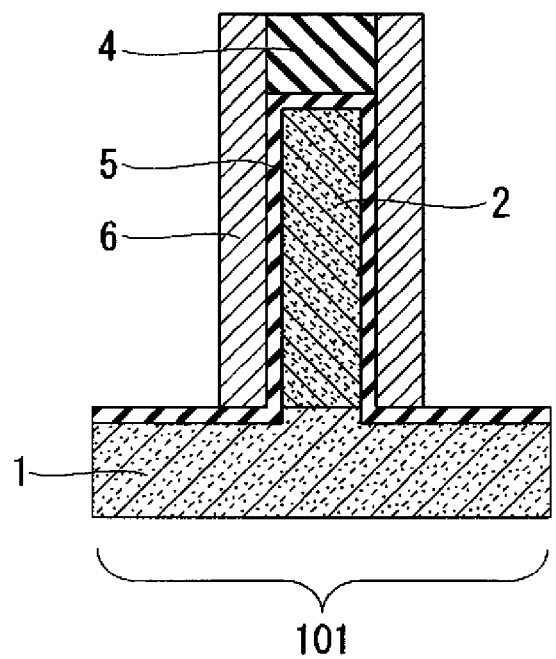
FIG. 7A is a fragmentary cross sectional elevation view illustrating a step, subsequent to the step of FIG. 6A, involved in a method of forming the semiconductor device of FIGS. 1, 2A and 2B, taken along a C-C' line of FIG. 1.
Figure 7B:
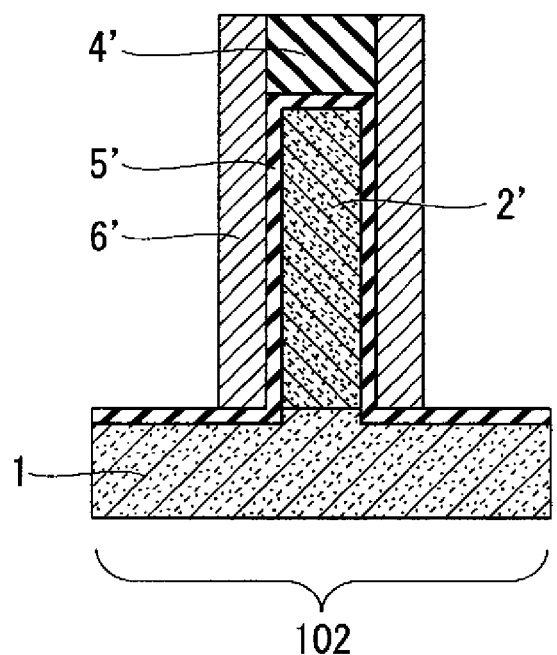
FIG. 7B is a fragmentary cross sectional elevation view illustrating a step, subsequent to the step of FIG. 6B, involved in a method of forming the semiconductor device of FIGS. 1, 2A and 2B, taken along a D-D' line of FIG. 1.

The gate electrode material is etched back (polysilicon etch-back) until the nitride films 4 and 4' formed on the front ends of the silicon pillars 2 and 2' are exposed such that, as shown in FIGS. 7A and 7B, the gate electrode 6 remains on the side surface of the first silicon pillar 2 and the gate contact electrode 6' remains on the side surface of the second silicon pillar 2'.

In addition, as described with reference to FIG. 3, the gate electrode 6 formed on the side surface of the first silicon pillar 2 and the gate contact electrode 6' formed on the side surface of the second silicon pillar 2' are continuously formed.

Figure 8A:
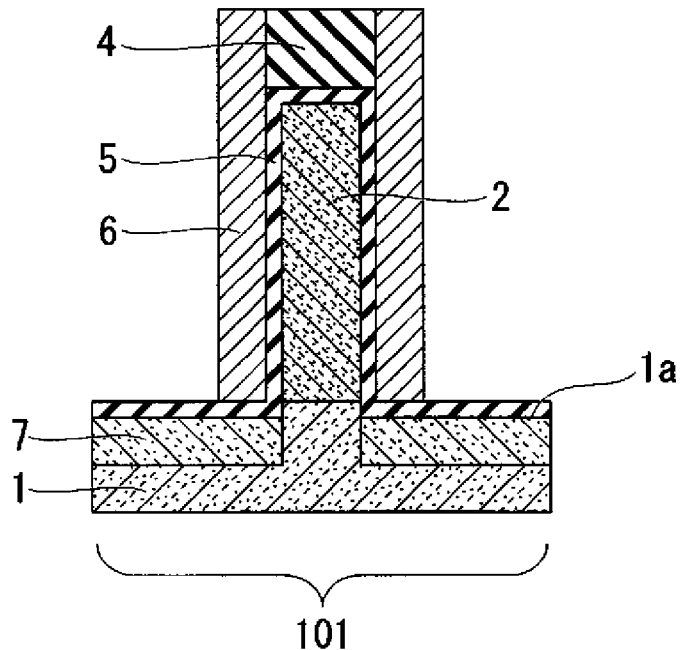
FIG. 8A is a fragmentary cross sectional elevation view illustrating a step, subsequent to the step of FIG. 7A, involved in a method of forming the semiconductor device of FIGS. 1, 2A and 2B, taken along a C-C' line of FIG. 1.
Figure 8B:
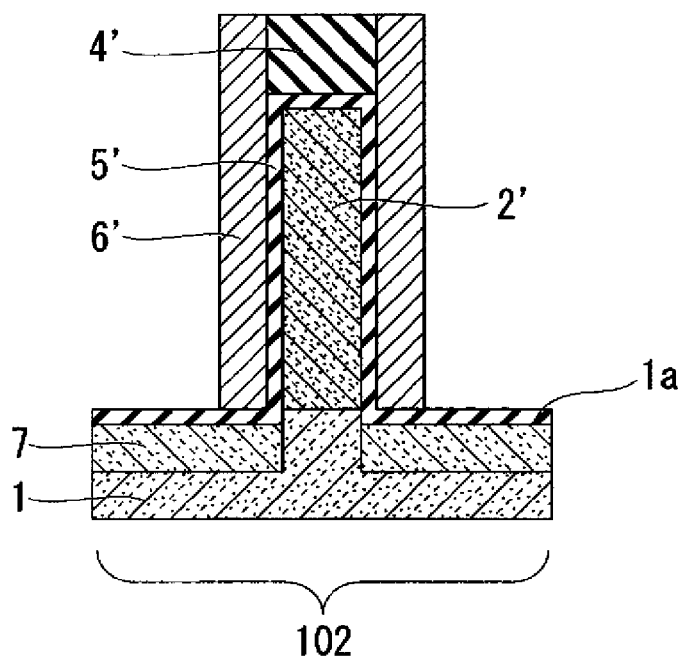
FIG. 8B is a fragmentary cross sectional elevation view illustrating a step, subsequent to the step of FIG. 7B, involved in a method of forming the semiconductor device of FIGS. 1, 2A and 2B, taken along a D-D' line of FIG. 1.

Arsenic (As) is introduced at a concentration of $1 \times E^{15}/cm^2$ with 10 KeV so as to form the lower diffusion region 7 at one surface 1a side of the substrate 1 as the base end side of the silicon pillars 2 and 2', as shown in FIGS. 8A and 8B.

Figure 9A:
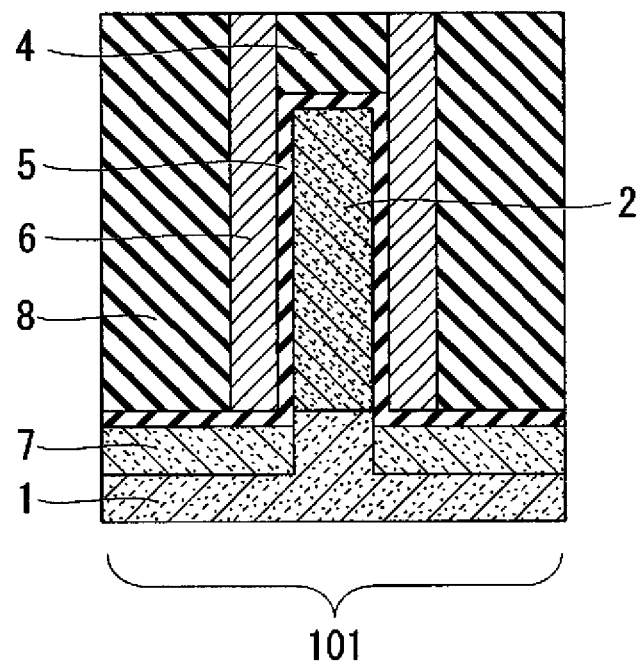
FIG. 9A is a fragmentary cross sectional elevation view illustrating a step, subsequent to the step of FIG. 8A, involved in a method of forming the semiconductor device of FIGS. 1, 2A and 2B, taken along a C-C' line of FIG. 1.
Figure 9B:
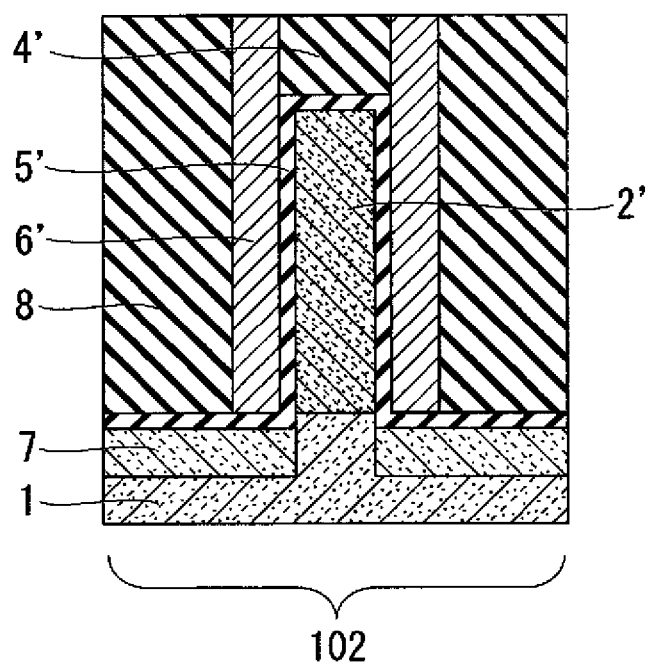
FIG. 9B is a fragmentary cross sectional elevation view illustrating a step, subsequent to the step of FIG. 8B, involved in a method of forming the semiconductor device of FIGS. 1, 2A and 2B, taken along a D-D' line of FIG. 1.

The first interlayer insulating film 8 is deposited so as to cover the silicon pillar 2 and 2' and one surface 1a side of the substrate 1. Thereafter, using a Chemical Mechanical Polishing (CMP) method, as shown in FIGS. 9A and 9B, the interlayer insulating film 8 is planarized until the nitride films 4 and 4' are exposed.

Figure 10A:
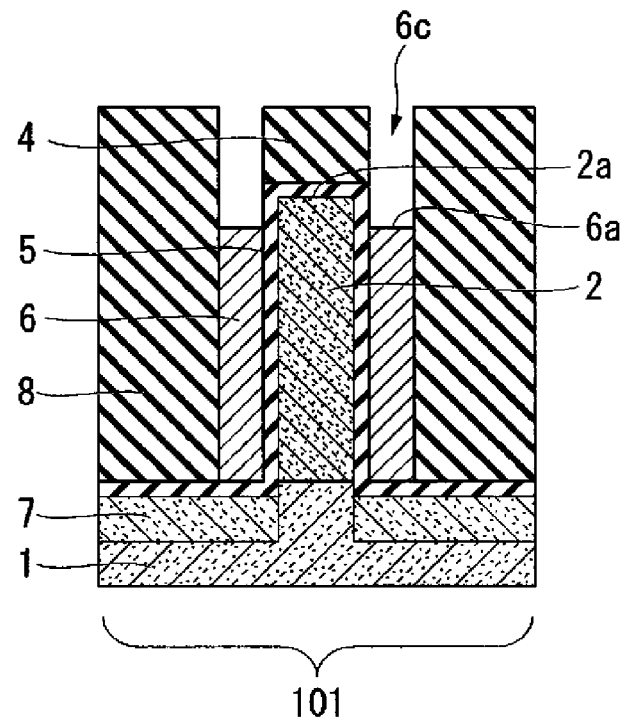
FIG. 10A is a fragmentary cross sectional elevation view illustrating a step, subsequent to the step of FIG. 9A, involved in a method of forming the semiconductor device of FIGS. 1, 2A and 2B, taken along a C-C' line of FIG. 1.
Figure 10B:
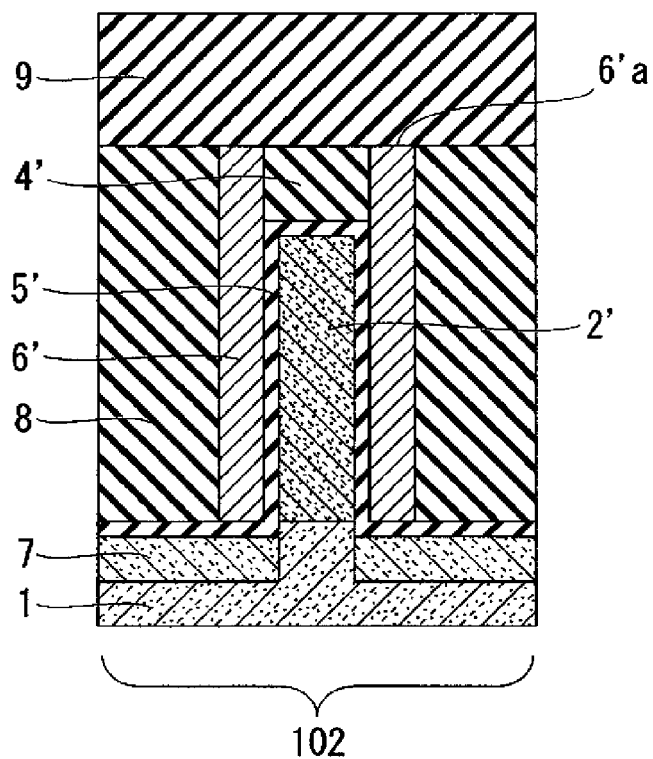
FIG. 10B is a fragmentary cross sectional elevation view illustrating a step, subsequent to the step of FIG. 9B, involved in a method of forming the semiconductor device of FIGS. 1, 2A and 2B, taken along a D-D' line of FIG. 1.

As shown in FIGS. 10A and 10B, a mask (resist mask) 9 for opening the vertical Tr portion 101 and covering the gate contact portion 102 is formed by a lithography method. In addition, the mask 9 is not limited to the resist mask using a resist material and a hard mask obtained by processing a metal material by a resist mask may be used.

The gate electrode 6 of the vertical Tr portion 101 is etched using the mask 9 and a concave portion 6c is formed in the front end side of the gate electrode 6 of the vertical Tr portion 101, as shown in FIGS. 10A and 10B. The etching may be dry etching or wet etching.

In addition, the etching depth is determined such that the position of the front end portion 6a of the gate electrode 6 is closer to the substrate than the position of the front end 2a of the silicon pillar 2.

The etching condition of the gate electrode 6 is preferably determined such that the etching amount of the material of the gate electrode 6 is larger than the etching amount of the material of the mask 9. Therefore, even when the gate electrode 6 is etched by only a predetermined amount, it is possible to reduce the etching amount of the mask 9 and to prevent the gate contact electrode 6' of the gate contact portion 102 from being etched.

In addition, if polysilicon is used as the gate electrode 6, a solution containing HF may be used when polysilicon is wet-etched.

In addition, if polysilicon is used as the gate electrode 6, HBr, HCl, Cl2, Br2, and HI or some of them may be used when polysilicon is dry-etched.

If tungsten is used as the gate electrode 6, SF6, Cl2, CO, O2, and N2 or some of them may be used, or Cl2, BCl3, H2, and HCl or some of them may be used when tungsten is dry-etched.

In addition, if a metal material is used as the gate electrode 6, a solution containing HF, HNO3 and H3PO4 may be used when the metal material is wet-etched.

The mask 9 is removed using a known method.

Figure 11A:
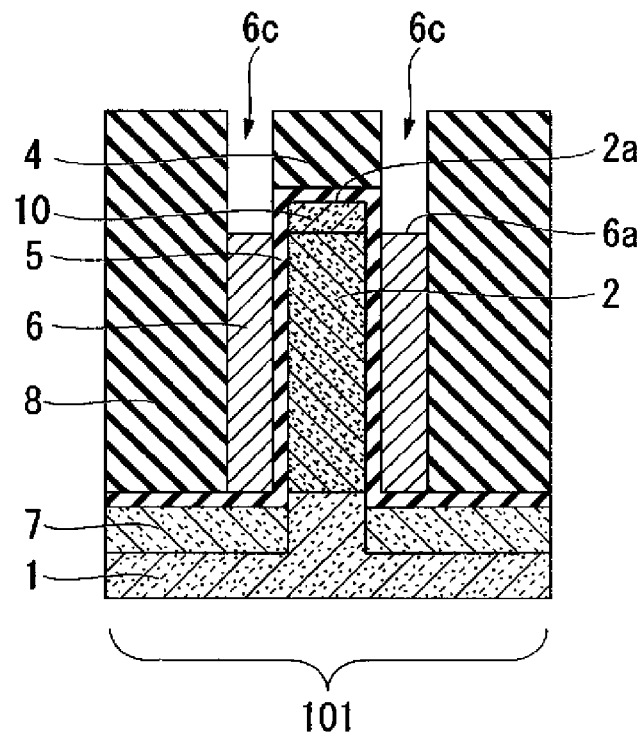
FIG. 11A is a fragmentary cross sectional elevation view illustrating a step, subsequent to the step of FIG. 10A, involved in a method of forming the semiconductor device of FIGS. 1, 2A and 2B, taken along a C-C' line of FIG. 1.
Figure 11B:
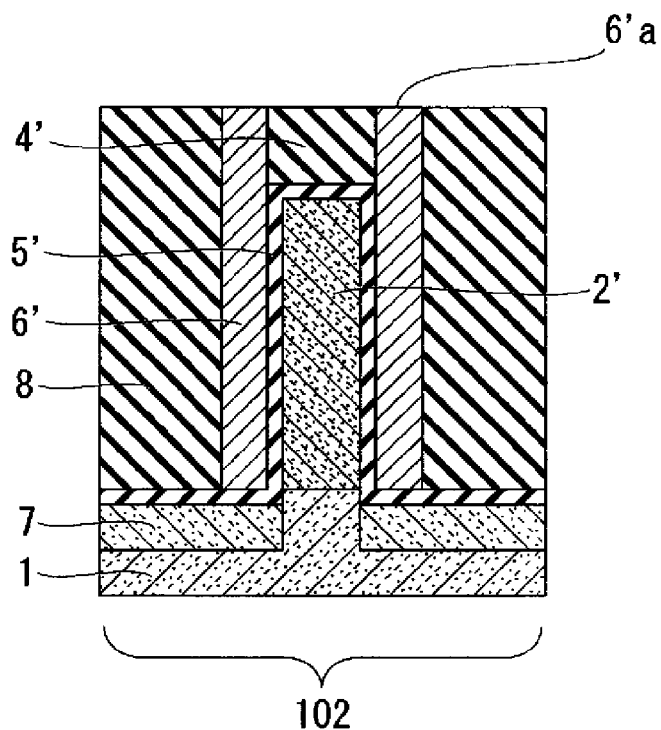
FIG. 11B is a fragmentary cross sectional elevation view illustrating a step, subsequent to the step of FIG. 10B, involved in a method of forming the semiconductor device of FIGS. 1, 2A and 2B, taken along a D-D' line of FIG. 1.

Using plasma doping, arsenic (As) is introduced at a concentration of $1 \times E^{15}/cm^2$ with 10 KeV so as to form the upper diffusion region 10 in the front end 2a of the silicon pillar 2 of the vertical Tr portion 101, as shown in FIGS. 11A and 11B.

The plasma doping is different from ion implantation in that the plasma doping is more isotropic than ion implantation, so as to allow ions to be implanted in different directions from in an irradiation direction. Therefore, the arsenic (As) may be introduced into the front end of the silicon pillar 2 through the thin insulating film 5 on both sides of the front end of the silicon pillar 2.

The concave portion 6c of the front end side of the gate electrode 6 of the vertical Tr portion 101 is filled and an oxide film 35 is deposited so as to cover the interlayer insulating film 8. Thereafter, using a Chemical Mechanical 5 Polishing (CMP) method, the oxide film 35 is planarized until the nitride films 4 and 4' are exposed. Therefore, the oxide film 35 remains in only the concave portion 6c.

Figure 12A:
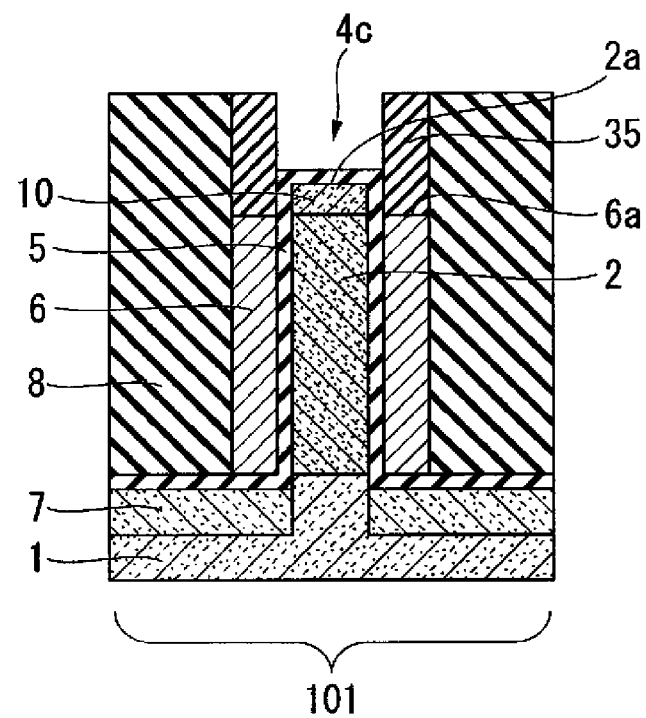
FIG. 12A is a fragmentary cross sectional elevation view illustrating a step, subsequent to the step of FIG. 11A, involved in a method of forming the semiconductor device of FIGS. 1, 2A and 2B, taken along a C-C' line of FIG. 1.
Figure 12B:
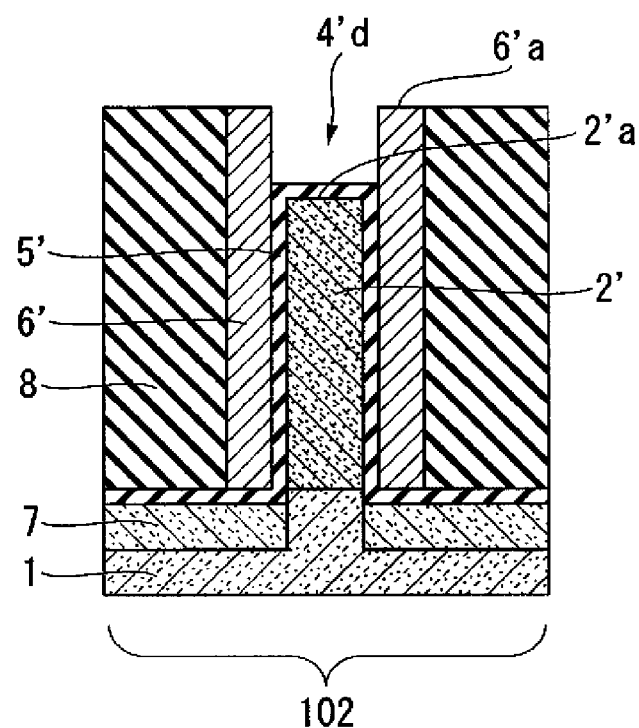
FIG. 12B is a fragmentary cross sectional elevation view illustrating a step, subsequent to the step of FIG. 11B, involved in a method of forming the semiconductor device of FIGS. 1, 2A and 2B, taken along a D-D' line of FIG. 1.

A wet etching is performed by hot phosphoric acid so as to remove the nitride films 4 and 4' as shown in FIGS. 12A and 12B. Therefore, concave portions 4c and 4'd are provided on the sides of the front ends 2a and 2'a of the silicon pillars 2 and 2'. A mask 9 for opening the vertical Tr portion 101 and covering the gate contact portion 102 is formed by a lithography method.

Figure 13A:
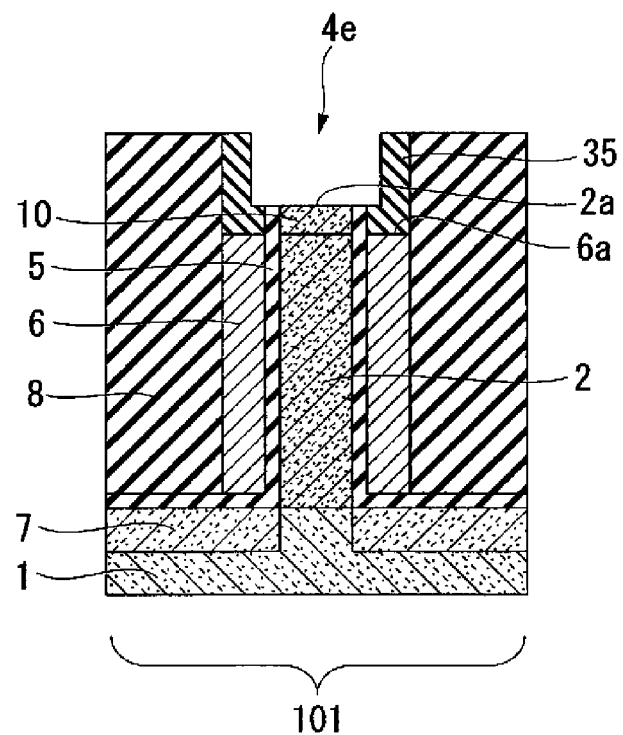
FIG. 13A is a fragmentary cross sectional elevation view illustrating a step, subsequent to the step of FIG. 12A, involved in a method of forming 5 the semiconductor device of FIGS. 1, 2A and 2B, taken along a C-C' line of FIG. 1.
Figure 13B:
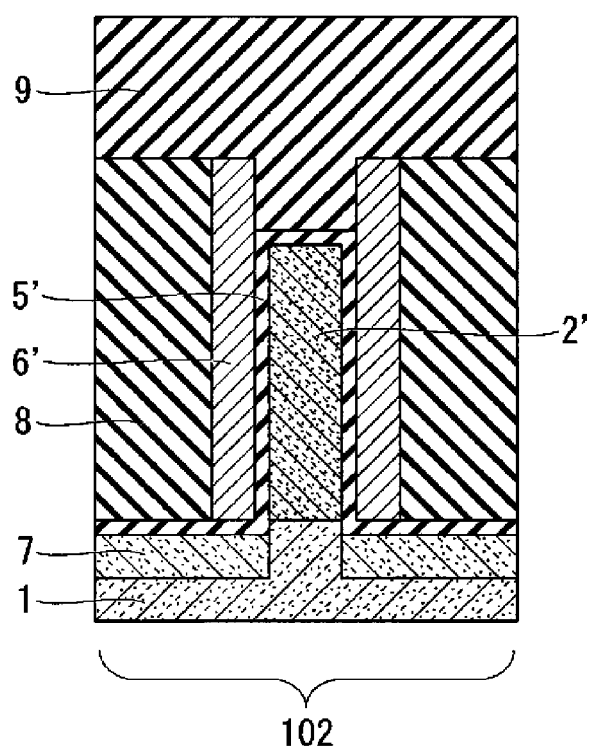
FIG. 13B is a fragmentary cross sectional elevation view illustrating a step, subsequent to the step of FIG. 12B, involved in a method of forming the semiconductor device of FIGS. 1, 2A and 2B, taken along a D-D' line of FIG. 1.

The oxide film is wet-etched using the mask 9 and, as shown in FIGS. 13A and 13B, the diameter of the concave portion 4c is enlarged so as to form a concave portion 4e.

At this time, the interlayer insulating film 8 of the vertical Tr portion 101 and the exposed portions of the oxide film 35 and the oxide film 5 are etched, but the interlayer insulating film 8 of the gate contact portion 102 is covered by the mask 9 and is not etched.

The mask 9 is removed using a known method.

Figure 14A:
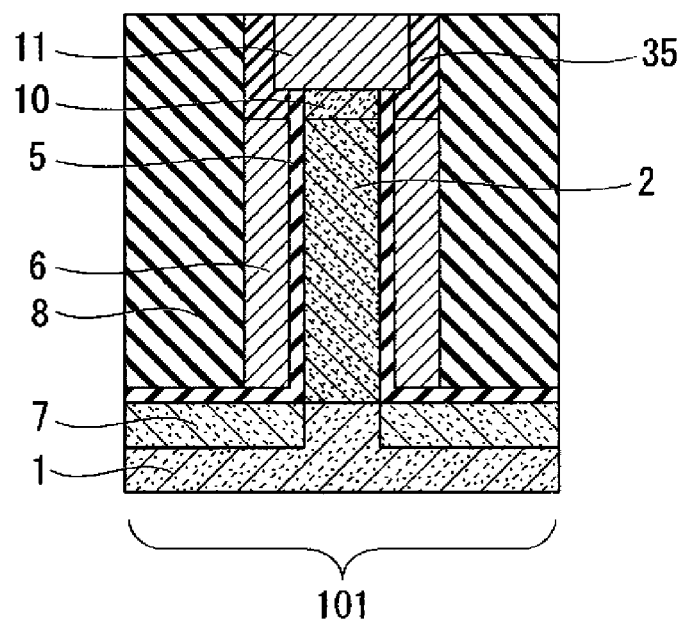
FIG. 14A is a fragmentary cross sectional elevation view illustrating a step, subsequent to the step of FIG. 13A, involved in a method of forming the semiconductor device of FIGS. 1, 2A and 2B, taken along a C-C' line of FIG. 1.
Figure 14B:
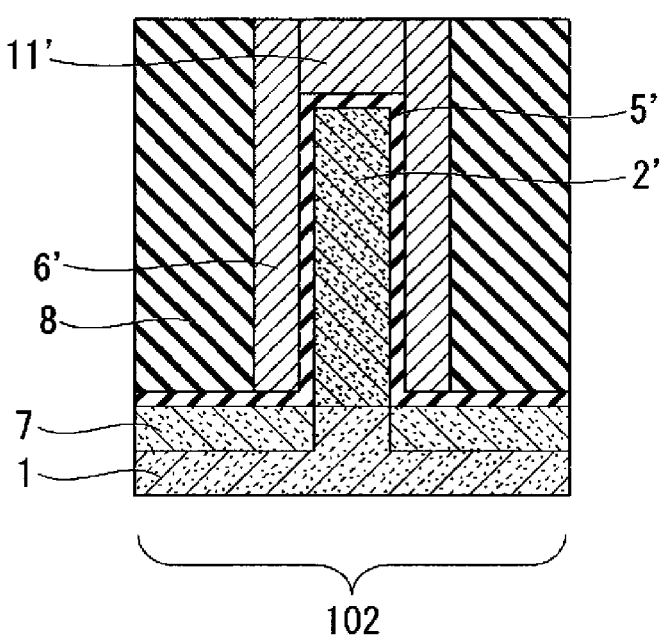
FIG. 14B is a fragmentary cross sectional elevation view illustrating a step, subsequent to the step of FIG. 13B, involved in a method of forming the semiconductor 15 device of FIGS. 1, 2A and 2B, taken along a D-D' line of FIG. 1.

Openings 4e and 4'd are filled using a known method and a contact plug material is deposited so as to cover the interlayer insulating film 8. Thereafter, the contact plug material is planarized using the CMP method until the interlayer insulating film 8 is exposed. Therefore, as shown in FIGS. 14A and 14B, the first contact plug 11 embedded into the concave portion 4e of the vertical Tr portion 101 and the fourth contact plug 11' embedded into the concave portion 4'd of the gate contact portion 102 are formed.

The second interlayer insulating film 12 is deposited using a known method so as to cover the first interlayer insulating film 8.

Finally, the second contact plug 13 and the third contact plug 14 are formed using a lithography method. In detail, first, after a resist is applied so as to cover the exposed surface of the interlayer insulating film 12, exposure is performed using a predetermined mask so as to form a mask (resist mask) formed of resist. The interlayer insulating film 12 is etched using the resist mask so as to form a contact hole. Next, a conductive material is embedded into the contact hole. Finally, the resist is removed.

By the above process, the semiconductor device 111 shown in FIG. 1 can be formed.

Since the semiconductor device 111 according to the embodiment includes the vertical Tr portion 101 including the first silicon pillar 2 erected on the substrate 1, the first insulating film 5 for covering the side surface of the first silicon pillar 2 and the gate electrode 6 which covers the first insulating film 5 and has the front end 6a disposed closer to the substrate 1 than the front end 2a of the first silicon pillar 2, and the gate contact portion 102 including the second silicon pillar 2' erected on the substrate 1, the second insulating film 5' for covering the surface of the second silicon pillar 2', and the gate contact electrode 6' which covers the second insulating film 5', has the front end 6' disposed so as to be spaced from the substrate 1 rather than the front end 2'a of the second silicon pillar 2', and is connected to the gate electrode 6, even when the diameter of the second contact plug 13 is larger than a design value and the embedded position thereof is deviated, a possibility that the second contact plug 13 abuts on the gate electrode 6 is reduced and thus a short circuit between the second contact plug 13 and the gate electrode 6 can be prevented.

Since the semiconductor device 111 according to the embodiment includes at least the third insulating film 35 laminated on the gate electrode 6 and the first contact plug 11 laminated on the first silicon pillar 2 and insulated from the gate electrode 6 by the third insulating film 35, a short circuit between the second contact plug 13 and the gate electrode 6 can be more reliably prevented. Since the semiconductor device 111 according to the embodiment has the configuration in which the interlayer insulating film 12 is formed on the first silicon pillar 2 and the second silicon pillar 2', the second contact plug 13 connected to the first contact plug 11 and the third contact plug 14 connected to the front end 6'a of the gate contact electrode 6' are formed in the interlayer insulating film 12, a short circuit between the second contact plug 13 and the gate electrode 6 and/or a short circuit between the third contact plug 14 and the second silicon pillar 2' can be prevented.

Since the semiconductor device 111 according to the embodiment has the configuration in which the concave portion 4d is provided on the second silicon pillar 2' by forming the front end 6'a of the gate contact electrode 6' so as to protrude from the front end 2a of the second silicon pillar 2, and the third contact plug 14 and the fourth contact plug 11' connected to the gate contact electrode 6' are formed in the concave portion 4d, the connection between the third contact plug 14 and the gate contact electrode 6' can be robustly supported, the flow of the current from the third contact plug 14 to the gate contact electrode 6' can become smooth, and a short circuit between the third contact plug 14 and the second silicon pillar 2' can be prevented.

Since the semiconductor device 111 according to the embodiment has the configuration in which the upper diffusion region 10 is formed on the front end side of the first silicon pillar 2 and the lower diffusion region 7 is formed in the substrate of the base end side, it is possible to obtain a vertical transistor capable of preventing a short circuit between the second contact plug 13 connected to the silicon pillar 2 and the gate electrode 6 and/or the contact plug connected to the gate contact electrode 6' and the second silicon pillar 2'.

Since the method of manufacturing the semiconductor device 111 according to the embodiment includes steps of forming the first silicon pillar 2 and the second silicon pillar 2' on the substrate 1, forming the insulating film 5 so as to cover the silicon pillars 2 and 2', forming the gate electrode 6 for covering the side surface of the first silicon pillar 2 and the gate contact electrode 6' for covering the side surface of the second silicon pillar 2' so as to be connected to each other, forming the lower diffusion region 7 in the substrate 1 of the base end side of the silicon pillars 2 and 2', forming the first interlayer insulating film 8 so as to cover the silicon pillars 2 and 2', etching back the front end 6a of the gate electrode 6 so as to be located closer to the substrate 1 than the front end 2a of the first silicon pillar 2, and forming the upper diffusion region 10 in the front end 2a of the first silicon pillar 2, even when the diameter of the second contact plug 13 is larger than a design value and the embedded position thereof is deviated, a possibility that the second contact plug 13 abuts on the gate electrode 6 is reduced and thus the semiconductor device 111 capable of preventing a short circuit between the second contact plug 13 and the gate electrode 6 can be manufactured.

Since the method of manufacturing the semiconductor device 111 according to the embodiment includes steps of laminating the third insulating film 35 on the gate electrode 6 after forming the upper diffusion region 10 in the front end 2a of the first silicon pillar 2 and laminating the first contact plug 11 insulated from the gate electrode 6 by the third insulating film 35 on the first silicon pillar 2, the semiconductor device 111 capable of more reliably preventing a short circuit between the second contact plug 13 and the gate electrode 6 can be manufactured.

Since the method of manufacturing the semiconductor device 111 according to the embodiment includes steps of forming the second interlayer insulating film 12 so as to cover the first interlayer insulating film 8 after laminating the first contact plug 11 and forming the second contact plug 13 connected to the first contact plug 11 and the third contact plug 14 connected to the gate contact electrode 6' in the second interlayer insulating film 12, the semiconductor device capable of preventing a short circuit between the second contact plug 13 connected to the first silicon pillar 2 and the gate electrode 6 and/or a short circuit between the third contact plug 14 and the silicon pillar 2' can be manufactured.

Second Embodiment

FIGS. 15A and 15B is a view illustrating another example of the semiconductor device according to the embodiment. FIG. 15A is a cross-sectional view of a vertical Tr portion. FIG. 15B is a cross-sectional view of a gate contact portion.

As shown in FIGS. 15A and 15B, the semiconductor device 112 according to the embodiment has the same configuration as the first Embodiment except that a fourth insulating film 4' is used at the side of the front end 2'a of the silicon pillar 2' of the gate contact portion 102 instead of the fourth contact plug 11'. The same members as the members of the first embodiment are denoted by the same reference numerals.

As shown in FIG. 15B, the gate electrode 6 of the gate contact portion 102 is substantially formed in a cylindrical shape and a front end 6'a of the gate contact electrode 6' is formed so as to protrude from the front end 2'a of the second silicon pillar 2', and the fourth insulating film 4' formed of a nitride film is formed in the concave portion 4'd provided on the second silicon pillar 2'.

The fourth insulating film 4' is not limited to the nitride film if it is an insulating material.

The front end 6'a of the gate contact electrode 6' of the gate contact portion 102 is disposed so as to be spaced from the substrate 1 rather than the front end 2'a of the second 5 silicon pillar 2'.

Therefore, even when the diameter of the third contact plug 14 is larger than a design value and the embedded position thereof is deviated, a possibility that the third contact plug 14 breaks the insulating film 5' and abuts on the second silicon pillar 2' is reduced, that is, damage to the insulating film 5' is avoided, and thus a short circuit between the third contact plug 14 and the second silicon pillar 2' can be prevented.

On the front end side of the second silicon pillar 2', the fourth insulating film 4' is formed so as to support the third contact plug 14 and the gate contact electrode 6'. Therefore, the robustness of the semiconductor device 112 can be increased.

By the fourth insulating film 4', the third contact plug 14 and the second silicon pillar 2 are more reliably insulated and a short circuit between the third contact plug 14 and the second silicon pillar 2 can be more reliably prevented.

Next, an example of the method of manufacturing the semiconductor device according to the embodiment of the present invention will be described.

FIGS. 16A to 18B are cross-sectional views illustrating the example of the method of manufacturing the semiconductor device 112 according to the embodiment.

The steps up to FIGS. 11A and 11B are performed similar to the method of manufacturing the semiconductor device according to the first embodiment.

A concave portion 6c is filled and the oxide film 35 is deposited by 50 nm so as to cover the first interlayer insulating film 8.

A mask (resist mask) for opening the vertical Tr portion 101 and covering the gate contact portion 102 is formed by a lithography method. In addition, the mask is not limited to the resist mask using a resist material and a hard mask obtained by processing a metal material by a resist mask may be used.

The oxide film 35 is dry-etched using the mask until the nitride films 4 and 4' of the vertical Tr portion 101 are exposed.

Figure 16A:
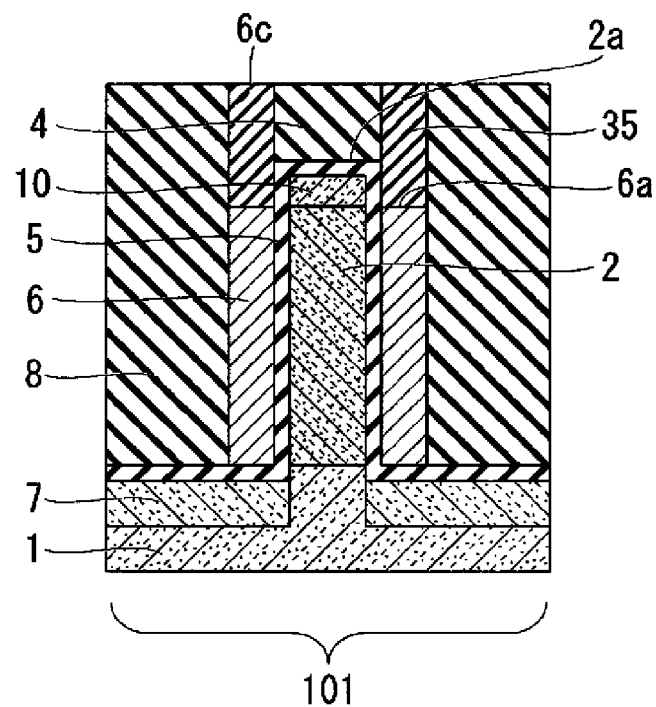
FIG. 16A is a fragmentary cross sectional elevation view illustrating a step involved in a method of forming the semiconductor device of FIGS. 1, 15A and 15B, taken along a C-C' line of FIG. 1.
Figure 16B:
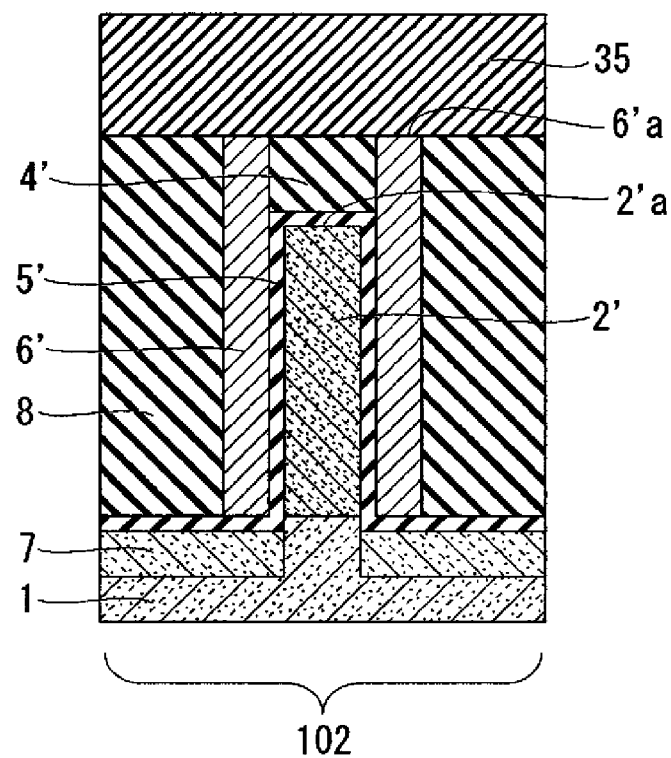
FIG. 16B is a fragmentary cross sectional elevation view illustrating a step involved in a method of forming the semiconductor device of FIGS. 1, 15A and 15B, taken along a D-D' line of FIG. 1.

The mask is peeled. As shown in FIGS. 16A and 16B, the oxide film 35 remains so as to fill the concave portion 6c of the vertical Tr portion 101 and the oxide film 35 remains so as to cover the first interlayer insulating film 8 in the gate contact portion 102.

The nitride film 4 of the vertical Tr portion 101 is wet-etched by hot phosphoric acid so as to be removed. Since the oxide film 35 remains so as to cover the first interlayer insulating film 8 in the gate contact portion 102, the nitride film 4' is not etched and removed.

The oxide film is wet-etched and the first interlayer insulating film 8 and the exposed portions of the oxide film 35 and the oxide film 5 are etched. The etching depth is, for example, 10 nm.

Figure 17A:
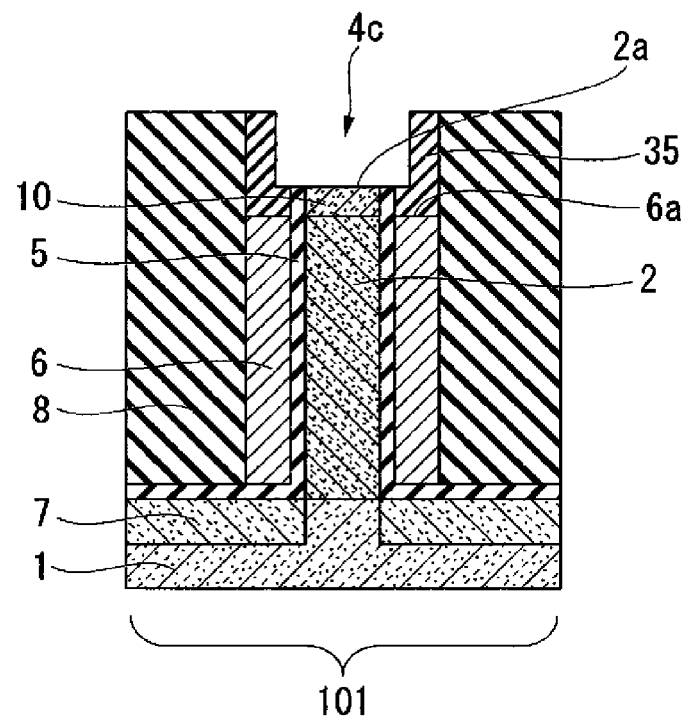
FIG. 17A is a fragmentary cross sectional elevation view illustrating a step, subsequent to the step of FIG. 16A, involved in a method of forming the semiconductor device of FIGS. 1, 15A and 15B, taken along a C-C' line of FIG. 1.
Figure 17B:
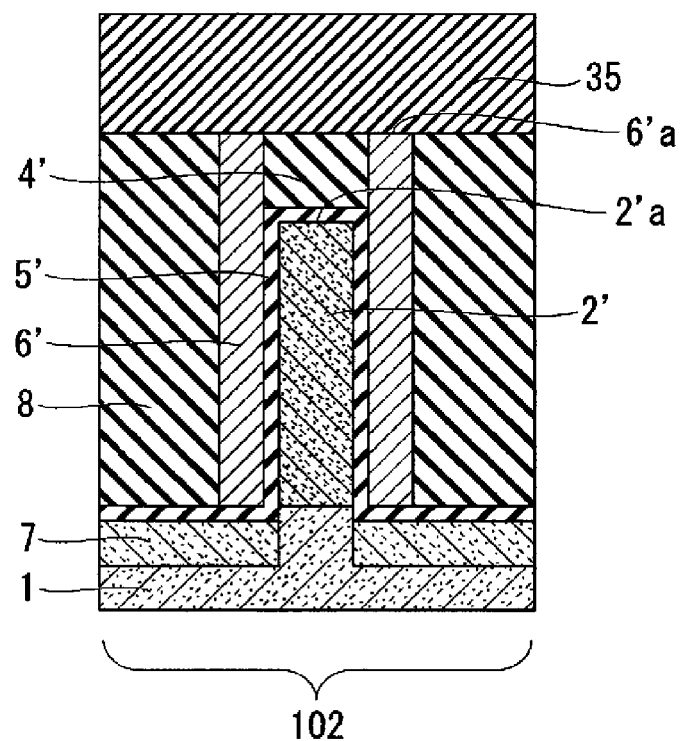
FIG. 17B is a fragmentary cross sectional elevation view illustrating a step, subsequent to the step of FIG. 16B, involved in a method of forming the semiconductor device of FIGS. 1, 15A and 15B, taken along a D-D' line of FIG. 1.

Therefore, as shown in FIGS. 17A and 17B, a concave portion 4c is formed at the side of the front end 2a of the silicon pillar 2 of the vertical Tr portion 101.

Figure 18A:
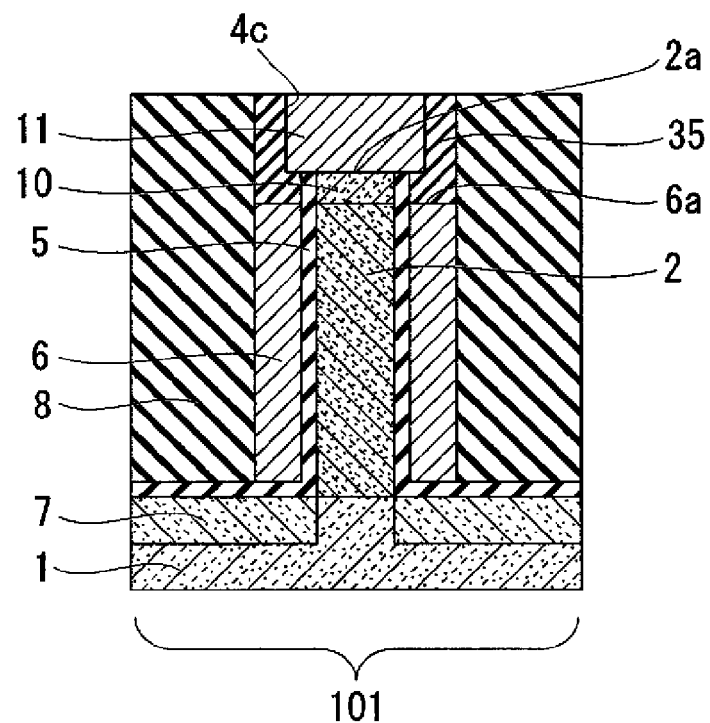
FIG. 18A is a fragmentary cross sectional elevation view illustrating a step, subsequent to the step of FIG. 17A, involved in a method of forming the semiconductor device of FIGS. 1, 15A and 15B, taken along a C-C' line of FIG. 1.
Figure 18B:
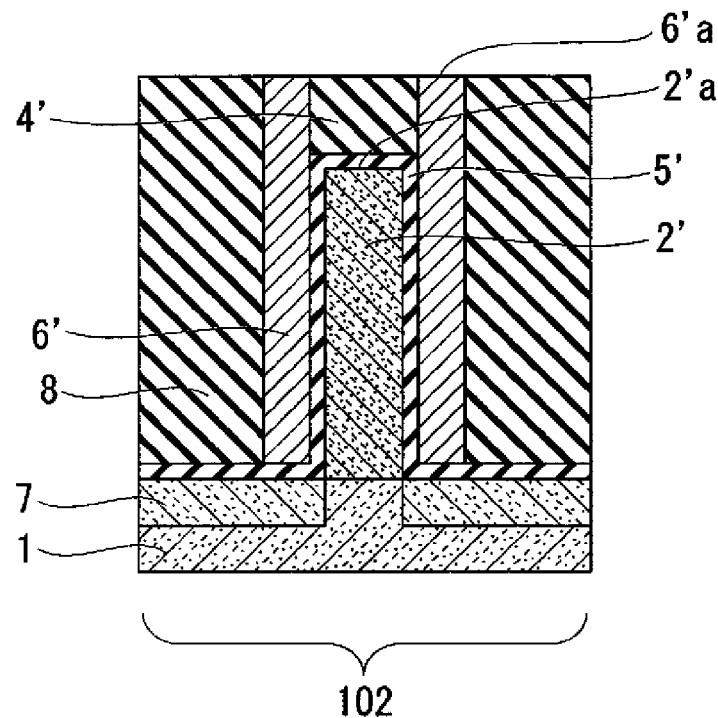
FIG. 18B is a fragmentary cross sectional elevation view illustrating a step, subsequent to the step of FIG. 17B, involved in a method of forming the semiconductor device of FIGS. 1, 15A and 15B, taken along a D-D' line of FIG. 1.

Next, using a known method, the concave portion 4c is filled and a contact plug material is deposited so as to cover the first interlayer insulating film 8 and the oxide film 35. Thereafter, CMP is performed until the gate contact electrode 6' of the gate contact portion 102 is exposed so as to form the first contact plug 11 connected to the first silicon pillar 2 as shown in FIGS. 18A and 18B. In addition, the CMP is preferably performed such that over-etching is performed by performing etching even after the gate contact electrode 6' of the gate contact portion 102 is exposed.

Using a known method, the second interlayer insulating film 12 is deposited so as to cover the first interlayer insulating film 8.

Using a lithograph method, the second contact plug 13 and the third contact plug 14 are formed. In detail, first, after a resist is applied so as to cover the exposed surface of the interlayer insulating film 12, exposure is performed using a predetermined mask so as to form a mask (resist mask) formed of resist. Using the resist mask, the interlayer insulating film 12 is etched so as to form a contact hole. Next, a conductive material is embedded into the contact hole. Finally, the resist is peeled.

By the above process, the semiconductor device 112 shown in FIG. 15 can be formed.

Since the semiconductor device 112 according to the embodiment includes the configuration in which the front end 6'a of the gate contact electrode 6' is formed so as to protrude from the front end 2'a of the second silicon pillar 2' so as to form concave portion 4'd on the second silicon pillar 2' and the fourth insulating film 4' is formed in the concave portion 4'd, the fourth insulating film 4' supports the third contact plug 14 and the gate contact electrode 6' at the side of the front end 2'a of the second silicon pillar 2' such that the semiconductor device 112 can be made to be robust.

By the above configuration, by the fourth insulating film 4', the third contact plug 14 and the second silicon pillar 2 are more reliably insulated and a short circuit between the third contact plug 14 and the second silicon pillar 2 can be more reliably prevented.

Third Embodiment

Figure 19A:
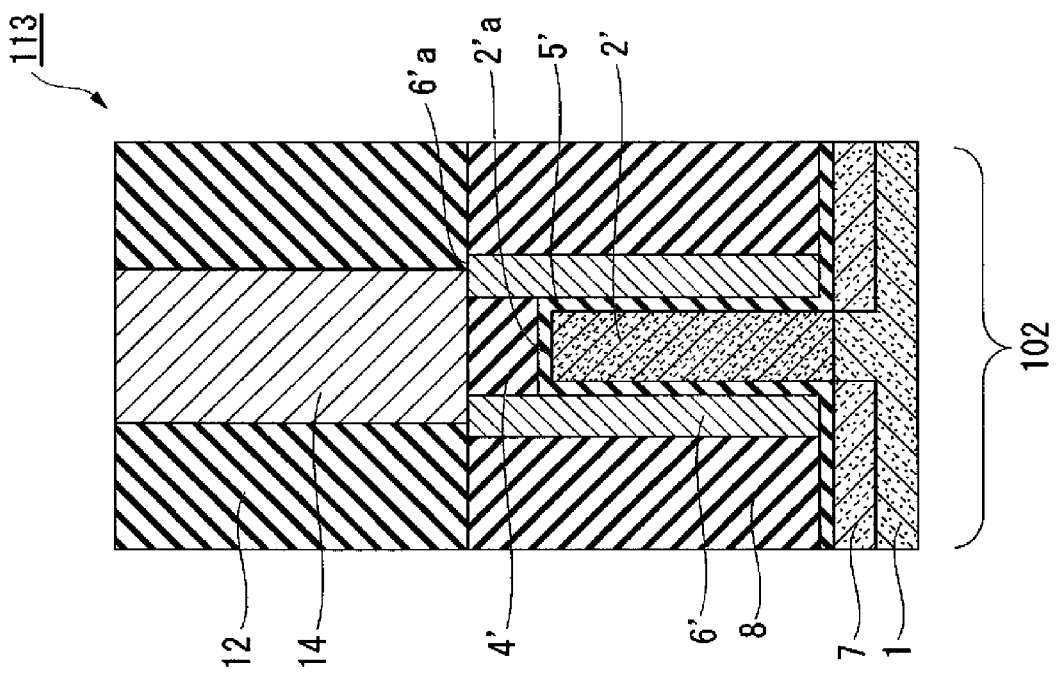
FIG. 19A is a fragmentary cross sectional elevation view illustrating the semiconductor device, taken along a C-C' line of FIG. 1 in accordance with a third preferred embodiment of the present invention.
Figure 19B:
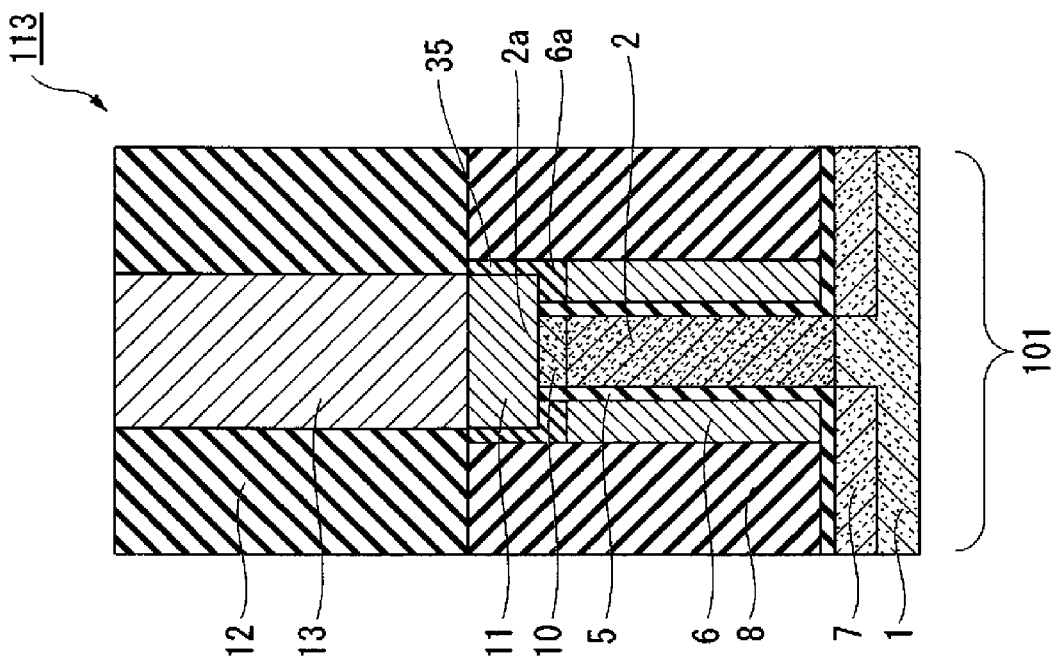
FIG. 19B is a fragmentary cross sectional elevation view illustrating the semiconductor device, taken along a D-D' line of FIG. 1 in accordance with the third preferred embodiment of the present invention.

FIGS. 19A and 19B is a view illustrating another example of the semiconductor device according to the embodiment. FIG. 19A is a cross-sectional view of a vertical Tr portion. FIG. 19B is a cross-sectional view of a gate contact portion.

As shown in FIGS. 19A and 19B, the semiconductor device 113 according to the embodiment of the present invention has the same configuration as the second Embodiment except that the diameter of the first contact plug 11 of the front end 2a side of the silicon pillar 2 of the vertical Tr portion 101 is enlarged. The same members as the members of the first embodiment are denoted by the same reference numerals.

The first contact plug 11 is formed on the front end 2a of the first silicon pillar 2. The second contact plug 13 abuts on the front end 2a of the silicon pillar 2 with the first contact plug 11 interposed between them. Therefore, a predetermined voltage can be applied to the upper diffusion region 10 of the silicon pillar 2.

In the present embodiment, since the diameter of the first contact plug 11 is larger than that shown in the first embodiment or the second embodiment, the second contact plug 13 and the first silicon pillar 2 can be robustly connected and a voltage can be more stably applied from the second contact plug 13 to the first silicon pillar 2.

As shown in FIG. 19A, the front end 6a of the gate electrode 6 of the vertical Tr portion 101 is disposed closer to the substrate than the front end 2a of the silicon pillar 2. Therefore, even when the diameter of the contact plug 13 is larger than a design value and the embedded position thereof is deviated, a possibility that the second contact plug 13 abuts on the gate electrode 6 is reduced and thus a short circuit between the second contact plug 13 and the gate electrode 6 can be prevented.

The third insulating film 35 is formed on the front end 6a of the gate electrode 6. Therefore, since the first contact plug 11 is insulated from the gate electrode 6, a possibility that the second contact plug 13 formed on the first contact plug 11 abuts on the gate electrode 6 is reduced and thus a short circuit between the contact plug 13 and the gate electrode 6 can be prevented.

Next, an example of the method of manufacturing the semiconductor device according to the embodiment of the present invention will be described.

FIGS. 20A to 23B are cross-sectional views illustrating the example of the method of manufacturing the semiconductor device 113 according to the embodiment of the present invention.

The steps up to FIGS. 10A and 10B are performed similarly to the method of manufacturing the semiconductor device according to the first embodiment.

The nitride film 4 of the vertical Tr portion 101 is dry-etched and removed. Therefore, a concave portion 37 is formed at the side of the front end 2a of the silicon pillar 2 of the vertical Tr portion 101.

Figure 20A:
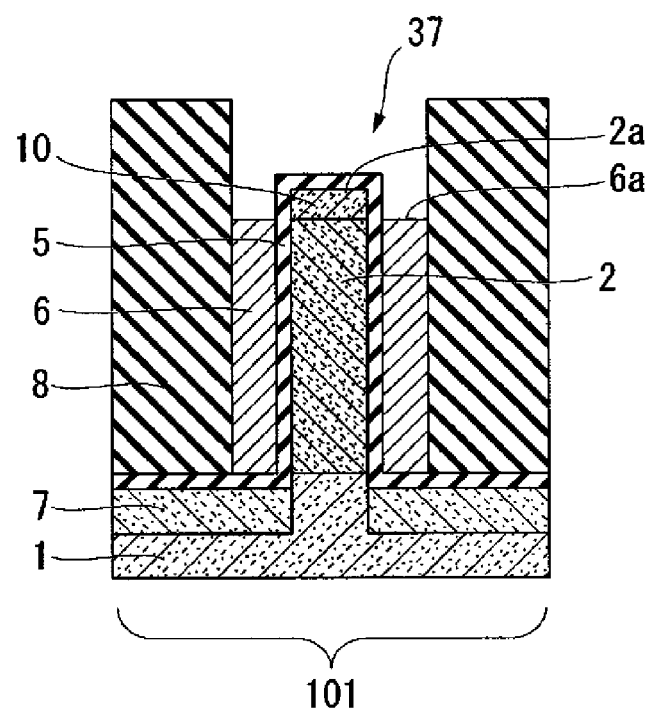
FIG. 20A is a fragmentary cross sectional elevation view illustrating a step involved in a method of forming the semiconductor device of FIGS. 1, 19A and 19B, taken along a C-C' line of FIG. 1.
Figure 20B:
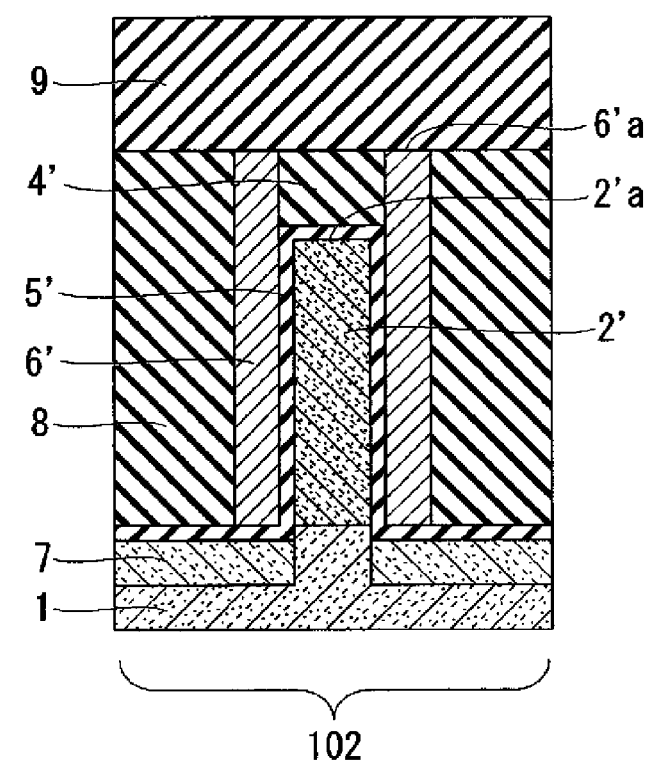
FIG. 20B is a fragmentary cross sectional elevation view illustrating a step involved in a method of forming the semiconductor device of FIGS. 1, 19A and 19B, taken along a D-D' line of FIG. 1.

Arsenic (As) is introduced at a concentration of $1 \times E^{15}/cm^2$ with 10 KeV so as to form the upper diffusion region 10 in the front end 2a of the silicon pillar 2 of the vertical Tr portion 101, as shown in FIGS. 20A and 20B.

Using a known method, the mask 9 is peeled.

Using a CVD method, the inner surface of the concave portion 37 is covered and the oxide film 35 is deposited so as to cover the interlayer insulating film 8. The film thickness of the oxide film 35 is, for example, 20 nm.

Figure 21A:
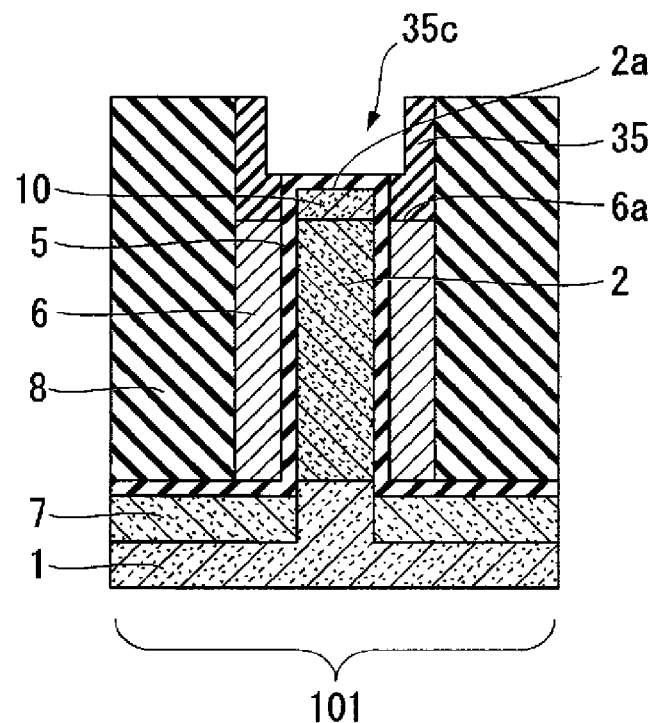
FIG. 21A is a fragmentary cross sectional elevation view illustrating a step, subsequent to the step of FIG. 20A, involved in a method of forming the semiconductor device of FIGS. 1, 19A and 19B, taken along a C-C' line of FIG. 1.
Figure 21B:
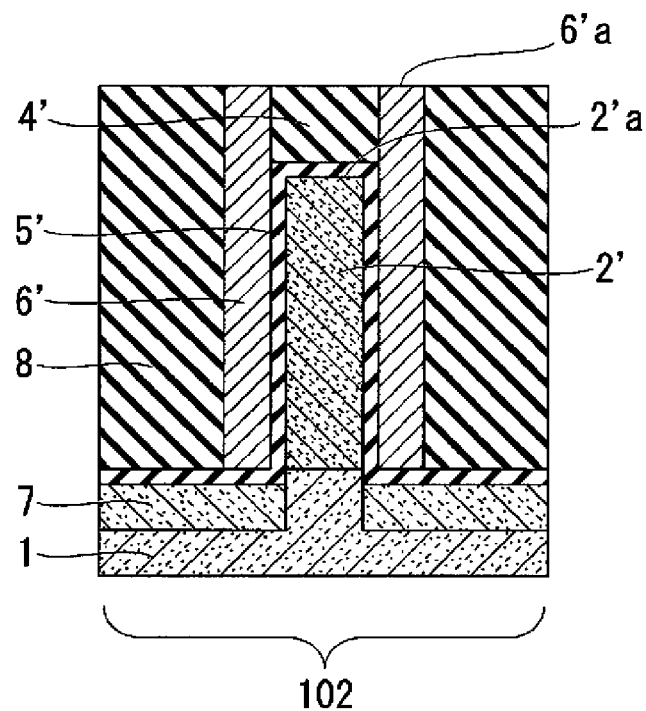
FIG. 21B is a fragmentary cross sectional elevation view illustrating a step, subsequent to the step of FIG. 20B, involved in a method of forming the semiconductor device of FIGS. 1, 19A and 19B, taken along a D-D' line of FIG. 1.

The etch-back of the oxide film is performed. The etch-back depth of the oxide film is, for example, 20 nm. Therefore, as shown in FIGS. 21A and 21B, a concave portion 35c is formed.

Figure 22A:
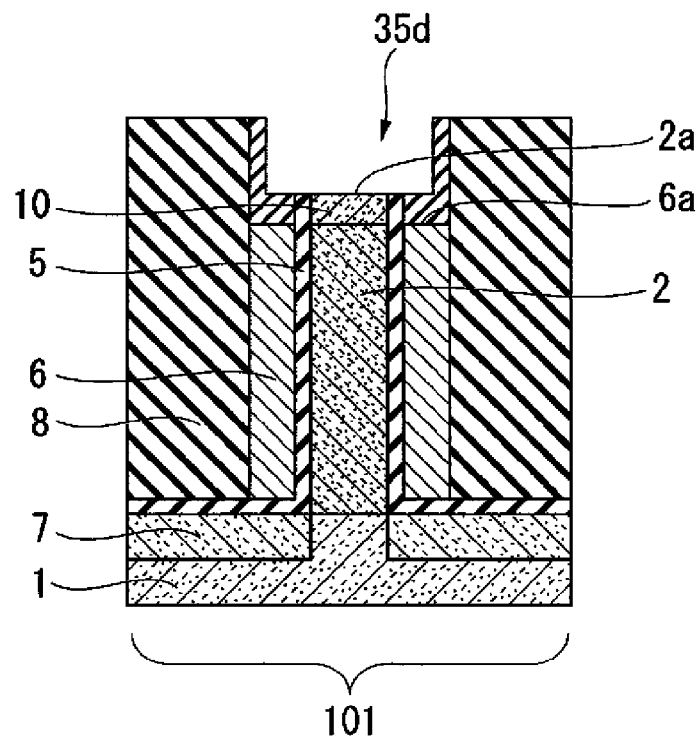
FIG. 22A is a fragmentary cross sectional elevation view illustrating a step, subsequent to the step of FIG. 21A, involved in a method of forming the semiconductor 10 device of FIGS. 1, 19A and 19B, taken along a C-C' line of FIG. 1.
Figure 22B:
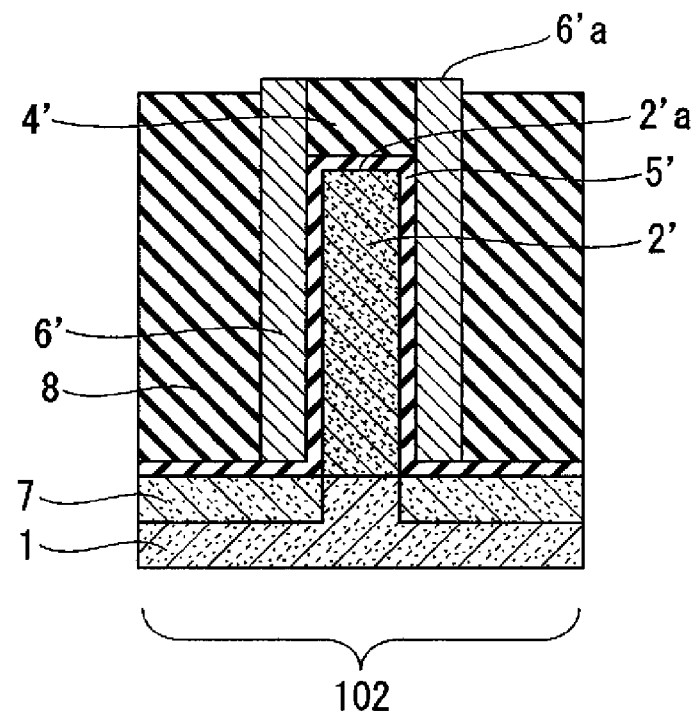
FIG. 22B is a fragmentary cross sectional elevation view illustrating a step, subsequent to the step of FIG. 21B, involved in a method of forming the semiconductor device of FIGS. 1, 19A and 19B, taken along a D-D' line of FIG. 1.

As shown in FIG. 22, the wet etching of the oxide film is performed until the front end 2a of the first silicon pillar 2 of the vertical Tr portion 101 is exposed. At this time, the interlayer insulating film 8, the oxide film 5 and the oxide film 35 are wet-etched. The wet etching depth of the oxide film is, for example, 5 nm. Therefore, the diameter of the concave portion 35c is enlarged so as to obtain the concave portion 35d.

In the gate contact portion 102, the interlayer insulating film 8 is wet-etched and the gate contact electrode 6' and the nitride film 4' slightly protrude therefrom.

The concave portion 35d is filled using a known method and a contact plug material is deposited so as to cover the interlayer insulating film 8.

Figure 23A:
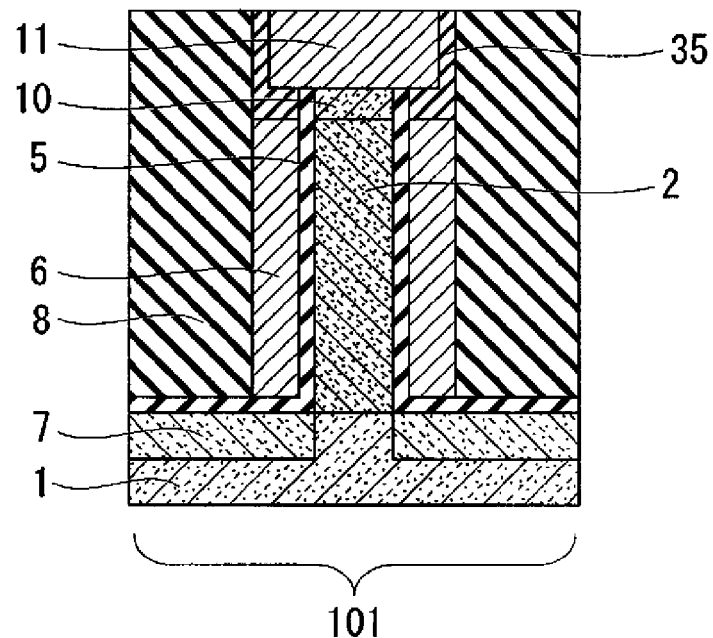
FIG. 23A is a fragmentary cross sectional elevation view illustrating a step, subsequent to the step of FIG. 22A, involved in a method of forming the semiconductor device of FIGS. 1, 19A and 19B, taken along a C-C' line of FIG. 1.
Figure 23B:
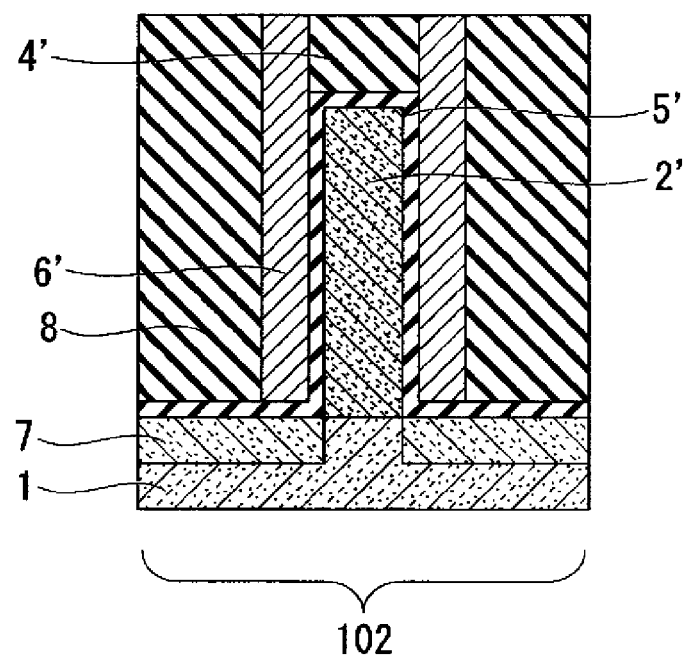
FIG. 23B is a fragmentary cross sectional elevation view illustrating a step, subsequent to the step of FIG. 22B, involved in a method of forming the semiconductor device of FIGS. 1, 19A and 19B, taken along a D-D' line of FIG. 1.

Planarization is performed using the CMP method until the interlayer insulating film 8 is exposed. Therefore, the first contact plug 11 shown in FIG. 23 is formed.

The interlayer insulating film 12 is deposited using a known method so as to cover the interlayer insulating film 8.

The second contact plug 13 and the third contact plug 14 are formed using a lithography method. In detail, first, after a resist is applied so as to cover the exposed surface of the interlayer insulating film 12, exposure is performed using a predetermined mask so as to form a mask (resist mask) formed of resist. The interlayer insulating film 12 is etched using the resist mask so as to form a contact hole. Next, a conductive material is embedded into the contact hole. Finally, the resist is peeled.

By the above process, the semiconductor device 113 shown in FIGS. 15A and 15B can be formed.

Fourth Embodiment

Figures 24A, 24B:
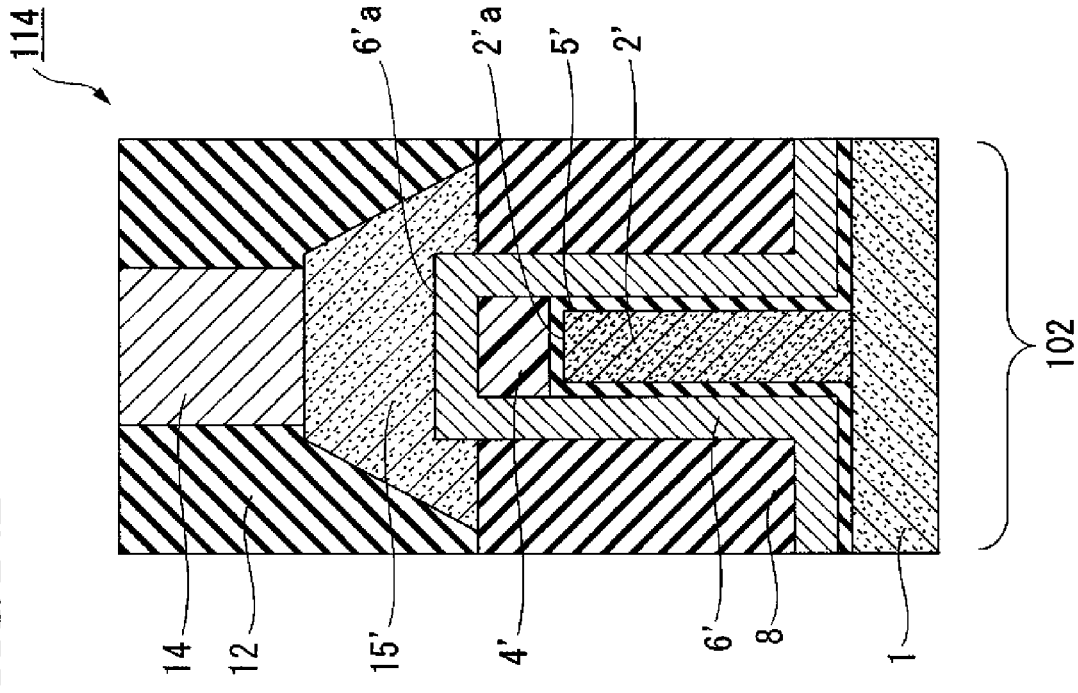
FIG. 24A is a fragmentary cross sectional elevation view illustrating the semiconductor device, taken along a C-C' line of FIG. 1 in accordance with a fourth preferred embodiment of the present invention.
FIG. 24B is a fragmentary cross sectional elevation view illustrating the semiconductor device, taken along a D-D' line of FIG. 1 in accordance with the fourth preferred embodiment of the present invention.

FIGS. 24A and 24B are a view illustrating another example of the semiconductor device according to the embodiment of the present invention. FIG. 24A is a cross-sectional view of a vertical Tr portion. FIG. 24B is a cross-sectional view of a gate contact portion.

As shown in FIGS. 24A and 24B, the semiconductor device 114 according to the embodiment of the present invention has the same configuration as the second embodiment except that an epitaxial growth film 15 is formed at the side of the front end 2a of the first silicon pillar 2 of the vertical Tr portion 101 instead of the first contact plug 11, the gate contact electrode 6' is formed so as to cover the front end 2'a side of the second silicon pillar 2' of the gate contact portion 102 and the insulating film 5 on the substrate 1 such that another epitaxial growth film 15' is formed so as to abut on the gate contact electrode 6', and the lower diffusion region is not formed in the substrate of the base end side of the gate contact electrode 6'.

The same members as the members of the first embodiment and the second embodiment are denoted by the same reference numerals.

As shown in FIG. 24A, the epitaxial growth film 15 is formed on the front end 2a of the first silicon pillar 2. The second contact pillar 13 abuts on the front end 2a of the silicon pillar 2 with the epitaxial growth film 15 interposed between them.

Therefore, a predetermined voltage can be applied to the upper diffusion region 10 of the silicon pillar 2.

In the present embodiment, since the epitaxial growth film 15 is formed instead of the first contact plug 11, a voltage can be more stably applied from the second contact plug 13 to the first silicon pillar 2.

The front end 6a of the gate electrode 6 of the vertical Tr portion 101 is disposed closer to the substrate than the front end 2a of the silicon pillar 2. Therefore, even when the diameter of the contact plug 13 is larger than a design value and the embedded position thereof is deviated, a possibility that the second contact plug 13 abuts on the gate electrode 6 is reduced and thus a short circuit between the second contact plug 13 and the gate electrode 6 can be prevented.

The third insulating film 35 is formed on the front end 6a of the gate electrode 6. Therefore, since the epitaxial growth film 15 is insulated from the gate electrode 6 by the third insulating film 35, a possibility that the second contact plug 13 formed on the epitaxial growth film 15 abuts on the gate electrode 6 is reduced and thus a short circuit between the second contact plug 13 and the gate electrode 6 can be prevented.

As shown in FIG. 24B, the gate contact electrode 6' of the gate contact portion 102 is formed so as to cover the second silicon pillar 2' and the epitaxial 5 growth film 15' is formed using the gate contact electrode 6' protruding from the first interlayer insulating film 8 as a seed. Therefore, a predetermined voltage can be applied from the third contact plug 14 to the gate contact electrode 6'.

The formation of the epitaxial growth film 15' is valid only when a material capable of selectively epitaxially growing polysilicon or the like as the gate electrode 6 is used.

The front end 6'a of the gate contact electrode 6' of the gate contact portion 102 is disposed so as to be spaced from the substrate 1 rather than the front end 2'a of the second silicon pillar 2'.

Therefore, even when the diameter of the third contact plug 14 is larger than a design value and the embedded position thereof is deviated, a possibility that the third contact plug 14 breaks the insulating film 5 and abuts on the second silicon pillar 2' is reduced, that is, damage to the insulating film 5 which is the gate insulating film is avoided, and thus a short circuit between the third contact plug 14 and the second silicon pillar 2' can be prevented.

An example of a method of manufacturing the semiconductor device according to the embodiment will be described.

FIGS. 25A through 32B are cross-sectional views illustrating the example of the method of manufacturing the semiconductor device 114 according to the embodiment of the present invention.

The steps up to FIGS. 6A and 6B are performed similarly to the method of manufacturing the semiconductor device according to the first embodiment.

A mask (resist mask) 9 for opening the vertical Tr portion 101 and covering the gate contact portion 102 is formed by a lithography method. In addition, the mask 9 is not limited to the resist mask using a resist material and a hard mask obtained by processing a metal material by a resist mask may be used.

Figure 25A:
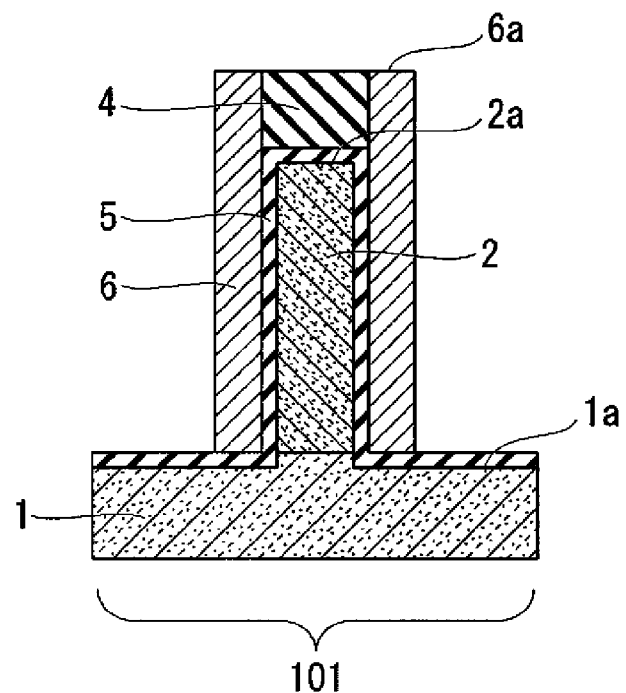
FIG. 25A is a fragmentary cross sectional elevation view illustrating a step involved in a method of forming the semiconductor device of FIGS. 1, 24A and 24B, taken along a C-C' line of FIG. 1.
Figure 25B:
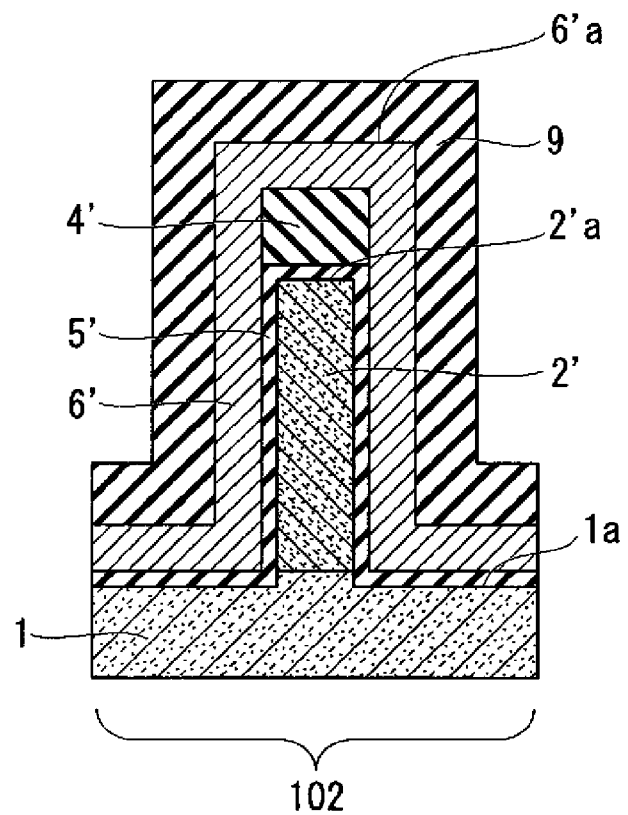
FIG. 25B is a fragmentary cross sectional elevation view illustrating a step involved in a method of forming the semiconductor device of FIGS. 1, 24A and 24B, taken along a D-D' line of FIG. 1.

The gate electrode 6 is etched back using the mask 9 until the nitride film 4 of the vertical Tr portion 101 is exposed. At this time, the gate electrode 6 on one surface 1a of the substrate 1 is also etched back. Therefore, the gate electrode 6 of the vertical Tr portion 101 remains on only the side surface of the silicon pillar 2, but, as shown in FIG. 25B, the gate contact electrode 6' of the gate contact portion 102 is not etched back because the mask 9 is formed. As a result, the vertical Tr portion 101 and the gate contact portion 102 shown in FIGS. 25A and 25B are formed.

Arsenic (As) is introduced at a concentration of $1 \times E^{15}/cm^2$ with 10 KeV so as to form the lower diffusion region 7 in the substrate 1 as the base end side of the first silicon pillar 2 of the vertical Tr portion 101.

Figure 26A:
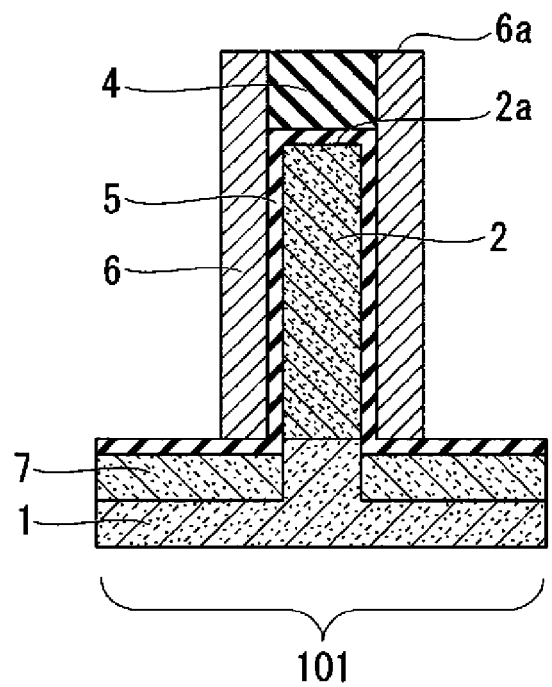
FIG. 26A is a fragmentary cross sectional elevation view illustrating a step, subsequent to the step of FIG. 25A, involved in a method of forming the semiconductor device of FIGS. 1, 24A and 24B, taken along a C-C' line of FIG. 1.
Figure 26B:
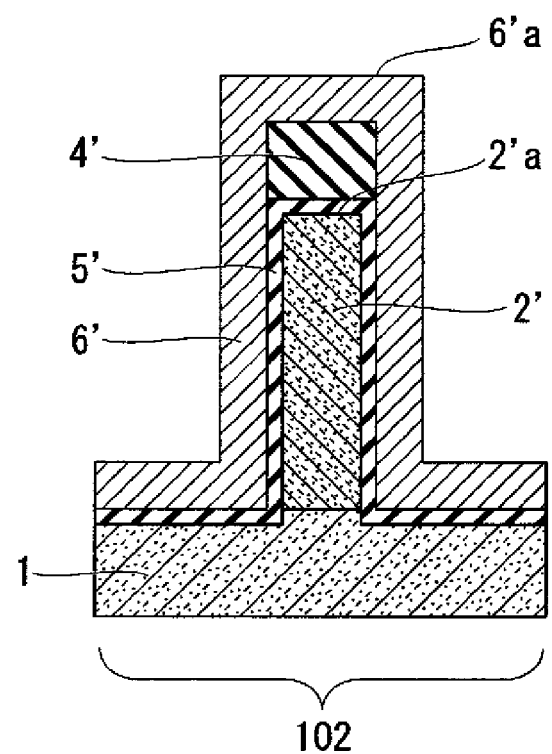
FIG. 26B is a fragmentary cross sectional elevation view illustrating a step, subsequent to the step of FIG. 25B, involved in a method of forming the semiconductor device of FIGS. 1, 24A and 24B, taken along a D-D' line of FIG. 1.

The mask 9 is peeled using a known method and the vertical Tr portion 101 and the gate contact portion 102 shown in FIGS. 26A and 26B are formed.

The first interlayer insulating film 8 is deposited so as to cover the first silicon pillar 2 and the second silicon pillar 2'.

Figure 27A:
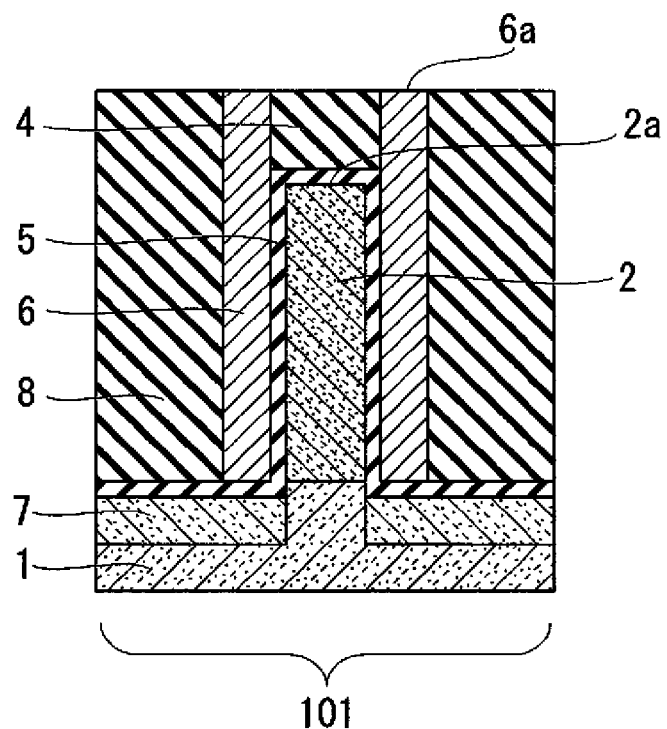
FIG. 27A is a fragmentary cross sectional elevation view illustrating a step, subsequent to the step of FIG. 26A, involved in a method of forming the semiconductor device of FIGS. 1, 24A and 24B, taken along a C-C' line of FIG. 1.
Figure 27B:
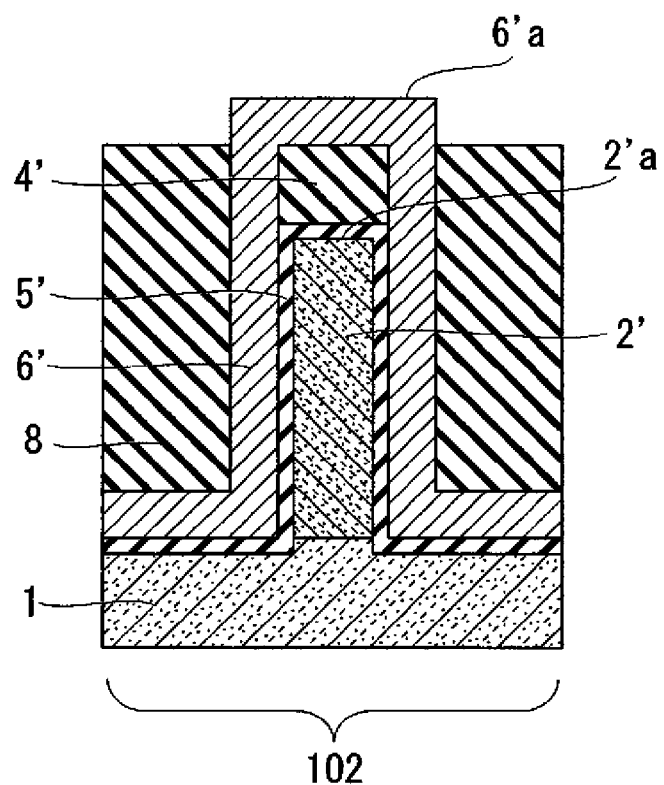
FIG. 27B is a fragmentary cross sectional elevation view illustrating a step, subsequent to the step of FIG. 26B, involved in a method of forming the semiconductor device of FIGS. 1, 24A and 24B, taken along a D-D' line of FIG. 1.

As shown in FIG. 27A, the oxide film is dry-etched until the nitride film 4 of the vertical Tr portion 101 is exposed. As shown in FIG. 27B, the front end 2'a of the gate contact portion 102 is covered by the gate contact electrode 6' and thus is not etched so as to protrude from the first interlayer insulating film 8.

A mask (resist mask) for opening the vertical Tr portion 101 and covering the gate contact portion 102 is formed by a lithography method.

Figure 28A:
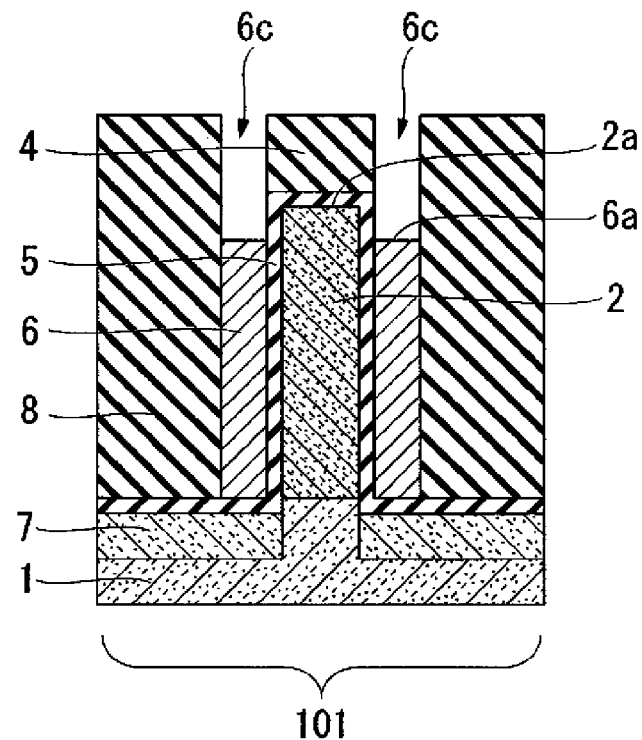
FIG. 28A is a fragmentary cross sectional elevation view illustrating a step, subsequent to the step of FIG. 27A, involved in a method of forming the semiconductor device of FIGS. 1, 24A and 24B, taken along a C-C' line of FIG. 1.

The gate electrode 6 of the vertical Tr portion 101 is etched using the mask so as to form a concave portion 6c at the front end side of the gate electrode 6 of the vertical Tr portion 101, as shown in FIG. 28A. The etching may be dry etching or wet etching.

At this time, the etching depth is determined such that the position of the front end 6a of the gate electrode 6 is closer to the substrate than the position of the front end 2a of the silicon pillar 2.

The gate contact portion 102 is not etched back since the mask is formed.

Figure 28B:
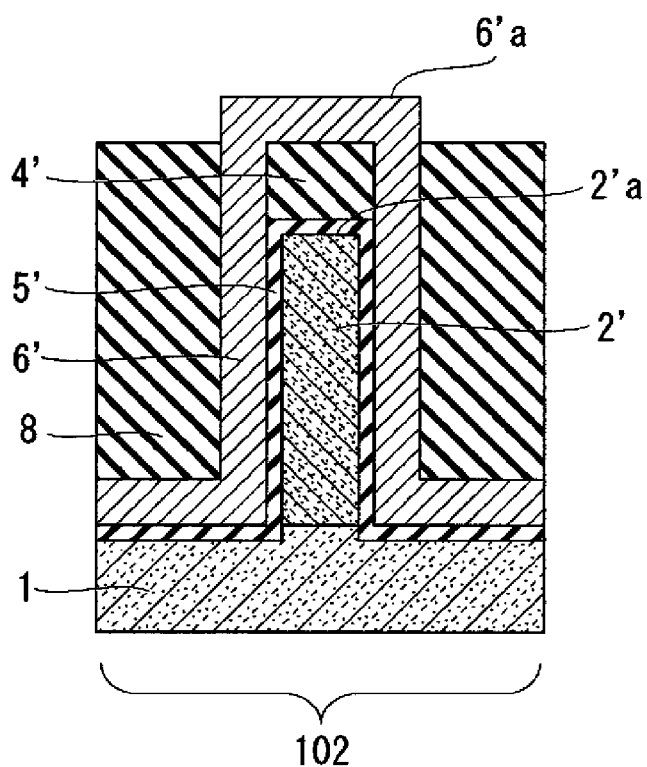
FIG. 28B is a fragmentary cross sectional elevation view illustrating a step, subsequent to the step of FIG. 27B, involved in a method of forming the semiconductor device of FIGS. 1, 24A and 24B, taken along a D-D' line of FIG. 1.

The mask is peeled using a known method and the vertical Tr portion 101 and the gate contact portion 102 shown in FIGS. 28A and 28B are formed.

Figure 29A:
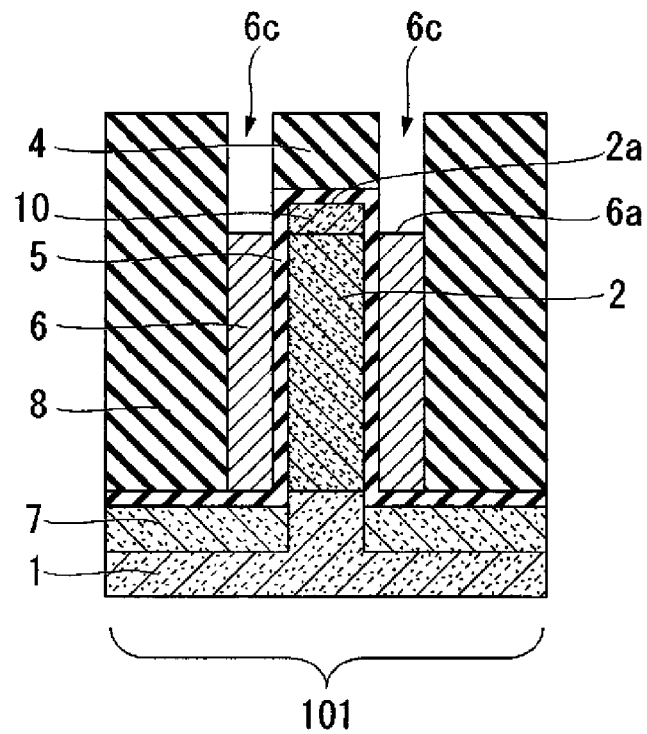
FIG. 29A is a fragmentary cross sectional elevation view illustrating a step, subsequent to the step of FIG. 28A, involved in a method of forming the semiconductor device of FIGS. 1, 24A and 24B, taken along a C-C' line of FIG. 1.
Figure 29B:
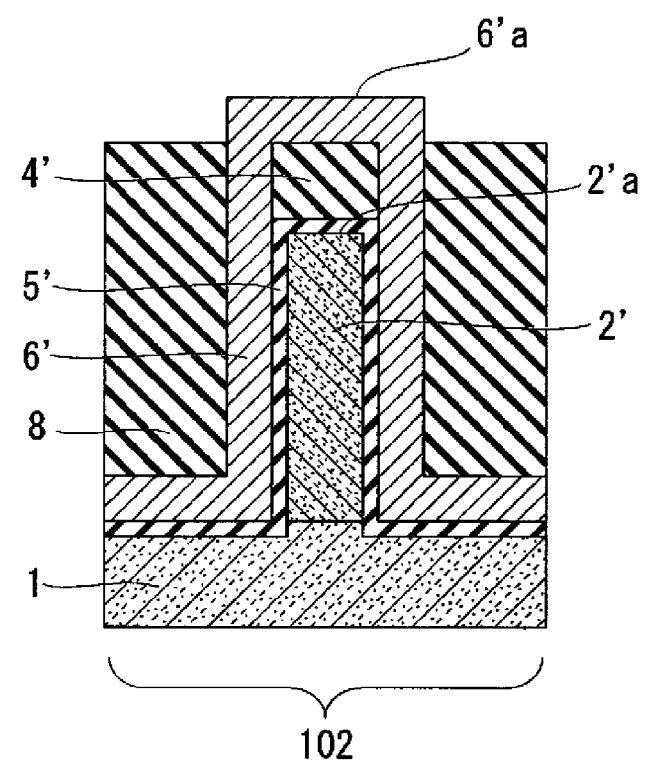
FIG. 29B is a fragmentary cross sectional elevation view illustrating a step, subsequent to the step of FIG. 28B, involved in a method of forming the semiconductor device of FIGS. 1, 24A and 24B, taken along a D-5 D' line of FIG. 1.

Using plasma doping, arsenic (As) is introduced at a concentration of $1 \times E^{15}/cm^2$ with 10 KeV so as to form the upper diffusion region 10 in the front end 2a of the first silicon pillar 2, as shown in FIGS. 29A and 29B.

The nitride film 4 of the vertical Tr portion 101 is wet-etched by hot phosphoric acid so as to be removed. Therefore, a concave portion is additionally formed. The nitride film 4 of the gate contact portion 102 is not etched and removed since the gate contact electrode 6' is formed so as to cover the nitride film 4'. A mask for opening the vertical Tr portion 101 and covering the gate contact portion 102 is formed by a lithography method.

The inner surface of the concave portion is covered using a CVD method in a state of using the mask and the oxide film 35 is deposited so as to cover the interlayer insulating film 8. The film thickness of the oxide film 35 is, for example, 20 nm.

Figure 30A:
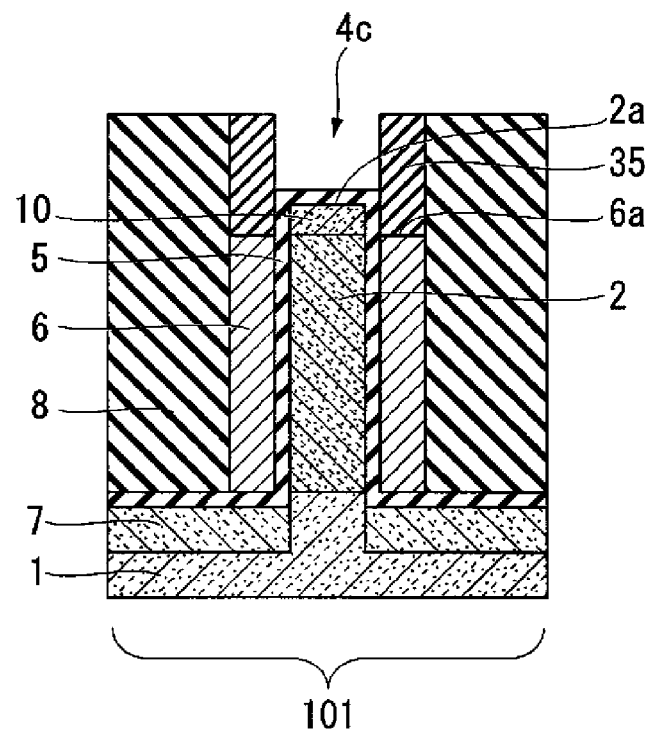
FIG. 30A is a fragmentary cross sectional elevation view illustrating a step, subsequent to the step of FIG. 29A, involved in a method of forming the semiconductor device of FIGS. 1, 24A and 24B, taken along a C-C' line of FIG. 1.

The etch-back of the oxide film is performed so as to provide a concave portion 4c in the oxide film 35 of the front end side of the silicon pillar 2 of the vertical Tr portion 101 as shown in FIG. 30A. The etch-back depth of the oxide film is, for example, 20 nm.

Figure 30B:
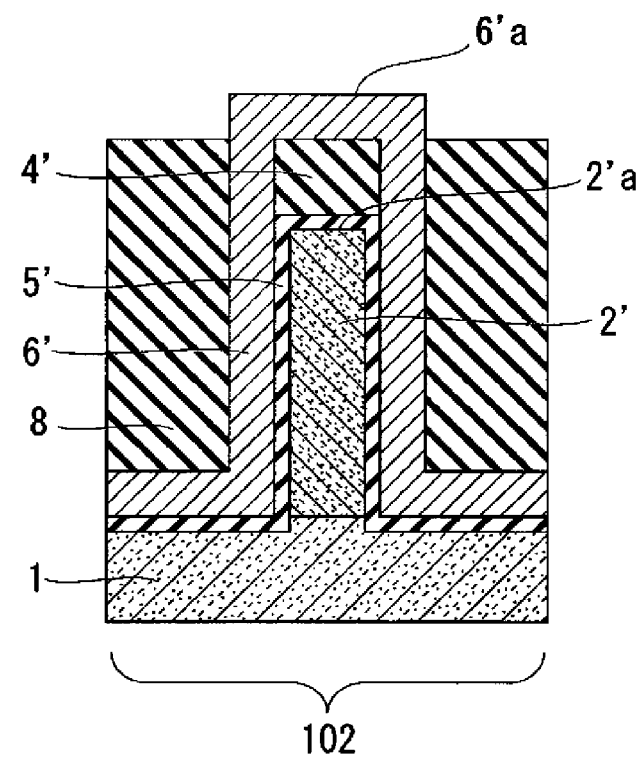
FIG. 30B is a fragmentary cross sectional elevation view illustrating a step, subsequent to the step of FIG. 29B, involved in a method of forming the semiconductor device of FIGS. 1, 24A and 24B, taken along a D-D' line of FIG. 1.

The mask is peeled using a known method and the vertical Tr portion 101 and the gate contact portion 102 shown in FIGS. 30A and 30B are formed.

A mask 9 for opening the vertical Tr portion 101 and covering the gate contact portion 102 is formed by a lithography method.

The oxide film is wet-etched using the mask 9 until the front end 2a of the vertical Tr portion 101 is exposed. Therefore, the diameter of the concave portion 4c is enlarged so as to obtain the concave portion 4e. In addition, the interlayer insulating film 8 of the vertical Tr portion 101 is also etched.

Figure 31A:
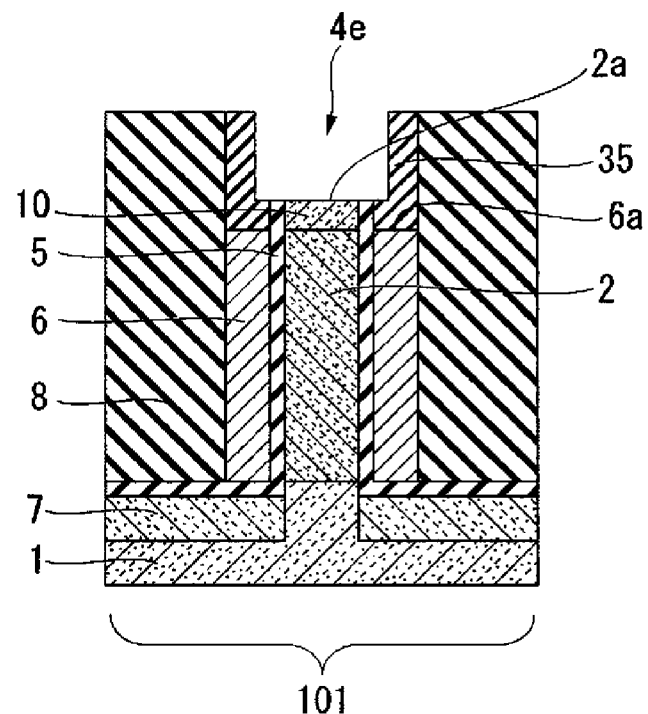
FIG. 31A is a fragmentary cross sectional elevation view illustrating a step, subsequent to the step of FIG. 30A, involved in a method of forming the semiconductor device of FIGS. 1, 24A and 24B, taken along a C-C' line of FIG. 1.
Figure 31B:
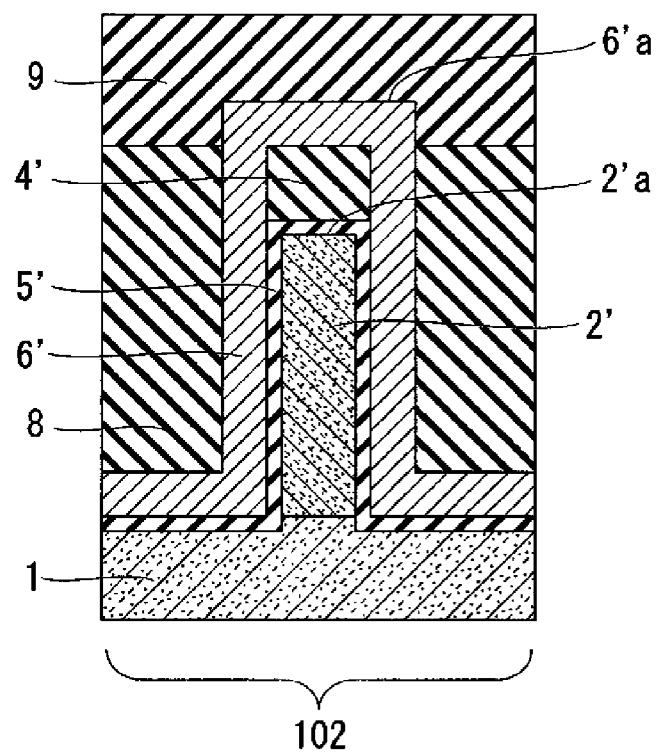
FIG. 31B is a fragmentary cross sectional elevation view illustrating a step, subsequent to the step of FIG. 30B, involved in a method of forming the semiconductor device of FIGS. 1, 24A and 24B, taken along a D-D' line of FIG. 1.

The gate contact portion 102 is not etched back since the mask 9 is formed. Therefore, the vertical Tr portion 101 and the gate contact portion 102 shown in FIGS. 31A and 31B are formed.

The mask 9 is peeled using a known method.

Figure 32A:
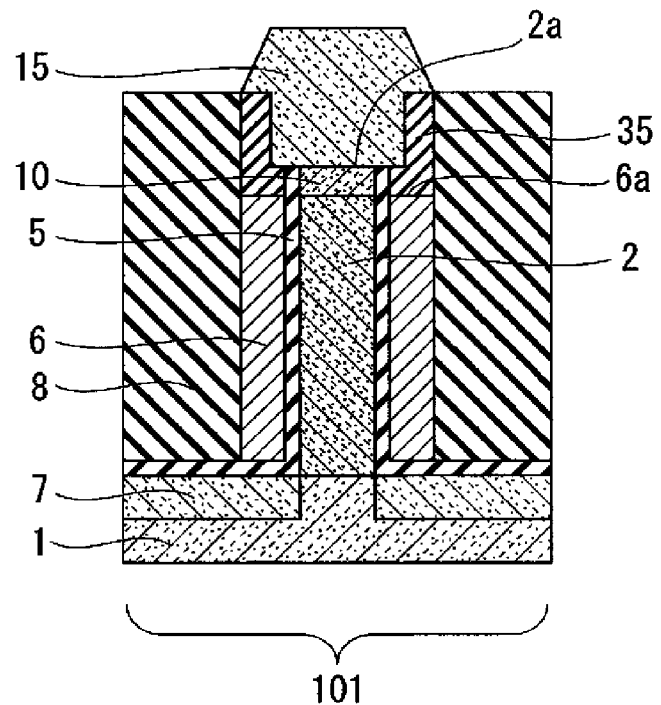
FIG. 32A is a fragmentary cross sectional elevation view illustrating a step, subsequent to the step of FIG. 31A, involved in a method of forming the semiconductor 20 device of FIGS. 1, 24A and 24B, taken along a C-C' line of FIG. 1.
Figure 32B:
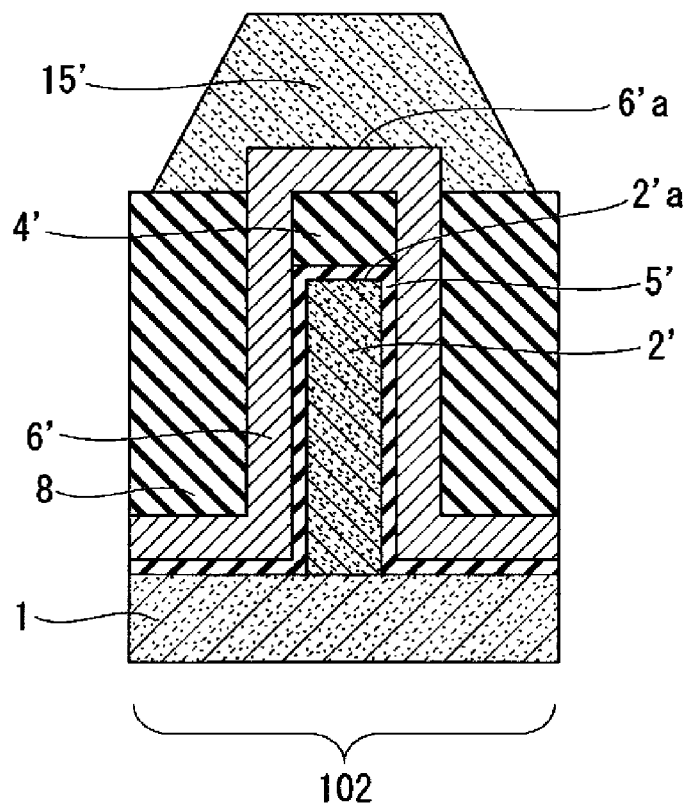
FIG. 32B is a fragmentary cross sectional elevation view illustrating a step, subsequent to the step of FIG. 31B, involved in a method of forming the semiconductor device of FIGS. 1, 24A and 24B, taken along a D-D' line of FIG. 1.

As shown in FIG. 32A, epitaxial growth using the front end 2a of the silicon pillar 2 of the vertical Tr portion 101 as a seed is performed so as to form an epitaxial layer 15 and, as shown in FIG. 32B, epitaxial growth using the exposed portion of the gate contact electrode 6' of the gate contact portion 102 as a seed is performed so as to form an epitaxial layer 15'.

The second interlayer insulating film 12 is deposited using a known method so as to cover the first interlayer insulating film 8.

Finally, the second contact plug 13 and the third contact plug 14 are formed using a lithography method. In detail, first, after a resist is applied so as to cover the exposed surface of the interlayer insulating film 12, exposure is performed using a predetermined mask so as to form a mask (resist mask) formed of resist. The interlayer insulating film 12 is etched using the resist mask so as to form a contact hole. Next, a conductive material is embedded into the contact hole. Finally, the resist is peeled.

By the above process, the semiconductor device 114 shown in FIGS. 24A and 24B can be formed.

Since the semiconductor device 114 according to the embodiment of the present invention has the configuration in which the first contact plug 13 is connected to the first silicon pillar 2 by the epitaxial growth film 15 epitaxially grown from the first silicon pillar 2 and the third contact plug 14 is connected to the gate contact electrode 6' by another epitaxial growth film 15' epitaxially grown from the gate contact electrode 6', a predetermined voltage can be easily applied from the second contact plug 13 to the upper diffusion region 10 of the front end 2a of the first silicon pillar 2 via the epitaxial growth film 15 and a predetermined voltage can be easily applied from the third contact plug 14 to the gate contact electrode 6' via the epitaxially growth film 15' by another epitaxial growth film 15' epitaxially grown from the gate contact electrode 6'.

Fifth Embodiment

FIGS. 33A and 33B are views illustrating another example of the semiconductor device according to the embodiment of the present invention. FIG. 33A is a cross-sectional view of a vertical Tr portion. FIG. 33B is a cross-sectional view of a gate contact portion.

As shown in FIGS. 33A and 33B, the semiconductor device 115 according to the embodiment of the present invention has the same configuration as the first embodiment except that a Shallow Trench Isolation (STI) region 16 is provided in the substrate 1. The same members as the members of the first embodiment and the second embodiment are denoted by the same reference numerals.

The STI region 16 is obtained by filling an insulating material in a groove formed in the substrate 1 and a device separation region which partitions an active region for forming a semiconductor element. The vertical Tr portion 101 and the gate contact portion 102 may be formed in the active region partitioned by the STI region 16. Therefore, it is possible to manufacture a small-size high-density semiconductor device.

Since the semiconductor device 115 according to the embodiment of the present invention has the configuration in which the active region partitioned by the STI region 16 is formed in the substrate 1 and at least one vertical Tr portion 101 and one gate contact portion 102 are included in the active region, it is possible to obtain a small-size high-density semiconductor device.

Sixth Embodiment

Figure 34:
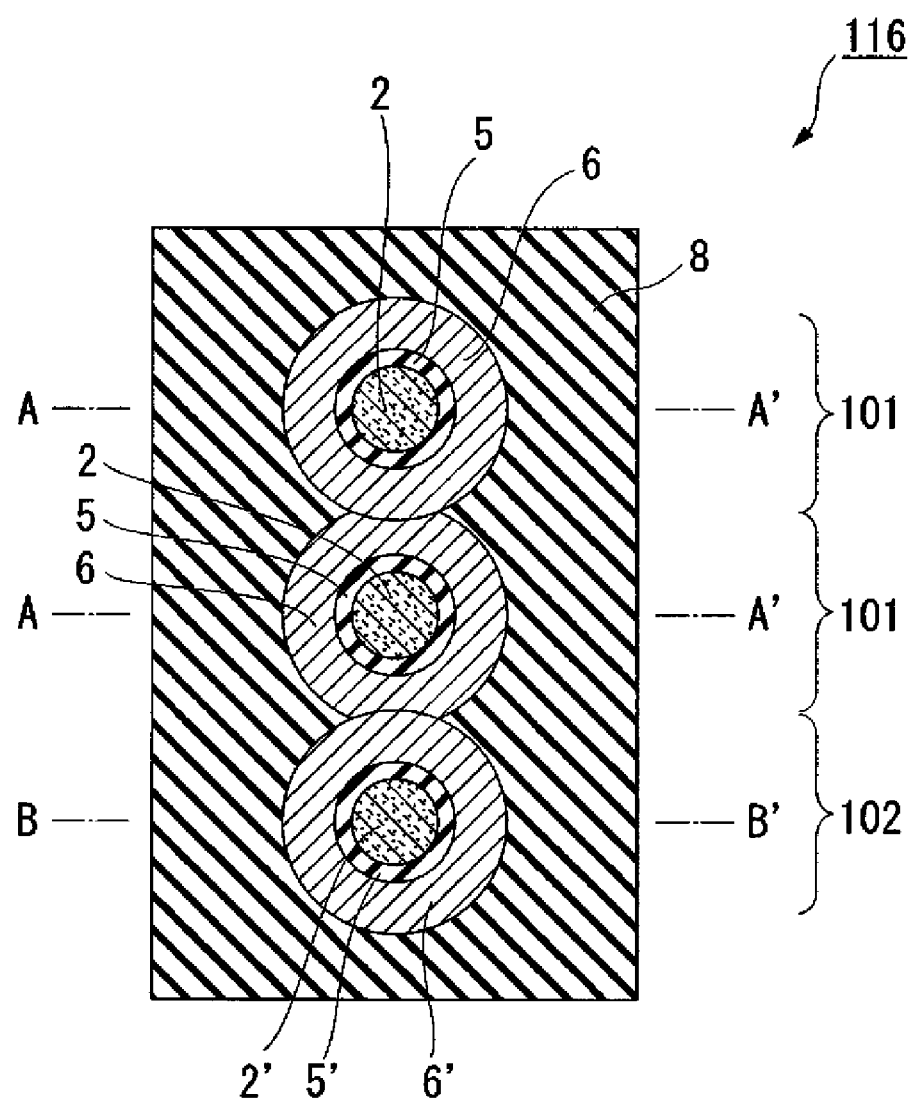
FIG. 34 is a fragmentary cross sectional plan view illustrating a semiconductor device in accordance with a sixth preferred embodiment of the present invention.

FIG. 34 is a plan cross-sectional view illustrating another example of a semiconductor device according to the embodiment. As shown in FIG. 34, the semiconductor device 116 according to the embodiment of the present invention has the same configuration as the first embodiment except that another vertical Tr portion 101 is formed in plan cross-sectional view. The same members as the members of the first embodiment and the second embodiment are denoted by the same reference numerals.

Another vertical Tr portion 101 has a gate electrode 6 formed while being continued to the gate electrode 6 of the vertical Tr portion 101.

As shown in FIG. 34, the semiconductor device 116 according to the embodiment of the present invention has two vertical Tr portions 101 arranged in series and one gate contact portion 102 in the interlayer insulating layer 8.

Each of the two vertical Tr portions 101 has the first silicon pillar 2, the insulating film 5 formed to surround the first silicon pillar 2, and the gate electrode 6 formed to surround the insulating film 5. The gate contact portion 102 has the second silicon pillar 2', the insulating film 5' formed to surround the second silicon pillar 2', and the gate contact electrode 6' formed to surround the insulating film 5'.

The gate electrodes 6 of the two vertical Tr portions 101 and the gate contact electrode 6' of the gate contact portion 102 are continuously formed, and the voltages of the gate electrodes 6 of the two vertical Tr portions 101 can be adjusted by the gate contact electrode 6' of the gate contact portion 102.

A plurality of vertical Tr portions 101 each having the gate electrode 6 connected to the gate contact electrode 6' of the gate contact portion 102 may be formed. Therefore, it is possible to manufacture a small-size high-density semiconductor device.

In addition, the number and the layout of vertical Tr portions 101 and the gate contact portions 102 are not limited thereto.

Since the semiconductor device 116 according to the embodiment of the present invention has a plurality of vertical Tr portions 101, it is possible to obtain a small-size high-density semiconductor device.

Seventh Embodiment

Figure 35:
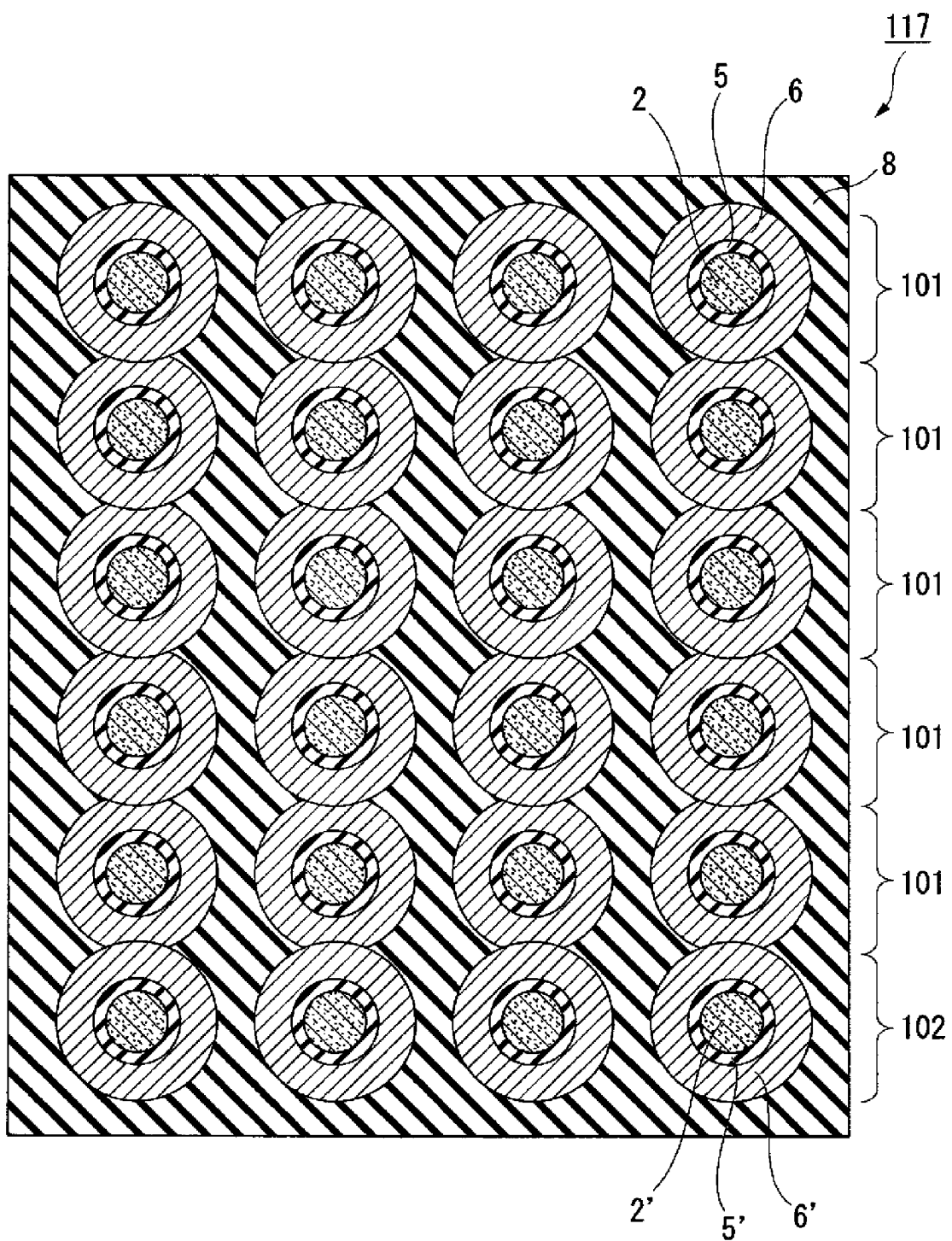
FIG. 35 is a fragmentary cross sectional plan view illustrating a semiconductor device in accordance with a seventh preferred embodiment of the present invention.

FIG. 35 is a plan cross-sectional view illustrating another example of a semiconductor device according to the embodiment. As shown in FIG. 35, the semiconductor device 117 according to the embodiment of the present invention has the same configuration as the first embodiment except that four semiconductor element rows each including five vertical Tr portions 101 and one gate contact portion 102 are included in plan cross-sectional view. The same members as the members of the first embodiment and the second embodiment are denoted by the same reference numerals.

As shown in FIG. 35, the semiconductor device 117 according to the embodiment of the present invention has four semiconductor element rows each including five vertical Tr portions 101 arranged in series and having continuously formed gate electrodes 6 and one gate contact portion 102 having the contact electrode 6' formed while being continuous to the gate electrodes 6 in the interlayer insulating layer 8.

Each of the vertical Tr portions 101 has the first silicon pillar 2, the insulating film 5 formed to surround the first silicon pillar 2, and the gate electrode 6 formed to surround the insulating film 5. The gate contact portion 102 has the second silicon pillar 2', the insulating film 5' formed to surround the second silicon pillar 2', and the gate contact electrode 6' formed to surround the insulating film 5'.

The gate electrodes 6 of one semiconductor element row and the gate contact electrode 6' are continuously formed, and the voltages of the gate electrodes 6 of the vertical Tr portions 101 of one semiconductor element row can be adjusted by one gate contact electrode 6'.

A plurality of vertical Tr portions 101 each having the gate electrode 6 connected to the gate contact electrode 6' of the gate contact portion 102 may be formed. Therefore, it is possible to manufacture a small-size high-density semiconductor device, for example, a memory cell.

Since the semiconductor device 117 according to the embodiment of the present invention has a plurality of vertical Tr portions 101, it is possible to obtain a small-size high-density semiconductor device.

Eighth Embodiment

Figure 36:
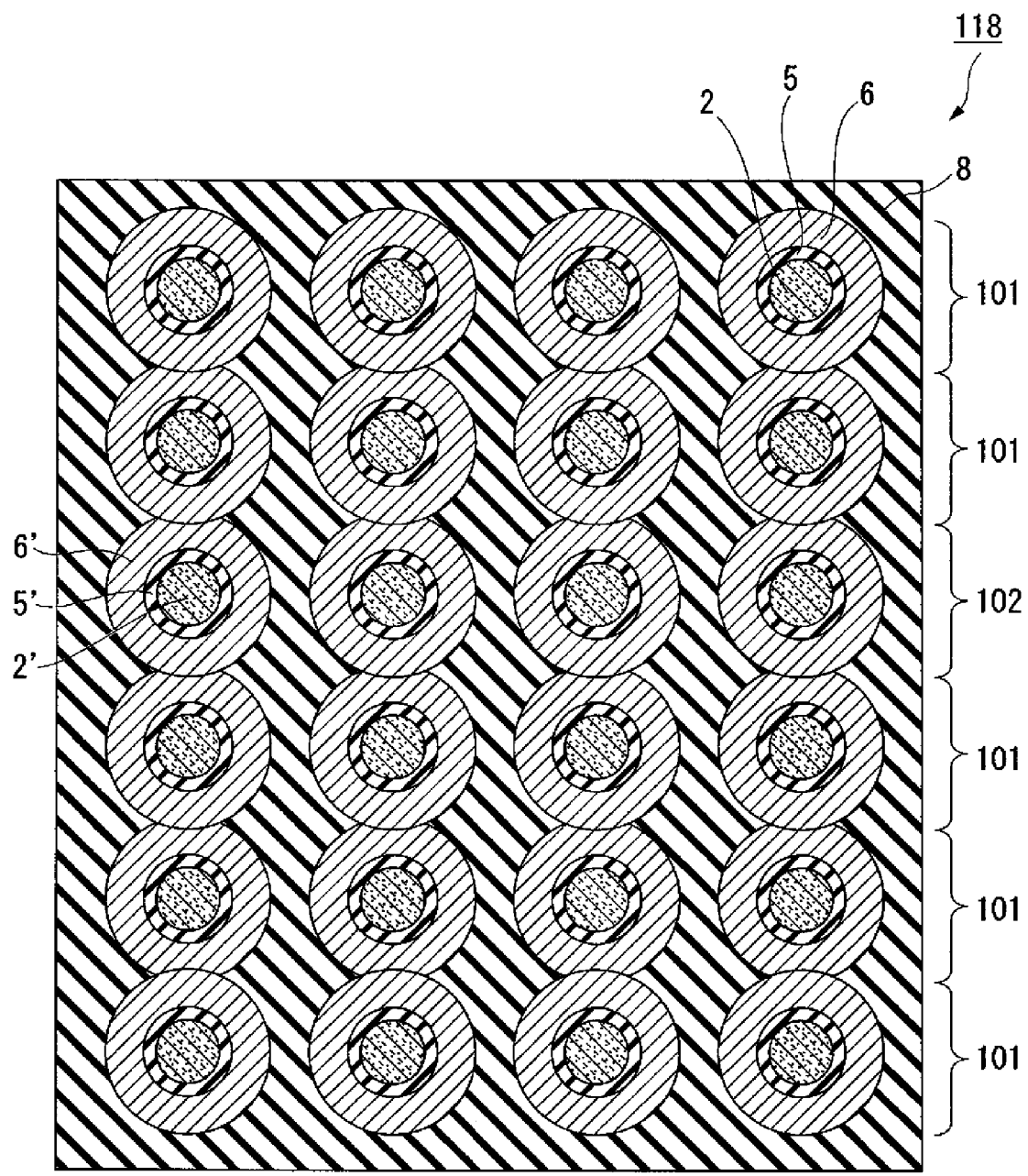
FIG. 36 is a fragmentary cross sectional plan view illustrating a semiconductor device in accordance with an eighth preferred embodiment of the present invention.

FIG. 36 is a plan cross-sectional view illustrating another example of a semiconductor device according to the embodiment. As shown in FIG. 36, the semiconductor device 118 according to the embodiment of the present invention has the same configuration as the seventh embodiment except that the gate contact portion 102 in the semiconductor element row is not positioned at one end but is positioned at a midway portion of the semiconductor element row. The same members as the members of the first embodiment and the second embodiment are denoted by the same reference numerals.

Therefore, the same voltage can be applied from the gate electrode 6 of the vertical Tr portion 101 at one end side of one semiconductor element row, the gate electrode 6 of the vertical Tr portion 101 at the other side thereof, and the gate contact portion 102 at the midway portion of the semiconductor element row, and the transistor characteristics of each vertical Tr portion 101 can be stabilized.

A plurality of vertical Tr portions 101 each having the gate electrode 6 connected to the gate contact electrode 6' of the gate contact portion 102 may be formed. Therefore, it is possible to obtain a small-size high-density semiconductor device, for example, a memory cell.

Since the semiconductor device 118 according to the embodiment of the present invention has a plurality of vertical Tr portions 101, it is possible to obtain a small-size high-density semiconductor device.

Ninth Embodiment

FIGS. 37A and 37B are views illustrating another example of a semiconductor device according to the embodiment. FIG. 37A is a cross-sectional view of a vertical Tr portion. FIG. 37B is a cross-sectional view of a gate contact portion.

As shown in FIGS. 37A and 37B, the semiconductor device 119 according to the embodiment of the present invention has the same configuration as the first Embodiment except that a third interlayer insulating film 39 is formed on the second interlayer insulating film 12 and a wiring 18 formed so as to be connected to the second contact plug 13 and the third contact plug 14 and a contact plug 19 connected to the wiring 18 are included in the third interlayer insulating film 39. The same members as the members of the first embodiment are denoted by the same reference numerals.

The wiring 18 and the contact plug 19 of FIG. 37 are independently formed.

Therefore, the third interlayer insulating film 39 may be used as a wiring layer of a general device.

The wiring 18 is not only formed in the third interlayer insulating film 39, but also is formed so as to be connected to the lower diffusion layer 7.

Tenth Embodiment

FIGS. 38A and 38B are views illustrating another example of the semiconductor device according to the embodiment of the present invention. FIG. 38A is a cross-sectional view of a vertical Tr portion. FIG. 38B is a cross-sectional view of a gate contact portion.

As shown in FIGS. 38A and 38B, the semiconductor device 120 according to the embodiment of the present invention has the same configuration as the first Embodiment except that the third insulating film 39 is formed on the second interlayer insulating film 12 and a capacitor 20 formed so as to be connected to the second contact plug 13, the wiring 18 formed so as to be connected to the third contact plug 14, and the contact plug 19 connected to the wiring 18 are included in the third interlayer insulating film 39. The same members as the members of the first embodiment are denoted by the same reference numerals.

Therefore, the semiconductor device 120 according to the embodiment of the present invention may be used as a DRAM and may be used as a phase change memory by using a phase change material instead of the capacitor 20.

Comparative Example 1

FIGS. 39A and 39B are views showing an example of a vertical transistor manufactured as a comparative example. FIG. 39A is a cross-sectional view of a vertical transistor portion (hereinafter, referred to as a vertical Tr portion) 5 101. FIG. 39B is a cross-sectional view of a gate contact portion 102.

The vertical transistor of Comparative Example 1 shown in FIGS. 39A and 39B is a silicon pillar type 3D transistor and has two silicon pillars 2 and 2' protruding from a substrate. A vertical Tr portion 101 is formed in one of the two silicon pillars and a gate contact portion 102 is formed in the other thereof.

As shown in FIG. 39A, the vertical Tr portion 101 includes an insulating film 5 including an oxide film formed to surround the silicon pillar 2, a gate electrode 6 formed of polysilicon, a first interlayer insulating film 8 formed to cover the silicon pillar 2, a second interlayer insulating film 12 formed on the first interlayer insulating film 8, and a contact plug 13 embedded into the second interlayer insulating film 12.

In addition, an upper diffusion region 10 is formed at a front end side of the silicon pillar 2 and a lower diffusion region 7 is formed in the substrate 1 of a base end side.

As shown in FIG. 39B, the gate contact portion 102 includes an insulating film 5' formed to surround the silicon pillar 2', a gate contact electrode 6' formed of polysilicon, the first interlayer insulating film 8 formed to surround the silicon pillar 2', the second interlayer insulating film 12 formed on the interlayer insulating film 8, and a contact plug 14 embedded into the second interlayer insulating film 12.

In addition, a nitride film 4' which is a portion of a hard mask used for silicon process remains at the front end side of the silicon pillar 2'.

In order to facilitate the description, although the vertical Tr portion 101 and the gate contact portion 102 are separately described, the vertical Tr portion 101 and the gate contact portion 102 are disposed on the substrate 1 so as to be adjacent to each other, the gate electrode 6 and the gate contact electrode 6' are continuously formed, and the insulating films 5 and 5' are continuously formed.

Therefore, a voltage is applied from the contact plug 14 of the gate contact portion 102 to the gate contact electrode 6' such that a voltage can be applied to the gate electrode 6 of the vertical Tr portion 101 and the gate voltage of the vertical Tr portion 101 can be adjusted.

In the vertical transistor of Comparative Example 1, as shown in FIGS. 39(a) and 39(b), the front end 6a of the gate electrode 6 of the vertical Tr portion 101 and the front end 6'a of the gate contact portion 102 have the same height and are spaced from the substrate rather than the front ends 2a and 2'a of the silicon pillars 2 and 2'.

The contact plug 13 is formed so as to abut on the front end 2a of the silicon pillar 2 and the contact plug 14 is formed so as to abut on the front end 6'a of the gate contact electrode 6' of the gate contact portion 102.

Since the contact plug 13 is formed so as to abut on the front end 2a of the silicon pillar 2, the contact plug 13 is disposed in the vicinity of the gate electrode 6. Thus, when the diameter of the contact plug 13 is larger than a design value or the embedded position thereof is deviated, a short circuit may be formed between the contact plug 13 and the gate electrode 6.

Figure 40A:
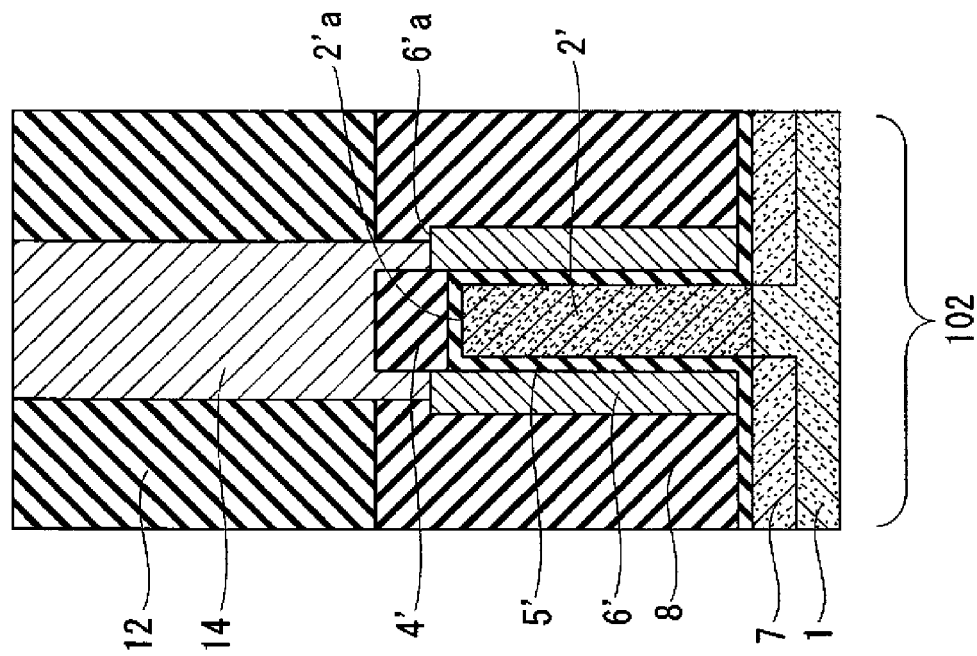
FIG. 40A is a fragmentary cross sectional elevation view illustrating the semiconductor device in accordance with a comparative example 1.
Figure 40B:
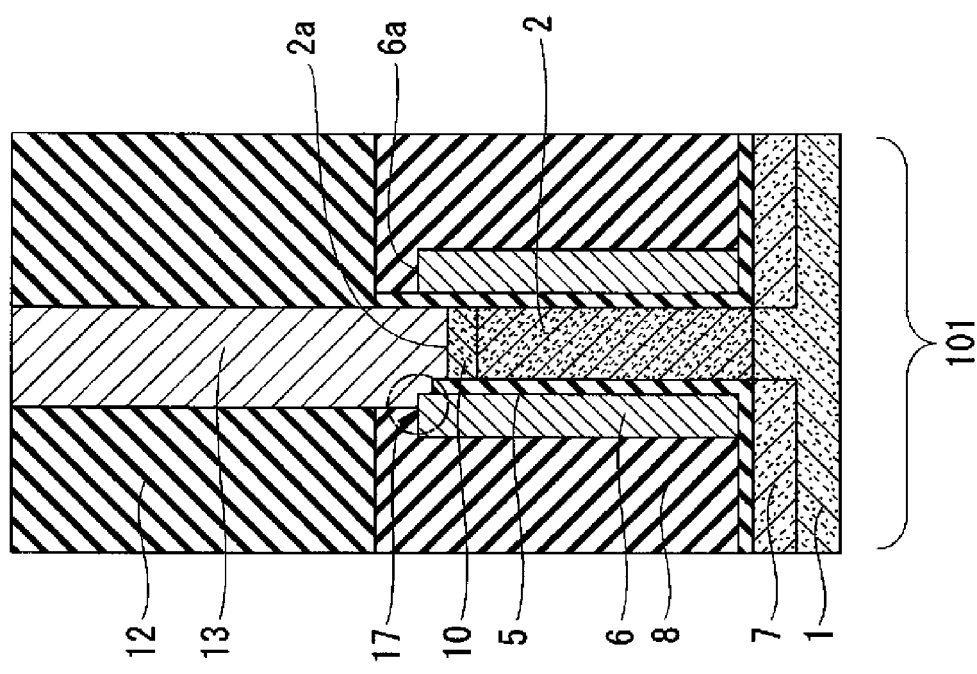
FIG. 40B is a fragmentary cross sectional elevation view illustrating the semiconductor device in accordance with the comparative 5 example 1.

FIGS. 40A and 40B are views showing an example of the case where a short circuit is formed between the contact plug 13 and the gate electrode 6. FIG. 40A is a cross-sectional view of the vertical Tr portion 101. FIG. 40B is a cross-sectional view 25 of the gate contact portion 102.

In FIG. 40B, the central axis of the contact plug 13 is deviated from the central axis of the silicon pillar 2 and the diameter of the contact plug 13 is larger than that of the silicon pillar 2. In this case, a portion of the contact plug 13 may be formed so as to abut on the gate electrode 6 in a short-circuit place 17, and the short circuit may be formed between the contact plug 13 and the gate electrode 6.

Comparative Example 2

Figure 41A:
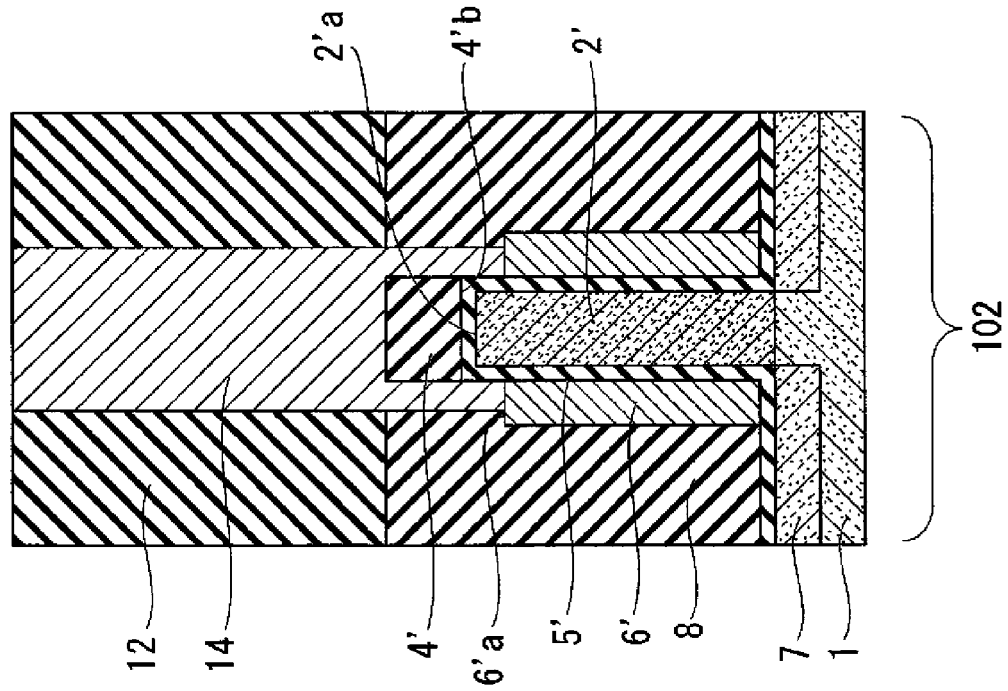
FIG. 41A is a fragmentary cross sectional elevation view illustrating the semiconductor device in accordance with a comparative example 2.
Figure 41B:
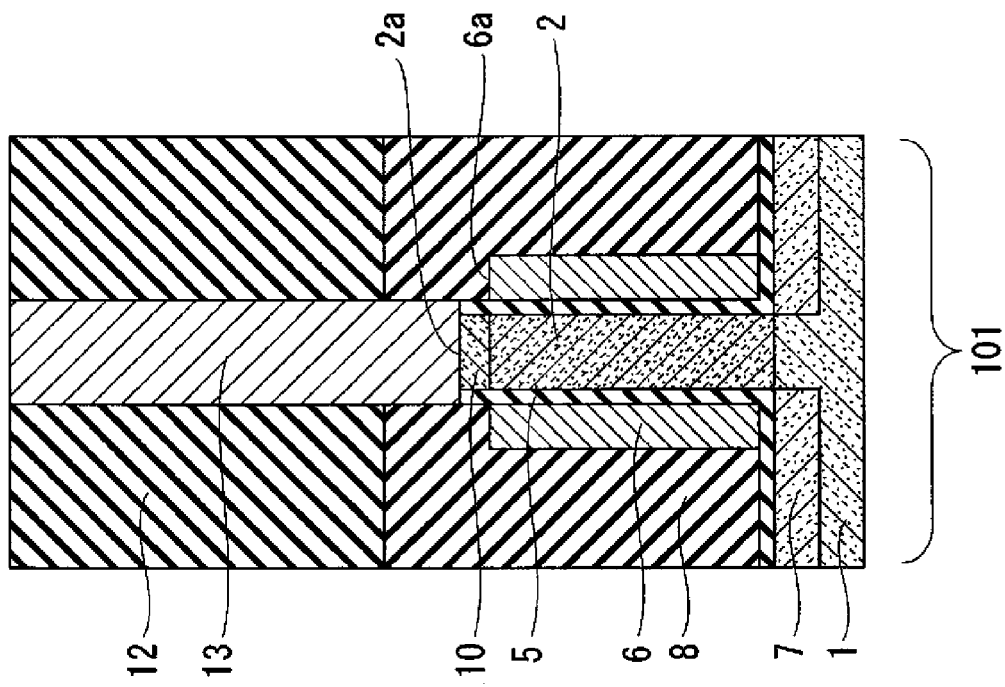
FIG. 41B is a fragmentary cross sectional elevation view illustrating the semiconductor device in accordance with the comparative example 2.

FIGS. 41A and 41B are views showing an example of a vertical transistor manufactured as a comparative example. FIG. 41A is a cross-sectional view of a vertical transistor portion (hereinafter, referred to as a vertical Tr portion) 101. FIG. 41B is a cross-sectional view of a gate contact portion 102.

In the vertical transistor of Comparative Example 2 shown in FIGS. 41A and 41B, in order to solve the above problem, the front end 6a of the gate electrode 6 is closer to the substrate than the front end 2a of the silicon pillar 2. By this configuration, even when the central axis of the contact plug 13 is deviated from the central axis of the silicon pillar 2 or the diameter of the contact plug 13 is larger than that of the silicon pillar 2, a short circuit is not formed between the contact plug 13 and the gate electrode 6.

However, in FIG. 41B, the position of the front end 6'a of the gate contact electrode 6' of the gate contact portion 102 is closer to the substrate than the front end 2'a of the silicon pillar 2'. In addition, the contact plug 14 is formed so as to abut on the front end 2'a of the silicon pillar 2'. As a result, since the embedding process of the contact plug 14 is not suitable, a short circuit may be formed between the contact plug 14 and the silicon pillar 2'.

Figure 42A:
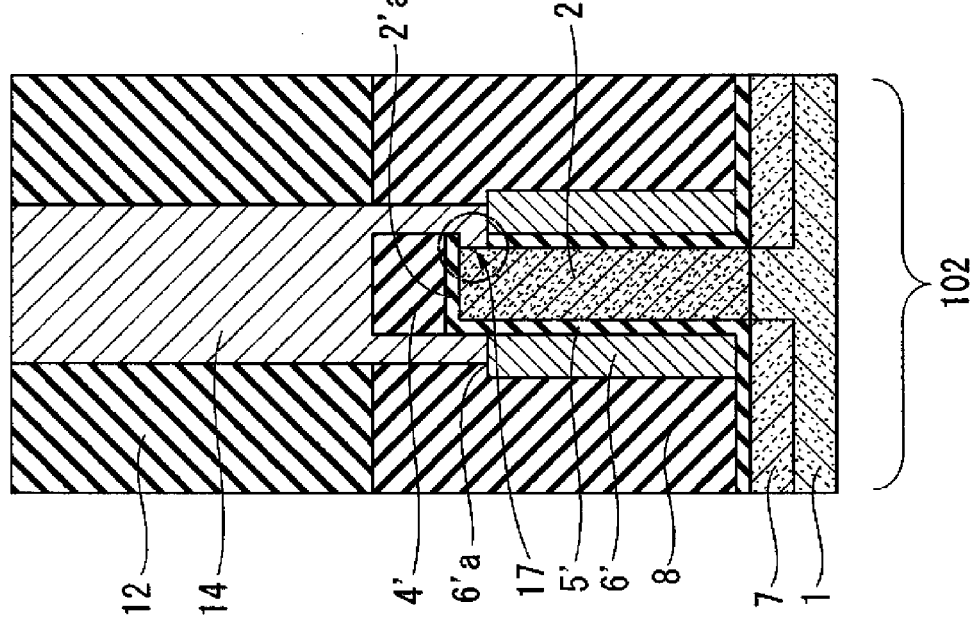
FIG. 42A is a fragmentary cross sectional elevation view illustrating the semiconductor device in accordance with a comparative example 2.
Figure 42B:
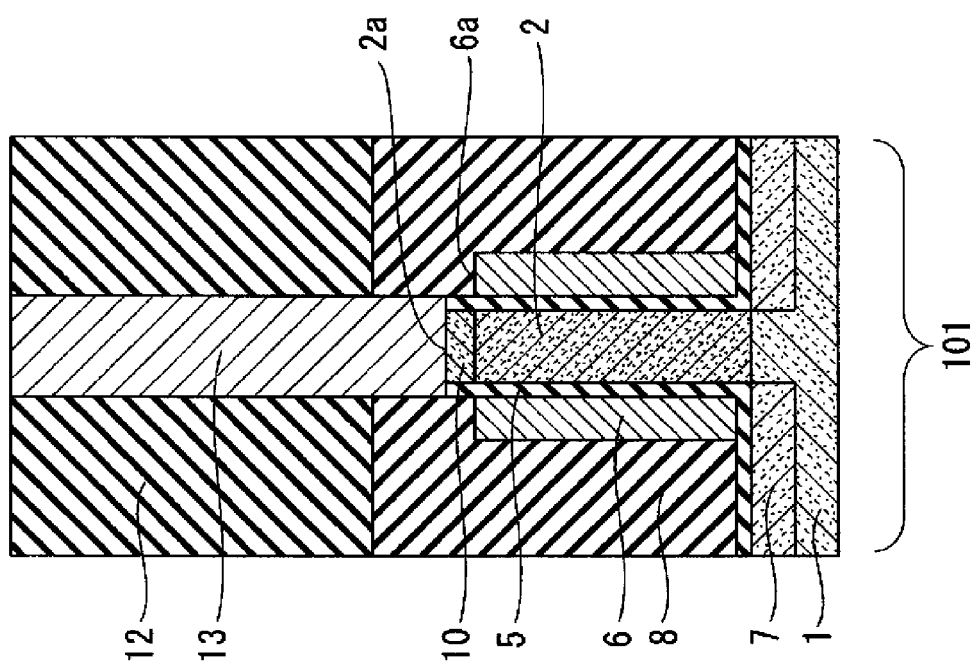
FIG. 42B is a fragmentary cross sectional elevation view illustrating the semiconductor device in accordance with the comparative example 2.

FIGS. 42A and 42B are views showing an example of the case where a short circuit is formed between the contact plug 14 and the silicon pillar 2'. FIG. 42A is a cross-sectional view of the vertical Tr portion 101. FIG. 42B is a cross-sectional view of the gate contact portion 102.

In FIG. 42B, the contact plug 14 is formed such that a portion of the insulating film 5 of the front end side of the silicon pillar 2' is broken. In this case, a portion of the contact plug 14 may abut on the silicon pillar 2' in a short-circuit place 17, and the short circuit may be formed between the contact plug 14 and the silicon pillar 2'.

The present invention relates to a semiconductor device capable of preventing a short circuit between a contact plug and a gate electrode and/or between the contact plug and a silicon pillar and a method of manufacturing the semiconductor device, and is applicable to industries which manufacture and use semiconductor devices.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:
1. A semiconductor device, comprising:
a substrate;
a first semiconductor pillar extending from the substrate;
a first insulating film covering a side face of the first semiconductor pillar;
a first electrode covering the first insulating film, the first electrode having a top portion which is closer to the substrate than a top of the first semiconductor pillar, a distance between the top portion of the first electrode and the top of the first semiconductor pillar being smaller than a distance between the top portion of the first electrode and the substrate;
a second semiconductor pillar extending from the substrate;
a second insulating film covering a surface of the second semiconductor pillar; and
a second electrode covering a portion of the second insulating film, the portion of the second insulating film covering a side face of the second semiconductor pillar, the second electrode having a top portion which is farther from the substrate than a top of the second semiconductor pillar.

2. The semiconductor device according to claim 1, wherein the second electrode is electrically connected to the first electrode.

3. The semiconductor device according to claim 2, wherein the first electrode is a gate electrode and the second electrode is a gate contact electrode.

4. The semiconductor device according to claim 1, wherein the first electrode is separated by the first insulating film from the first semiconductor pillar, and the second electrode is separated by the second insulating film from the second semiconductor pillar.

5. The semiconductor device according to claim 4, further comprising:
a third insulating film which is disposed over the first electrode; and
a first contact plug disposed over the first semiconductor pillar, the first contact plug being separated by the third insulating film from the first electrode.

6. The semiconductor device according to claim 5, further comprising:
a first inter-layer insulator which extends over the substrate;
a second inter-layer insulator which extends over the first inter-layer insulator and over the first and second semiconductor pillars;
a second contact plug disposed in the second inter-layer insulator, the second contact plug being connected to the first contact plug; and
a third contact plug disposed in the second inter-layer insulator, the third contact plug being connected to the top portion of the second electrode.

7. The semiconductor device according to claim 6, further comprising:
a fourth contact plug being connected to the third contact plug, the fourth contact plug being connected to the second electrode, the fourth contact plug being provided in a groove, the groove having side walls defined by the top portion of the second electrode, the groove having a bottom defined by a top portion of the second insulating film.

8. The semiconductor device according to claim 6, further comprising:
a fourth insulating film being provided in a groove, the groove having side walls defined by the top of the second electrode, the groove having a bottom defined by the top portion of the second semiconductor pillar.

9. The semiconductor device according to claim 6, further comprising:
a first epitaxial layer disposed over the top of the first semiconductor pillar, the first epitaxial layer contacting the second contact plug, the first epitaxial layer electrically connecting the first semiconductor pillar; and
a second epitaxial layer disposed over the second electrode, the second epitaxial layer contacting the third contact plug, the second epitaxial layer electrically connecting the second electrode.

10. The semiconductor device according to claim 1, further comprising:
isolation regions formed on the substrate to define an active region,
wherein the active region has at least a vertical transistor portion and at least a gate contact portion,
the vertical transistor portion comprises the first semiconductor pillar, the first insulating film and the first electrode, and
the gate contact portion comprises the second semiconductor pillar, the second insulating film and the second electrode.

11. The semiconductor device according to claim 10, wherein the semiconductor device comprises a plurality of sets of the vertical transistor portion and the gate contact portion.

12. The semiconductor device according to claim 1, wherein the top of the first semiconductor pillar includes a top diffusion region, and the substrate has a second diffusion region which is close to a bottom portion of the first semiconductor pillar.

13. A semiconductor device comprising:
a first semiconductor pillar including an upper surface and a side surface;
a first insulating film, covering the side surface of the first semiconductor pillar but not covering the upper surface of the first semiconductor pillar;
a first electrode covering the first insulating film;
a second semiconductor pillar provided separately from the first semiconductor pillar and including an upper surface and a side surface;
a second insulating film covering both of the upper and side surfaces of the second semiconductor pillar; and
a second electrode covering the second insulating film, a top level of the second electrode being higher than a top level of the first electrode.

14. The semiconductor device according to claim 13, wherein the top level of the first electrode is lower than a top level of the first semiconductor pillar and the top level of the second electrode is higher than a top level of the second semiconductor pillar.

15. The semiconductor device according to claim 13, wherein the first electrode is electrically connected to the second electrode.

16. The semiconductor device according to claim 13, wherein the first electrode is separated by the first insulating film from the first semiconductor pillar, and the second electrode is separated by the second insulating film from the second semiconductor pillar.

17. A semiconductor device, comprising:
a first semiconductor pillar protruding from a first part of a substrate and including a side surface;
a first insulating film including a first portion that covers a second part of the substrate around the first part and a second portion that elongates from the first portion and covers the side surface of the first semiconductor pillar;
a first electrode including a third portion that is formed on the first portion of the first insulating film and a fourth portion that elongates from the third portion and covers the second portion of the first insulating film, the fourth portion including an upper surface on an opposite side to the third portion;
a second semiconductor pillar protruding from a third part of the substrate and including a side surface;

a second insulating film including a fifth portion that covers a fourth part of the substrate around the third part and a sixth portion that elongates from the fifth portion and covers the side surface of the second semiconductor pillar; and a second electrode including a seventh portion that is formed on the fifth portion of the second insulating film and an eighth portion that elongates from the seventh portion and covers the sixth portion of the second insulating film, the eighth portion including an upper surface on an opposite side of the seventh portion, the upper surface of the fourth portion of the first electrode being closer to the substrate than the upper surface of the eighth portion of the second electrode.

18. The semiconductor device according to claim 17, wherein the first semiconductor pillar includes a top surface that is uncovered by the first insulating film and the second semiconductor pillar includes a top surface that is covered by a ninth portion of the second insulating film that is elongated from the fifth portion, and wherein the semiconductor device further comprises:
   a third insulating film covering the first electrode and including a hole that exposes the top surface of the first semiconductor pillar;
   a first contact plug formed in contact with the top surface of the first semiconductor pillar and in isolation from the first electrode by the third insulating film; and
   a second contact plug formed in contact with the second electrode and in isolation from the top surface of the second semiconductor pillar by the ninth portion of the second insulating film.

19. The semiconductor device according to claim 17, wherein the first semiconductor pillar includes a top surface that is uncovered by the first insulating film, wherein the second semiconductor pillar includes a top surface that is covered by a ninth portion of the second insulating film that is elongated from the fifth portion, wherein the eighth portion of the second electrode is elongated from the seventh portion beyond the ninth portion of the second insulating film to form a step between the top surface of the eighth portion of the second electrode and the ninth portion of the second insulating film, and wherein the semiconductor device further comprises:
   a third insulating film covering the first electrode and including a hole that exposes the top surface of the first semiconductor pillar;
   a first contact plug formed in contact with the top surface of the first semiconductor pillar and in isolation from the first electrode by the third insulating film;
   a fourth insulating film filling the step; and
   a second contact plug formed in contact with the second electrode and in isolation from the top surface of the second semiconductor pillar by the ninth portion of the second insulating film and the fourth insulating film.

20. The semiconductor device according to claim 17, wherein the first semiconductor pillar includes a top surface that is uncovered by the first insulating film, wherein the second semiconductor pillar includes a top surface that is covered by a ninth portion of the second insulating film that is elongated from the fifth portion, wherein the eighth portion of the second electrode is elongated from the seventh portion beyond the ninth portion of the second insulating film, and wherein the semiconductor device further comprises:
   a third insulating film covering the first electrode and including a hole that exposes the top surface of the first semiconductor pillar;
   a first epitaxial layer filling the hole in contact with the top surface of the first semiconductor pillar and extending over the third insulating film;
   a second epitaxial layer formed in contact with the upper surface of the eighth portion of the second electrode;
   a first contact plug disposed in contact with the first epitaxial layer; and
   a second contact plug disposed in contact with the second epitaxial layer.

* * * * *